United States Patent
Kimura et al.

(10) Patent No.: US 6,373,408 B2
(45) Date of Patent: *Apr. 16, 2002

(54) ENCODING APPARATUS, DECODING APPARATUS, ENCODING/DECODING APPARATUS, ENCODING METHOD AND DECODING METHOD

(75) Inventors: Tomohiro Kimura; Masayuki Yoshida; Fumitaka Ono, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/547,136

(22) Filed: Apr. 11, 2000

(30) Foreign Application Priority Data

Apr. 12, 1999 (JP) ............................................ 11-104162

(51) Int. Cl.⁷ ................................................ H03M 7/00
(52) U.S. Cl. ........................................................ 341/59
(58) Field of Search .......................................... 341/59

(56) References Cited

U.S. PATENT DOCUMENTS

| | | | |
|---|---|---|---|
| 4,675,652 A | * 6/1987 | Machado | 341/59 |
| 5,059,976 A | 10/1991 | Ono et al. | 341/51 |
| 5,307,062 A | 4/1994 | Ono et al. | 341/51 |
| 5,311,177 A | 5/1994 | Kimura et al. | 341/51 |
| 5,404,140 A | 4/1995 | Ono et al. | 341/51 |
| 5,623,477 A | * 4/1997 | Shimada et al. | 341/59 |
| RE35,781 E | 5/1998 | Ono et al. | 341/51 |
| 5,952,944 A | * 9/1999 | Nonaka et al. | 341/59 |
| 5,999,110 A | * 12/1999 | Blaum et al. | 341/59 |
| 6,032,284 A | * 2/2000 | Bliss | 341/59 |

FOREIGN PATENT DOCUMENTS

JP 6-85687 3/1994

OTHER PUBLICATIONS

"The Design of an Adaptive On–Line Binary Arithmetic–Coding Chip", Shiann–Rong Kuang, et al, IEEE Transactions on Circuits and Systems–1: Fundamental Theory and Applications vol. 45, No. 7 Jul. 1998, pp. 693–706.

CCITT Rec. T.82 pp. 26–45 (1993).

Pennebaker et al., JPEG Still Image Data Compression Standard pp. 149–167 (1993).

* cited by examiner

*Primary Examiner*—Trong Phan

(57) ABSTRACT

The present invention aims to reduce the code length and time for flushing the code. An encoding apparatus includes a data memory storing information source data, a learning memory storing learning data relating the encoding data, a probability estimation table for outputting an encoding parameter indicated by the learning data, and an encoder outputting the code by implementing an arithmetic encoding based on the encoding data and the encoding parameter. In the above encoding apparatus, according to the present invention, a synchronization detector is provided measuring one of inputting the information source data and outputting the code at a predetermined interval. Further, the encoding apparatus includes a boundary detector detecting a carry boundary value within the effective region at predetermined interval and instructing to truncate a part of the effective region based on the detection result. The encoder truncates one of equally divided upper and lower partial regions of the effective region indicated by the carry detector and updates the effective region.

50 Claims, 67 Drawing Sheets

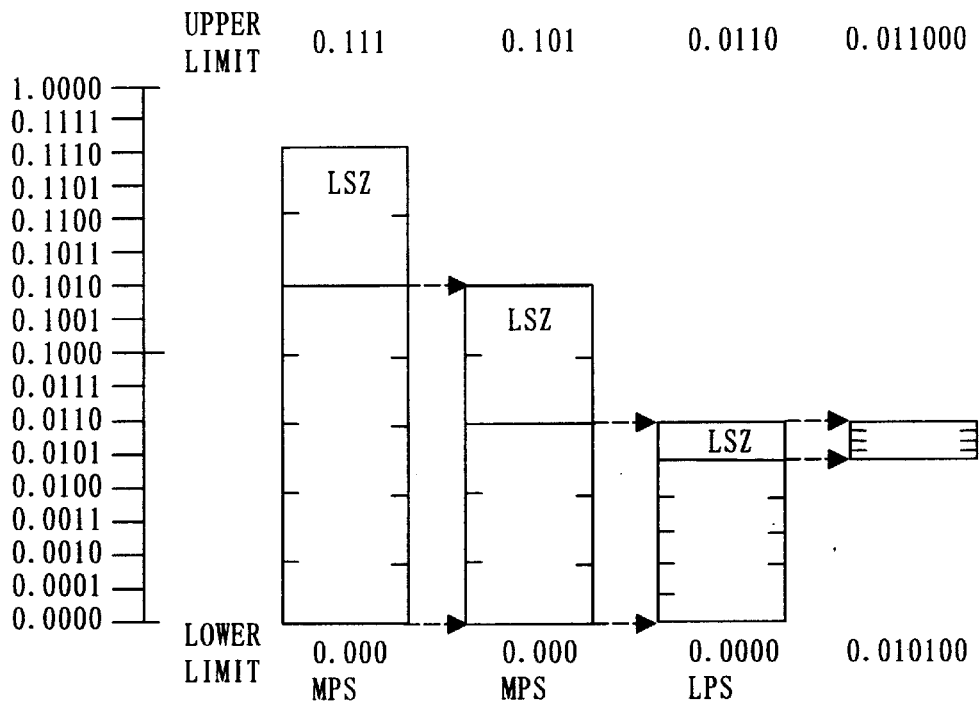
Fig. 39 [RELATED ART]
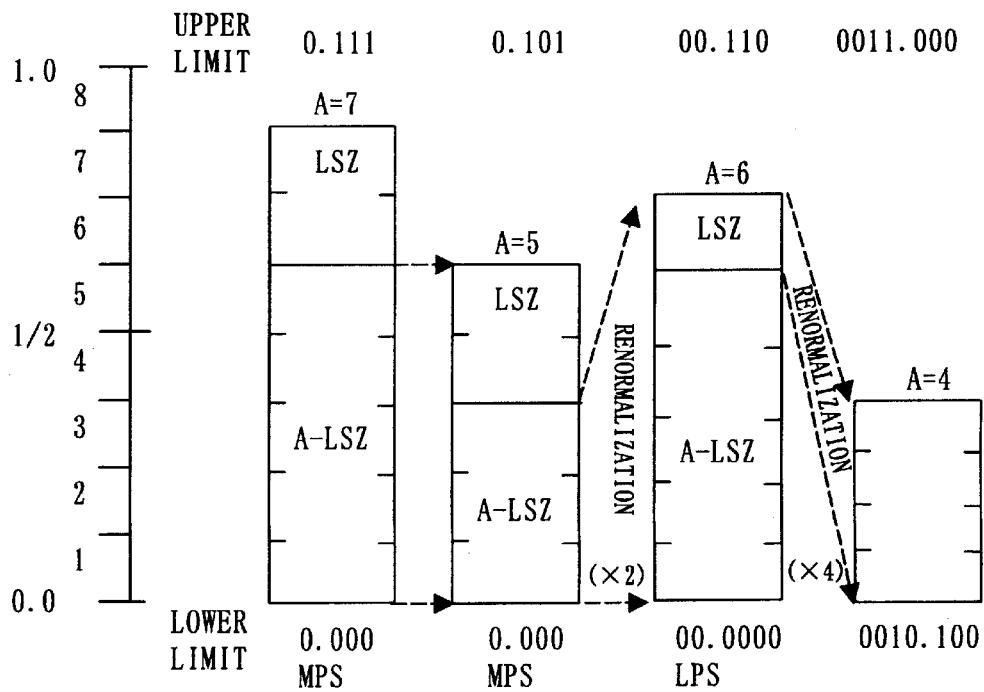
Fig. 40 [RELATED ART]

Fig. 43
PRIOR ART
\* : ENCODING/DECODING PIXEL
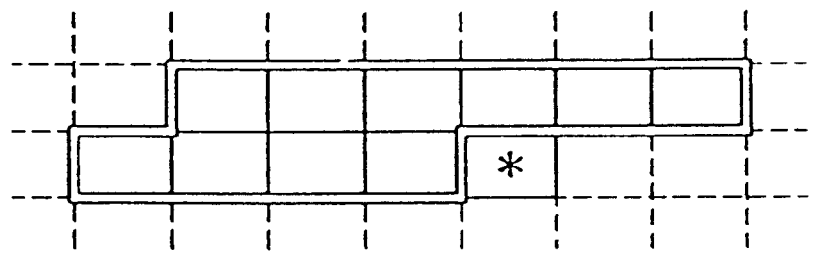
(A) 2-LINE MODEL TEMPLATE
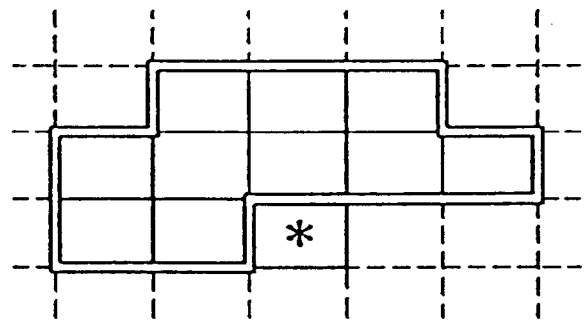
(B) 3-LINE MODEL TEMPLATE

Fig. 44  PRIOR ART

| ST | LSZ | NLPS | NMPS | SWTCH | ST | LSZ | NLPS | NMPS | SWTCH |
|---|---|---|---|---|---|---|---|---|---|
| 0 | 0x5a1d | 1 | 1 | 1 | 57 | 0x01a4 | 55 | 58 | 0 |
| 1 | 0x2586 | 14 | 2 | 0 | 58 | 0x0160 | 56 | 59 | 0 |
| 2 | 0x1114 | 16 | 3 | 0 | 59 | 0x0125 | 57 | 60 | 0 |
| 3 | 0x080b | 18 | 4 | 0 | 60 | 0x00f6 | 58 | 61 | 0 |
| 4 | 0x03d8 | 20 | 5 | 0 | 61 | 0x00cb | 59 | 62 | 0 |
| 5 | 0x01da | 23 | 6 | 0 | 62 | 0x00ab | 61 | 63 | 0 |
| 6 | 0x00e5 | 25 | 7 | 0 | 63 | 0x008f | 61 | 32 | 0 |
| 7 | 0x006f | 28 | 8 | 0 | 64 | 0x5b12 | 65 | 65 | 1 |
| 8 | 0x0036 | 30 | 9 | 0 | 65 | 0x4d04 | 80 | 66 | 0 |
| 9 | 0x001a | 33 | 10 | 0 | 66 | 0x412c | 81 | 67 | 0 |
| 10 | 0x000d | 35 | 11 | 0 | 67 | 0x37d8 | 82 | 68 | 0 |
| 11 | 0x0006 | 9 | 12 | 0 | 68 | 0x2fe8 | 83 | 69 | 0 |
| 12 | 0x0003 | 10 | 13 | 0 | 69 | 0x293c | 84 | 70 | 0 |
| 13 | 0x0001 | 12 | 13 | 0 | 70 | 0x2379 | 86 | 71 | 0 |
| 14 | 0x5a7f | 15 | 15 | 1 | 71 | 0x1edf | 87 | 72 | 0 |
| 15 | 0x3f25 | 36 | 16 | 0 | 72 | 0x1aa9 | 87 | 73 | 0 |
| 16 | 0x2cf2 | 38 | 17 | 0 | 73 | 0x174e | 72 | 74 | 0 |
| 17 | 0x207c | 39 | 18 | 0 | 74 | 0x1424 | 72 | 75 | 0 |
| 18 | 0x17b9 | 40 | 19 | 0 | 75 | 0x119c | 74 | 76 | 0 |
| 19 | 0x1182 | 42 | 20 | 0 | 76 | 0x0f6b | 74 | 77 | 0 |
| 20 | 0x0cef | 43 | 21 | 0 | 77 | 0x0d51 | 75 | 78 | 0 |
| 21 | 0x09a1 | 45 | 22 | 0 | 78 | 0x0bb6 | 77 | 79 | 0 |
| 22 | 0x072f | 46 | 23 | 0 | 79 | 0x0a40 | 77 | 48 | 0 |
| 23 | 0x055c | 48 | 24 | 0 | 80 | 0x5832 | 80 | 81 | 1 |
| 24 | 0x0406 | 49 | 25 | 0 | 81 | 0x4d1c | 88 | 82 | 0 |
| 25 | 0x0303 | 51 | 26 | 0 | 82 | 0x438e | 89 | 83 | 0 |
| 26 | 0x0240 | 52 | 27 | 0 | 83 | 0x3bdd | 90 | 84 | 0 |
| 27 | 0x01b1 | 54 | 28 | 0 | 84 | 0x34ee | 91 | 85 | 0 |
| 28 | 0x0144 | 56 | 29 | 0 | 85 | 0x2eae | 92 | 86 | 0 |
| 29 | 0x00f5 | 57 | 30 | 0 | 86 | 0x299a | 93 | 87 | 0 |
| 30 | 0x00b7 | 59 | 31 | 0 | 87 | 0x2516 | 86 | 71 | 0 |
| 31 | 0x008a | 60 | 32 | 0 | 88 | 0x5570 | 88 | 89 | 1 |
| 32 | 0x0068 | 62 | 33 | 0 | 89 | 0x4ca9 | 95 | 90 | 0 |
| 33 | 0x004e | 63 | 34 | 0 | 90 | 0x44d9 | 96 | 91 | 0 |
| 34 | 0x003b | 32 | 35 | 0 | 91 | 0x3e22 | 97 | 92 | 0 |
| 35 | 0x002c | 33 | 9 | 0 | 92 | 0x3824 | 99 | 93 | 0 |
| 36 | 0x5ae1 | 37 | 37 | 1 | 93 | 0x32b4 | 99 | 94 | 0 |
| 37 | 0x484c | 64 | 38 | 0 | 94 | 0x2e17 | 93 | 86 | 0 |
| 38 | 0x3a0d | 65 | 39 | 0 | 95 | 0x56a8 | 95 | 96 | 1 |
| 39 | 0x2ef1 | 67 | 40 | 0 | 96 | 0x4f46 | 101 | 97 | 0 |
| 40 | 0x261f | 68 | 41 | 0 | 97 | 0x47e5 | 102 | 98 | 0 |
| 41 | 0x1f33 | 69 | 42 | 0 | 98 | 0x41cf | 103 | 99 | 0 |
| 42 | 0x19a8 | 70 | 43 | 0 | 99 | 0x3c3d | 104 | 100 | 0 |
| 43 | 0x1518 | 72 | 44 | 0 | 100 | 0x375e | 99 | 93 | 0 |
| 44 | 0x1177 | 73 | 45 | 0 | 101 | 0x5231 | 105 | 102 | 0 |
| 45 | 0x0e74 | 74 | 46 | 0 | 102 | 0x4c0f | 106 | 103 | 0 |
| 46 | 0x0bfb | 75 | 47 | 0 | 103 | 0x4639 | 107 | 104 | 0 |
| 47 | 0x09f8 | 77 | 48 | 0 | 104 | 0x415e | 103 | 99 | 0 |
| 48 | 0x0861 | 78 | 49 | 0 | 105 | 0x5627 | 105 | 106 | 1 |
| 49 | 0x0706 | 79 | 50 | 0 | 106 | 0x50e7 | 108 | 107 | 0 |
| 50 | 0x05cd | 48 | 51 | 0 | 107 | 0x4b85 | 109 | 103 | 0 |
| 51 | 0x04de | 50 | 52 | 0 | 108 | 0x5597 | 110 | 109 | 0 |
| 52 | 0x040f | 50 | 53 | 0 | 109 | 0x504f | 111 | 107 | 0 |
| 53 | 0x0363 | 51 | 54 | 0 | 110 | 0x5a10 | 110 | 111 | 1 |
| 54 | 0x02d4 | 52 | 55 | 0 | 111 | 0x5522 | 112 | 109 | 0 |
| 55 | 0x025c | 53 | 56 | 0 | 112 | 0x59eb | 112 | 111 | 1 |
| 56 | 0x01f8 | 54 | 57 | 0 |  |  |  |  |  |

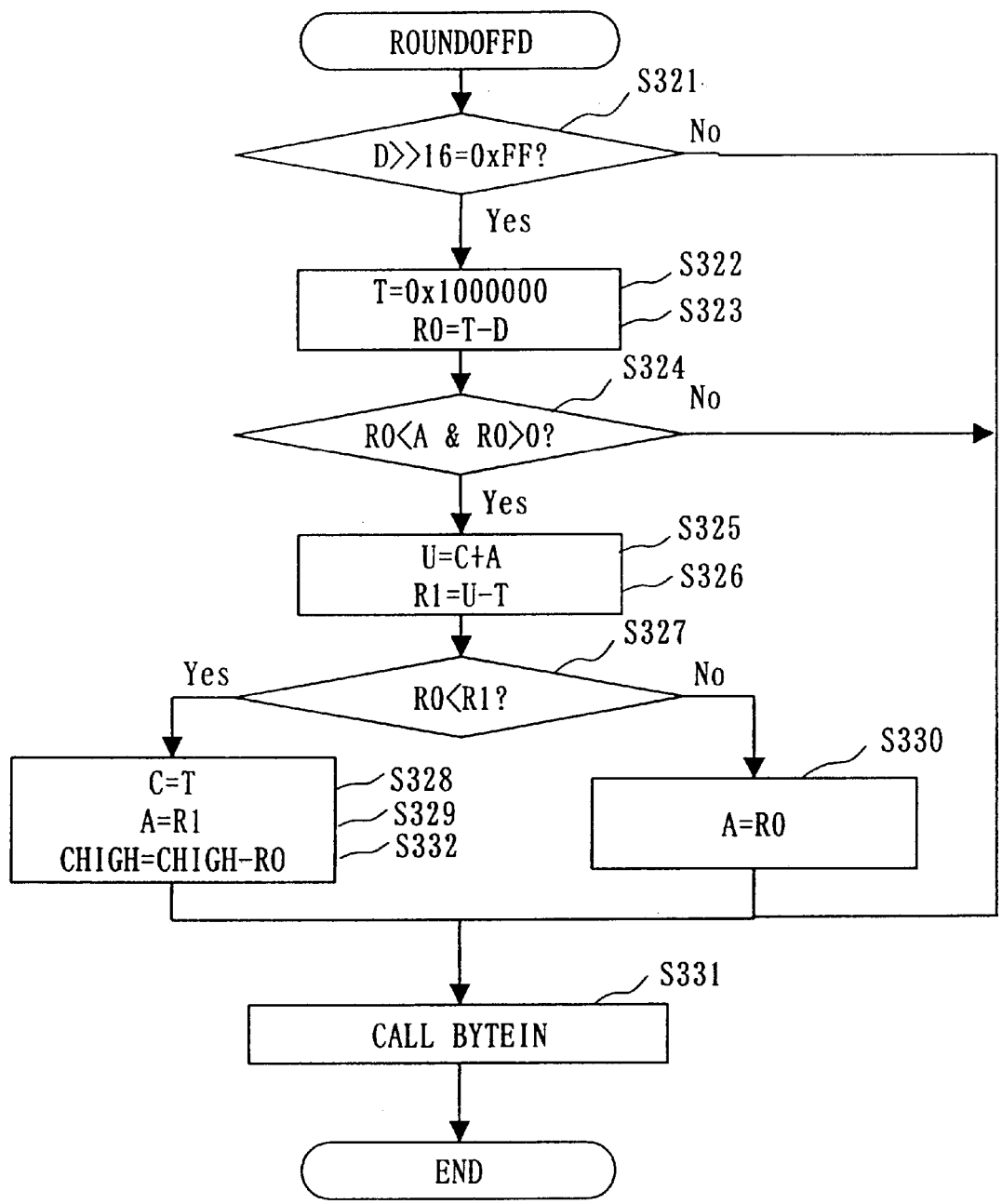

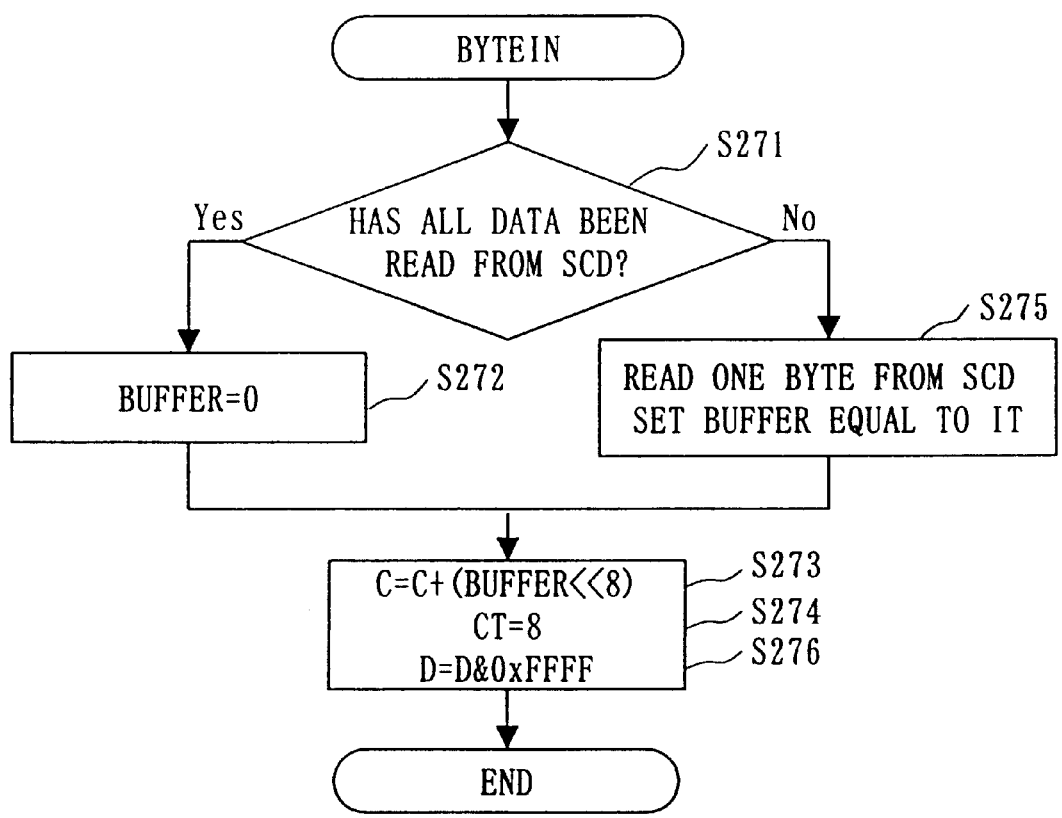

ENCODING APPARATUS, DECODING APPARATUS, ENCODING/DECODING APPARATUS, ENCODING METHOD AND DECODING METHOD

BACKGROUND OF THE INVENTION

1. Field of the Invention

The present invention relates to arithmetic encoding and arithmetic decoding of image or data, in particular, for example, relates to an encoding apparatus, a decoding apparatus, an encoding/decoding apparatus, an encoding method and a decoding method.

2. Description of the Related Art

FIG. 39 is an explanatory drawing of a concept of arithmetic encoding.

In FIG. 39, an effective region on a number line is divided into two partial region as an MPS (more probable symbol) partial region and an LPS (less probable symbol) partial region. Encoding is implemented by updating the effective region with one of the partial regions corresponding to a new symbol. However, the more a region range decreases, the more the numbers of effective bits of a lower limit value and an upper limit value increase as shown by binary decimals (fixed decimal) in FIG. 39, so that a register is required to have a certain precision for an operation.

In the description of the present application, a term "effective region" means a range (region) specified on a number line which may include arithmetic codes (coordinates) generated by dividing or updating data according to repeatedly encoding. Once the effective region is updated, the generated arithmetic code (coordinate) is never mapped within the range (region) on the number line other than the updated effective region.

In this case, even if the number of the effective digits increases, the high order digits seldom change. Considering this, as shown in FIG. 40, a renormalization is implemented to keep the decimal part to have the precision of dividing the region (in case of FIG. 40, 3 digits) and to flush the high order digits to integral part.

In FIG. 40, the effective region range A is made at least 4 corresponding to ½ (a half of the effective region range) and at most 8 (only initial value is 8) corresponding to 1 (a whole size of the effective region range) by extending to power of 2 times by the renormalization process. When the lower limit value (code) is assumed to be C, the effective region can be expressed by at least C and less than C+A.

First Related Art

An encoder and a decoder using arithmetic encoding and decoding can be embodied using the tables and the processing flows described in the International Standard Recommendation T. 82 of ITU-T (International Telecommunication Union). In the following explanation, the arithmetic encoding is referred to as a QM-Coder, the encoder is as an encoding section 1A and the decoder is a decoding section 16A. FIGS. 41 and 42 show general configurations of the encoder and the decoder.

In FIG. 41, the encoding section 1A receives two inputs, one of which is a CX (context) 2 and the other is an encoding PIX pixel) 3. The encoding section 1A outputs a code (code) 4A. In FIG. 42, the decoding section 16A receives two inputs, one of which is a CX (context) 2 and the other is a code 4A. The decoding section 16A outputs the PIX 3 decoded.

Data memory 5 accumulates images 6. The data memory 5 generates the context CX2 (10 bits, a total of 1024 patterns), which is a common reference pattern of 10 adjacent pixels, already encoded/decoded, indicated by Model Template for an encoding/decoding pixel. The data memory 5 also outputs the encoding pixel at the time of encoding, and accumulates decoded pixels at the time of decoding.

The QM-Coder selects either of 2-line and 3-line standard model templates for generating the context CX2 as shown in FIG. 43 and informs of the selected standard model templates from the encoder to the decoder using a predetermined header information.

In the QM-Coder, a prediction matching probability of pixel value is estimated for each context of each encoding/decoding pixel, and encoding/decoding is performed by learning the change of the prediction matching probability of pixel value. Learning is implemented by rewriting a learning memory consisting of two variable tables having indexes of contexts. One of the two variable tables is an MPS table 7 storing a pixel value MPS (More Probable Symbol), which has a high probability of occurrence, as a prediction value of one bit. (A pixel having a less probability of occurrence is called LPS (Less Probable Symbol)). The other of the two variable tables is an ST table 8 storing a state number (0–112) of 7 bits. This state number is for classifying the state of matching probability of the prediction value into total of 113 states. Initial values for the MPS table 7 and the ST table 8 are all "0".

The QM-Coder includes a probability estimation table consisting of four constant tables for referring state number (state) on encoding/decoding as an index other than the above two variable tables of the learning memory.

The four constant tables are an LSZ table 9 storing LSZ value which shows an LPS region range by 16 bits, an NMPS table 10 showing a next state of MPS transition by 7 bits, an NLPS table 11 showing a next state of LPS transition by 7 bits, and an SWTCH table 12 showing an inversion of prediction value by one bit. FIG. 44 shows values set in the constant tables (These names expressed by capital alphabet letters for variable and constant tables will be used as array names in processing flow explained below.)

The LSZ table 9 is referred to by an operating unit of an arithmetic encoder 13A/an arithmetic decoder 17A and is not directly related to learning of adaptive prediction. In the arithmetic encoder 13A/the arithmetic decoder 17A, a calculation is operated using the LSZ value of the LSZ table 9, and when an operation precision is reduced, the operation is renormalized. When the renormalization occurs, learning is instructed at the same time.

On encoding, the pixel-to-symbol converter 15 detects match/mismatch between the MPS value supplied from the MPS table 7 using the context CX2 as an index and the pixel value PIX 3. The pixel-to-symbol converter 15 outputs binary symbol 14 which is a result of the detection of match/mismatch to the arithmetic encoder 13A, the learning memory (the MPS table 7 and the ST table 8) and leaning is performed by the learning instruction.

On decoding, the symbol-to-pixel converter 18 converts the symbol (the MPS or the LPS) into the pixel and outputs the obtained pixel to the data memory 5 based on the binary symbol 14 decoded by the arithmetic decoder 17A showing match/mismatch between the MPS value supplied from the MPS table using the CX2 as the index and the pixel PIX 3 to be decoded. When the MPS value and the PIX 3 match, the symbol-to-pixel converter 18 outputs the MPS value to the data memory 5 as the PIX 3. On the contrary, the symbol-to-pixel converter 18 outputs the LPS value (=1−MPS) when the MPS value and the PIX 3 do not match. The binary symbol 14 is also supplied to the learning memory (the MPS table 7 and the ST table 8) and learning is performed by the learning instruction.

When the learning is instructed, if the encoding/decoding binary symbol 14 is MPS, the value of the NMPS table 10 is written in the ST table 8. If the encoding/decoding binary symbol 14 is LPS, the value of the NLPS table 11 is written in the ST table 8. The state transition is thus performed. When learning is performed by LPS, if the prediction matching probability is ½, the MPS value is inverted (operation "1−MPS") and the inverted value is written in the MPS table 7. It is detected whether the prediction matching probability is ½ or not using the SWTCH value as a flag.

In the arithmetic encoder 13A, encoding operation is implemented by a C register 30A showing a code (a lower limit value of the region) and an A register 31 showing a region range using inputs of the LSZ value 9 and the binary symbol 14. The CT counter 50 controls output timing of the code of byte unit. Undetermined code having probability of carry-over is waiting at a BUFFER 51 and an SC counter until the code is determined and the determined code is output as a code 4A.

In the arithmetic decoder 17A, the CT counter 50 controls input timing of the code of byte unit using inputs of the LSZ value 9 and the code 4A. Decoding operation is implemented by a C register 30B showing a dislocation from the lower limit value of the region to the code 4A and an A register 31 showing the region range through a BUFFER 51 to output the binary symbol 14.

A detailed operation inside of the blocks and among the blocks configured as shown in FIGS. 41 and 42 will be explained by following flow charts of FIGS. 46 through 62.

Before explaining an encoding processing flow and a decoding processing flow, bit assignments of an encoding register (C register) 30A, a decoding register (C register) 30B and a region range register (A register) 31 are shown in FIG. 45.

In the encoding register (C) 30A, a decimal point is placed between $15^{th}$ bit and $16^{th}$ bit, "x" (16 bits) shows a calculation part Cx32 for the LSZ 9. If the calculation results in carry-over, the bits of "x" is propagated to the high order bit. "s" (3 bits) shows a spacer bit part Cs33, "b" (8 bits) shows a byte output part Cb34, and "c" (1 bit) is a carry detector Cc35. In the encoding process, the value of the C register is updated to the lower limit value of the range corresponding to the encoded symbol as the code 4.

In the decoding register (C) 30B, a low-order word CLOW 36 and a high-order word CHIGH 38 can be embodied by the registers of 32 bits. A decimal is set at position upper to the bit 31, which is MSB (Most Significant Bit). "b" (8 bits) is a high-order byte Cb37 of the byte inputting part (CLOW register 36), and "x" (16 bits) is calculating part Cx (CHIGH register 38) 39 corresponding to the LSZ 9. In the decoding process, the value of the C register is updated to an offset value of the code 4, which is coordinate of the region, from the lower limit value of the region corresponding to the decoded symbol.

The region range register (A) 31 is commonly used for the encoding and decoding processes. A decimal is set corresponding to the decimal of the encoding register 30A/the C register 30B, and "a" (16 bits) is placed as decimal part corresponding to the register part "x". At initial state, the integer part (bit 16) becomes "1". The region range (also called as "region size") is updated to A-LSZ (lower partial region range) or LPZ (upper partial region range). The region range register (A) 31 is renormalized so that bit 15 showing weight of ½ becomes "1" except the initial value (the integer part "1"). It is guaranteed that the lower partial region is obtained even if any LSZ 9 is selected as the upper partial region range by keeping the weigh more than ½. In the renormalization, the A register 31 and the C register 30A or 30B are extended by shift operation simultaneously.

In the QM-Coder, the upper partial region LSZ 9, which is fixed size for any state, is usually assigned to LPS. When the lower partial region becomes smaller than the upper partial region, the upper partial region is assigned to MPS by "conditioning MPS/LPS exchange". On encoding/decoding LPS, or encoding/decoding MPS by applying "conditional MPS/LPS exchange", renormalization is always implemented.

The encoding/decoding processing flow will be explained according to the bit arrangement of the register. In the processing flow, a term "layer (of the resolution)" in case of hierarchical encoding and "stripe" means "stripe" of the image divided by N line unit (only the last stripe may have lines equal to or less than N lines, or N=1). Here, it is assumed that the number of layers is 1 and stripe equals line (N=1), however, this encoding/decoding process can be applied to a plurality of layers.

The following auxiliary variables CT50, BUFFER 51, SC 52, and TEMP 53 are used for explaining the encoding/decoding process as well as variables, tables, and registers described above in the explanation of FIGS. 41, 42 and 45. The auxiliary variable CT50 counts the number of shifts by the renormalizaion implemented in the C registers 30A, 30B and the A register 31. When the value becomes "0", the CT50 is used for inputting/outputting byte of a next code. The auxiliary variable BUFFER 51 stores byte value of the code supplied from the C register 30A and stores byte value of the code input to the C register 30B. The SC 52 is used only for encoding, and counts the number byte value of 0xFF continuously occur in the code output from the C register 30A.

In this specification, a value starting with a prefix "0x" indicates hexadecimal number. The TEMP 53 is used only for encoding, and detects the carry to the BUFFER 51, obtains the low order 8 bits of the carry-over number as a new value of the BUFFER 51. The BUFFER 51 is set by the C register 30A through the TEMP 53. The BUFFER 51 never becomes 0xFF without the carry-over. In case of the carry-over to the high order bits, the bits, the order of which is lower than the BUFFER 51, namely, the BUFFER 51 and SC 52 number of 0xFF, may be changed. Accordingly, the code output from the C register 30A cannot be determined as the code 4.

FIG. 46 is a flowchart showing a general encoding process of the ENCODER.

In this processing flow of the International Standard Recommendation T. 82, prediction process for TP (Typical Prediction) and DP (Deterministic Prediction) is shown. Process for TP and DP is not directly related to the present invention nor the conventional art, thus an explanation for TP and DP is omitted. First, at step S101, INITENC is called to perform initialization of encoding process. At step S102, a pair of the pixel PIX and the context CX is read one by one to be encoded by the ENCODE process at step S103. At step S104, S102 and S103 are repeated until the stripe (here, line) is finished to be supplied. Further, at step S105, encoding process for stripe is performed repeatedly from S102 through S104 until the image is finished to be supplied. Finally, FLUSH is called to perform termination process at step S106.

FIG. 47 is a flowchart showing ENCODE processing flow. In this flow, a process to be called is switched based on match or mismatch between the encoding pixel value 3 and the prediction value 7.

At step S111, match or mismatch between the pixel value 3 and the prediction value 7 is detected. When match is detected ("Yes" at step S111), the encoder encodes MPS, and when mismatch is detected ("No" at step S111), the encoder encodes LPS. At step S113, CODEMPS is called to encode MPS, and at step S112, CODELPS is called to encode LPS.

FIG. 48 is a flowchart showing CODELPS processing flow. The CODELPS is called for encoding LPS, namely, the mismatch is detected between the encoding pixel value 3 and the prediction value 7.

At step S121, the value of the A register 31 is temporarily updated to the lower partial region range. If step S122 results in "Yes", conditional MPS/LPS exchange is applied. Namely, the value of the A register 31 is unchanged to encode the lower partial region and the C register 30A is not updated. If step S122 results in "No", the upper partial region is encoded. That is, at step S123, the C register 30A showing the lower limit value is updated and at step S 124, the A register 31 showing the region range is updated. When the constant SWTCH value 12 equals "1" at step S125, the prediction value (MPS table) is inverted or updated at step S126. In LPS encoding, the state transition referring to the NLPS table 11 is performed at step S127. At step S128, renormalization is implemented by calling RENORME.

FIG. 49 is a flowchart showing CODEMPS processing flow. The CODEMPS is called for encoding MPS, that is, the encoding pixel value 3 matches to the prediction value 7.

First, at step S131, the value of the A register 31 is temporarily updated to the lower partial region range. If step S132 results in "No", the CODEMPS process terminates with this step. If step S132 results in "Yes", the state transition is always implemented referring to the NMPS table 10 at step S136. And at step S137, the renormalization is implemented by calling RENORME. Before steps S136 and 137, if step S133 results in "Yes", the A register 21 does not change for encoding the lower partial region and the C register 30A is not updated. If step S133 results in "No", conditional MPS/LPS exchange is applied and the upper partial region is encoded. At step S134, the C register 30A is updated and the A register 31 is updated at step S135.

FIG. 50 shows RENORME processing flow for implementing the renormalization.

To shift the value of the A register 31 and the C register 30A to higher order by 1 bit respectively at steps S141 and S142 means to perform an operation equal to the multiplication by 2. At step S143, 1 is subtracted from the variable CT50 and at step S144, it is checked whether the variable CT50 is "0" or not. If step S144 results in "Yes", BYTEOUT process is called at step S145 and the C register 30A outputs the code 4 of one byte. At step S146, completion of the renormalization is detected. If the value of the A register 31 is less than 0x8000, steps S141 through S145 are repeated. If the value of the A register 31 is equal to or more than 0x8000, the renormalization process is completed.

FIG. 51 shows BYTEOUT processing flow for outputting the code 4 byte by byte from the C register 30A.

A byte output section Cb 34 of the C register 30A is to be output. The carry detector Cc 35 operates at the same time for detecting carry-over. At step S151, 9 bits of the sum of the Cb register 34 and the Cc register 35 are set to the variable TEMP 53. The byte output is processed by three ways based on the check at steps S152 and S159. Namely, a case where the carry-over has occurred at step S152 (TEMP>0x100; Cc=1), a case where the carry-over has not occurred and TEMP=0xFF, and a case where the carry-over has not occurred and TEMP<0xFF. If step S152 results in "Yes", at step S153, the code already output from the C register 30A and stored as the BUFFER 51 and carry value 1 is determined as a code. At step S154, SC 52 number of byte value 0 (stacked 0xFF has been converted into 0x00 by the carry) is written and "SC+1" bytes of the code value with carry-over is determined.

At step S155, the variable SC 52 is set to "0" and at step S156, the low order 8 bits of the variable TEMP are set to the variable BUFFER 51. At step S157, the Cc register 35 and the Cb register 34, which are processed as variable TEMP 53, are cleared. At step S158, "8" is set to the variable CT 50 for processing 8 bits until a next byte is output. If step S159 results in "Yes", the code 4 cannot be determined and the variable SC 52 is incremented by "1" to accumulate 0xFF. If step S159 results in "No", the code 4 already output from the C register 30A is written as the value of the BUFFER 51 at step S153 At step S154, SC 52 number of byte value 0xFF are written and the code value of "SC+1" bytes is determined as the code value. At step S163, the variable SC 52 is set to "0" and at step S164, the variable TEMP 53 (8 bits, without carry-over) is set to the variable BUFFER 51.

FIG. 52 shows INITENC processing flow for setting the initial values of the ST table 8, the MPS table 7 and each variable at starting time of the encoding.

In the figure, at step S171, "the first stripe of this layer" means "starting time of encoding an image" when the image does not include a concept of layer or stripe. In case of an image consisting of a plurality of stripes, processing can be continued without initializing the variable tables for each stripe At step S171, it is checked if this is the first stripe of the pixel of this layer or forced reset of the tables.

If step S171 results in "Yes", the ST table 8 and the MPS table 7, which are the variable tables for all the contexts CX2, are initialized at step S172. The SC 52, the A register 31, the C register 30A and the variable CT 50 are initialized at steps S173, S174, S175 and S176, respectively. The initial value 11 of the CT50 is the sum of the number of bits of the Cb register 34 and the number of bits of the Cs register 33. After processing 11 bits, the first code is output. If step S171 results in "No", the table values at the end of the previous stripe of the same layer are set to the variable tables at step S177 instead of the initialization.

FIG. 53 shows FLUSH processing flow for implementing termination process including sweeping out the remaining value in the C register 30A.

At step S181, CLEARBITS is called to minimize the number of effective bits of the code remaining in the C register 30A. At step S182, FINALWRITES is called to finally output the variable BUFFER 51, SC 52 and the code 4, which has been undetermined and is now determined, by the C register 30A. At step S183, the first byte of the code 4 is removed because the variable BUFFER 51 is output (as integer part of the code) prior to the value output from the C register 30A. At step S184, the consecutive bytes "0x00" at the end of the code 4 can be removed, if desired, because the code 4 is decimal coordinates within the final effective range.

FIG. 54 shows CLEARBITS processing flow for minimizing the number of effective bits of the code 4 at the end of encoding.

By this process, the code 4 is determined to be the value that ends with the greatest possible number of "0x00". At step S191, the variable TEMP 53 is set to the value obtained by clearing the low-order two bytes (Cx register 32) of the upper limit value of the final effective range. At step S192, it is checked if the value obtained by clearing the low-order two bytes of the upper limit value is larger than the value of the C register 30A. If step S192 results in "Yes", overcleared bytes are returned to the variable TEMP 53 at step S193 and the value of the C register 30A is set to the value after returning the overcleared byte. If step S192 results in "No", the value of the variable TEMP 53 is set in the C register 30A.

FIG. 55 shows FINALWRITES processing flow for writing the code determined at the end of encoding including remaining value in the C register 30A.

At step S201, the C register is shifted by the number of bits shown by the values of the variable CT50 to enable to output the code and to detect the carry-over. At step S202, it is checked if the carry-over has occurred or not. If step S202 results in "Yes", the carry-over has occurred and if "No", the carry-over has not occurred. As well as in the BYTEOUT processing flow, the code of "SC+1" bytes is determined by writing the code value already output from the C register 30A at steps S203 and S204 for the code value with the carry or at steps S207 and S208 for the code value without the carry. At step S205, the register Cb 34 value (1 byte), and at step S206, the code is finished to be output by outputting the low-order 1 byte of the register Cb 34 value.

FIG. 56 shows DECODER processing flow illustrating a whole decoding process.

In processing flow of the International Standard Recommendation T. 82, processes for TP (Typical Prediction) and DP (Deterministic Prediction) is not directly related to the present invention nor the conventional arts (the first and the second related arts), thus an explanation is omitted. First, at step S211, INITDEC is called to initialize the decoding process. At step S212, the contexts CX2 is read one by one. At step S213, the pixel PIX 3 is decoded by the process DECODE. At step S214, steps S212 and S213 will be repeated until the stripe (in this case, line) is finished to be supplied. Further, at step S215, decoding process for stripe is repeated from steps S212 through S214 until the image is finished to be supplied.

FIG. 57 shows DECODE processing flow for decoding the decoding pixel.

First, at step S221, the value of the A register 31 is temporarily updated by the lower partial region range. If step S222 results in "Yes", the lower partial region is decoded. If step S223 results in "Yes", MPS_EXCHANGE is called at step S224 and RENORMD is called at step S225 to implement the renormalization. If step S223 results in "No", the MPS is decoded without implementing the renormalization, and the prediction value 7 is taken as the pixel value 3. If step S222 results in "No", the upper partial region is decoded. LPS_EXCHANGE is called at step S227 and RENORMD is called at step S228 to implement the renormalization. In the path for calling MPS_EXCHANGE and LPS_EXCHANGE, even if the decoding region is determined, it is impossible to know which should be decoded between MPS and LPS without detecting which region is larger, MPS or LPS. Accordingly, each pixel value 3 is determined by the called processing flow.

FIG. 58 shows LPS_EXCHANGE processing flow for decoding the upper partial region. If step S231 results in "Yes", the MPS is decoded. At step S232, the C register 30B is updated and the A register 31 is updated at step S233. At step S234, the prediction value 7 is determined as the pixel value 3 without any change. At step S235, a state is moved to a next state by referring to the NMPS table 10. If step S231 results in "No", the LPS is decoded. At step S236, the C register 30B is updated and the A register 31 is updated at step S237. At step S238, non-prediction value "1—prediction value" is determined as the pixel value 3. If step S239 results in "Yes", the prediction value (MPS table) 7 is inverted or updated at step S240. At step S241, a state is moved to a next state by referring to the NLPS table 11.

FIG. 59 shows MPS_EXCHANGE processing flow for decoding the lower partial region. If step S251 results in "Yes", the LPS is decoded. At step S252, non-prediction value is determined as the pixel value 3. If step S253 results in "Yes", the prediction value MPS table) is inverted or updated at step S254. At step S255, a state is moved to a next state by referring to the NLPS table 11. If step S251 results in "No", the MPS is decoded. At step S256, the prediction value 7 is determined as the pixel value 3 without any change. At step S257, a state is moved to a next state by referring to the NMPS table 10.

FIG. 60 shows RENORMD processing flow for implementing renormalization.

At step S261, it is checked whether the value of the variable CT50 is 0 or not. If step S261 results in "Yes", BYTEIN is called so as to input the code 4 of one byte into the C register 30B at step S262. At step S263, the A register 32 is shifted to higher-order by 1 bit and the C register 30B is shifted to higher-order by 1 bit at step S264. This shifting operation equals to duplication. At step S265, 1 is subtracted from the variable CT50. At step S266, it is checked whether the renormalization is completed, that is, the value of the A register 31 is less than 0x8000, or not. If the value of the A register 32 is less than 0x8000, steps S261 through S265 are repeated. At step S267, it is checked whether the value of the variable CT50 is 0 or not. If step S267 results in "Yes", BYTEIN is called so as to input the code of one byte into the C register 30B.

FIG. 61 shows BYTEIN processing flow for reading the code 4 into the C register 30B byte by byte.

In the figure, "SCD" (Stripe Coded Data) is the code 4 for stripe. If step S271 results in "Yes", no code 4 is to be read at step S272, and the variable BUFFER 51 is set to "0". At step S273, the value of the variable BUFFER 51 is read into the CLOW register 36 (Cb 37), and at step S274, the variable CT50 is set to "8" for processing the code of 8 bits until a next code is input. If step S271 results in "No", the code 4 of one byte is read from the "SCD" into the variable BUFFER 51 at step S275.

FIG. 62 shows INITDEC processing flow for setting initial values of the ST table 8, the MPS table 7 and each variable at starting time of the decoding.

Initialization of the table values of steps S281, S282 and S290 are the same as ones of steps S171, S172 and S177 of INITENC processing flow in the encoding process. The initial value of the C register 30B is set by inserting 3 bytes of the code 4 into the Cx register 39 and the Cb register 37. At step S283, the C register 30B is cleared, and at step S284, BYTEIN is called so as to insert 1 byte of the code 4 into the Cb register 37. At step S285, the C register 30B is shifted by 8 bits, and at step S286, BYTEIN is called so as to insert 1 byte of the code 4 into the Cb register 37. At step S287, the C register 30B is shifted by 8 bits, and at step S288, BYTEIN is called so as to insert 1 byte of the code 4 into the Cb register 37. By these steps, the sum of 3 bytes of the code 4 is set in the Cx register 39 and the Cb register 37. The initial value of the A register 31 is set at step S289.

Second Related Art

In the following, the second related art will be explained.

An encoder and a decoder for arithmetic encoding according to the second related art are embodied by applying tables and flowcharts explaining processes described in the Japanese Patent No. 2755091.

In the arithmetic encoding system, which outputs the code by byte unit, when the output byte value is 0xFF, the code value cannot be determined because the carry afterwards may propagate to the higher bit which has been already output. Accordingly, it is forced to determine whether the carry-over occurs or not if there is possibility of the carry propagated to the effective region when the output byte value becomes 0xFF.

FIG. 63 shows a conception to forcibly determine whether the carry-over occurs or not.

In the figure, the lower limit value C is the value of the encoding register (C register) 30A, and the upper limit value U60 is the sum of the lower limit value C30A and the effective partial region range A (the value of the A register) 31. It is judged that the carry-over occurs when the lower limit value does not match the most significant bit of the upper limit value, and then it is judged a value of a carry boundary T61 exists within the effective region.

The effective region is divided by the carry boundary value into two partial regions called "a carry region" where the carry-over occurs and "a carryless region" where the carry-over does not occur. A carry region range R162 is shown as (U-T) and a carryless region range R063 is shown as (T-C). Whether the carry-over occurs or not is determined by detecting a case the effective region completely match the carry region or the carryless region, or detecting a case the effective region is included in the carryless region or the carry region. Here, it is assumed one of the partial regions of the effective region is truncated and the other of the partial regions is made to be a new effective region. On truncation of the partial region, it is preferable to truncate a smaller partial region for reducing the loss of code length. In the figure, the partial region R063, which is smaller than the partial region R162, is truncated. By truncation of the partial region, it becomes necessary to check the necessity of renormalization of the new effective region. Such a method for controlling the carry of the arithmetic encoding system is called adaptive region truncation system.

FIGS. 64 and 65 respectively show rough sketch of the configuration of an encoding section 1B and a decoding section 16B of the arithmetic encoding system which employs adaptive region truncation system.

FIG. 64 corresponds to FIG. 41 of the first related art and shows the encoding section 1B provided by altering an arithmetic encoder 13B and a code 4B. FIG. 65 corresponds to FIG. 42 of the first related art and shows the decoding section 16B provided by altering an arithmetic decoder 17B and the code 4B. The data flows among the blocks including these altered elements and learning is implemented in the same way as the conventional cases shown in FIGS. 41 and 42.

In the arithmetic encoder 13B, an encoding operation is initiated in the C register 30A and the A register 31 by inputting the LSZ value 9 and the binary symbol 14. The CT counter 50 controls the timing for outputting the code by byte unit. Synchronized with outputting the code, the carry boundary within the region is detected by a U register 60, a T register 61, an R1 register 62, and an R0 register 63. When the carry boundary is detected, the values of the C register 30A and the A register 31 are modified to forcibly determine if the carry-over occurs or not by applying the adaptive region truncation system. The carry is propagated to the BUFFER 51 at maximum to output a definite code, namely, the code 4B.

In the arithmetic decoder 17B, the CT counter 50 controls the timing for inputting the code by byte unit with inputting the LSZ value 9 and the code 4B. Synchronized with inputting the code, the carry boundary within the region is detected by a D register 64, which is reproduced from the encoding register 30A, the U register 60, the R1 register 62, and the R0 register 63. When the carry boundary is detected, the values of the C register 30A, the D register 64 and the A register 31 are modified by applying the adaptive region truncation system. The decoding operation proceeds by the C register 30B, the A register 31 and the D register 64 through the BUFFER 51 to output the binary symbol 14.

A detailed operation within the blocks and among the blocks of the configurations shown in FIGS. 64 and 65 will be explained using flowcharts of FIGS. 46 through 49, 53, 54, 56, 57 and 59 explaining the operation of first related art, which has been described, and flowcharts of FIGS. 67 through 76, which will be described later.

FIG. 66 shows the encoding register used in the adaptive region truncation system.

In this register, the Cs register 33 is eliminated compared with the encoding register shown in FIG. 45 referred in the description of the above first related art. This is because outputting the byte from the encoder and inputting the byte to the decoder should be synchronized, and the adaptive region truncation is also synchronized with inputting/outputting the byte. In encoding (encoder), the value of the encoding register is updated by the lower limit value of the effective region, and in decoding (decoder), the value of the encoding register is updated by displacement (offset) from the lower limit value of the effective region to the code value. Accordingly, on decoding, the value of the encoding register of the encoder should be reproduced in the decoder to precisely detect the carry boundary. In decoding process, this value is held by the D register 64 having the same configuration with the encoding register of the encoder.

An operation of the second related art will be described in reference to flowcharts explaining processes modified from or added to the operation of the first related art.

The adaptive region truncation system will be described by adding necessary modifications to the flowcharts explaining encoding/decoding process of the QM-Coder described in the above first related art. The operations of FIGS. 46 through 49, 53 and 54 relating to the encoder and FIGS. 56, 57 and 59 relating to the decoder will be the same with ones explained in the first related art by referring to the flowcharts. The upper limit value U60 of the effective region, the carry boundary value T61, the carryless region range R063, the carry region range R162, and the D register 64 are additionally employed for the explanation of the operation as variables.

FIG. 67 is a flowchart explaining RENORME process for performing the renormahzation.

Compared with the flowchart (FIG. 50) of the first related art, a step S147 for calling ROUNDOFFE process is added for detecting whether the adaptive region truncation process is applied or not. A step for calling BYTEOUT process (S145 of FIG. 50) is included in the ROUNDOFFE process.

FIG. 68 is a flowchart explaining ROUNDOFFE process for implementing the adaptive region truncation process.

At step S301, it is checked if the output byte value is 0xFF or not. If S301 results in "No", the ROUNDOFFE process terminates with this step. If S301 results in "Yes", the carry boundary value T61 (constant) is set at step S302, and the carryless region range R063 is set at step S303. At step S304, the carryless region range R063 is compared with the region range (the value of the A register). If the value R063 is not smaller than the value of the A register 31 or the value R063 is not larger than 0 (S304 results in "No"), the carry boundary T61 is not within the effective region and the process terminates with this step. If the value R063 is smaller than the value of the A register 31 and the value R063 is larger than 0 (S304 results in "Yes"), at step S305, the upper limit value U60 is set, and the carry region range R162 is set at step S306. At step S307, the value R063 is smaller than the value R162 (S307 results in "Yes"), the lower limit value is updated by the carry boundary value at step S308 and the value R1 is set in the region range register (the value of the A register) at step S309 so that the carry region is made be the effective region. If the value R063 is larger than the value R162 (S307 results in "No"), the value R063 is set in the region range (the value of the A register) 31 at step S309 so that the carryless region is made be the effective region. Finally, BYTEOUT process is called at step S311.

FIGS. 69, 70 and 71 respectively show flowcharts explaining BYTEOUT process, INITENC process, and FINALWRITES process. As different points from FIGS. 51, 52 and 55 corresponding figures of the first related art, the number of masking or shifting is changed for steps S151' and S157' of FIG. 69 (flowchart of BYTEOUT), step S176' of FIG. 70 (flowchart of INTENC), and steps S202', S205' and step S206' of FIG. 71 (flowcharts of FINALWRITES) because of the elimination of the Cs register part 33 of the encoding register.

In FIG. 68 (flowchart of ROUNDOFFE), whether the carry propagates or not has been already determined when the output byte value is 0xFF, thus the variable BUFFER can be output serially. The checking step S159 becomes unnecessary in FIG. 69 (flowchart of BYTEOUT). Similarly, the variable SC itself and steps concerning the variable SC such as steps S154, S155, S160, S162, S163 of FIG. 69 (flowchart of BYTEOUT), S173 of FIG. 70 (flowchart of INITENC), and S204, S208 of FIG. 71 (flowchart of FINALWRITES) become unnecessary.

FIG. 72 shows a flowchart explaining LPS_EXCHANGE process for decoding the upper region. Compared with the flowchart of the first related art (FIG. 58), steps S242, S243 are added for reproducing the encoding register as the D register in the decoder.

FIG. 73 shows a flowchart explaining RENORMD process for performing renormalization.

Compared with the flowchart of the first related art (FIG. 60), steps S269 for reproducing the encoding register as the D register and S270 for calling the ROUNDOFFD process to detect whether the adaptive region truncation is applied or not are added, and step for calling the BYTEOUT process (step S262 of FIG. 60) is included in the ROUNDOFFD process. Since steps S261 and S267 are removed for eliminating redundancy of checking, the flowchart of FIG. 73 has a different shape from the flowchart of FIG. 60, however, the operation of the process is the same.

FIG. 74 shows a flowchart explaining ROUNDOFFD process for applying the adaptive region truncation.

Compared with the ROUNDOFFE process of FIG. 68, the encoding register includes the variable D64 instead of C30A. Steps S321 through S331 correspond to steps S301 through S311. A step S332 is added for applying the adaptive region truncation process to the encoding register 30B of the decoder (the register D64) corresponding to the encoding register 30A of the encoder. Finally, the BYTEIN process is called at step S331 instead of the BYTEOUT process (step S311) of FIG. 68.

FIGS. 75 and 76 respectively show flowcharts for explaining the BYTEIN process and the INITDEC process. Compared with flowcharts of FIGS. 61 and 62, a step S276 is added to FIG. 75, and a step S290 is added in FIG. 76 for initialization of reproducing the encoding register 30A of the encoder as the D register 64 in the decoder.

There are some problems in the above related arts as described in the following.

In the encoder of the first related art, in case the code value cannot be determined because whether the carry-over occurs or not is not resolved, the code length of the waiting code is stored in the counter. However, the data length is not limited, so that the overflow may occur from the counter.

Further, there is a problem that delay time due to determination of the code cannot be estimated when the data length is not known because the code cannot be output until the code value has been finally determined.

Further, when the code value is finally determined for the waiting code having long code length, it is required a long time to output the code, which may suspend the encoding process at all or temporalily.

On the other hand, as for the encoder of the second related art, there is a problem that it is checked to control the carry by the value of the encoding register, and the carry boundary should be calculated precisely.

In the decoder of the second related art, there is a problem that it cannot be checked properly to control the carry unless the encoding register of the encoder is reproduced in the decoder.

SUMMARY OF THE INVENTION

The present invention is provided to solve the above-mentioned problems of the related arts. The invention aims, for example, to estimate the definite delay time for determining the code by eliminating the overflow of the counter storing the code length of the code which is waiting until the code is determined, and by controlling the carry with forcibly determining the code at proper interval. The invention also aims to reduce the code length and the time required for outputting the code by converting the code value into a predetermined pattern.

Further, the invention also aims to control the carry without precisely calculating the carry boundary and without reproducing the encoding register of the encoder in the decoder.

According to the present invention, an encoding apparatus having a data memory accumulating information source data and outputting encoding data and its auxiliary parameter (context), a learning memory accumulating and outputting learning data relating the encoding data specified by the auxiliary parameter, a probability estimation table outputting an encoding parameter specified by the learning data, and an encoder operating an arithmetic encoding based on the encoding data and the encoding parameter and outputting a code, the encoding apparatus includes:
  a synchronization detector measuring and informing of one of inputting a predetermined unit of the information source data and outputting a predetermined unit of the code as a predetermined interval; and
  a carry boundary detector detecting a carry boundary value at the predetermined interval within an effective region and indicating to truncate a part of the effective region based on a result of detection;
    wherein the encoder truncates one of equally divided upper and lower partial regions of the effective region indicated by the carry boundary detector and updates the effective region.

According to another aspect of the invention, a decoding apparatus having
  a data memory outputting an auxiliary parameter (context) for decoding data and accumulating the decoding data decoded to output as an information source data,
  a learning memory accumulating and outputting learning data relating the decoding data specified by the auxiliary parameter,
  a probability estimation table outputting a decoding parameter specified by the learning data, and
  a decoder operating an arithmetic decoding based on the decoding parameter and a code and outputting the decoding data,
  the decoding apparatus includes:
    a synchronization detector measuring and informing of one of outputting a predetermined unit of the information source data and inputting a predetermined unit of the code as a predetermined interval; and
    a carry boundary detector detecting a carry boundary within an effective region at the predetermined interval and indicating to truncate a part of the effective region based on a result of detection;
      wherein the decoder updates the effective region by truncating one of equally divided upper and lower partial regions of the effective region which does not include a code value of the carry boundary detected.

According to another aspect of the invention, an encoding method includes:
  (a) accumulating information source data and outputting encoding data and its auxiliary parameter (context);
  (b) accumulating and outputting learning data relating the encoding data specified by the auxiliary parameter;
  (c) outputting an encoding parameter specified by the learning data;
  (d) operating an arithmetic encoding based on the encoding data and the encoding parameter and outputting a code;
  (e) measuring and informing of one of inputting a predetermined unit of the information source data and outputting a predetermined unit of the code as a predetermined interval;
  (f) detecting a carry boundary at the predetermined interval within an effective region and indicating to truncate a part of the effective region based on a result of detection; and
  (g) truncating one of equally divided upper and lower partial regions of the effective region indicated by the step of detecting and updating the effective region.

According to another aspect of the invention, a decoding method includes:
  (a) outputting an auxiliary parameter (context) for decoding data and accumulating the decoding data decoded to output as an information source data;
  (b) accumulating and outputting learning data relating the decoding data specified by the auxiliary parameter;
  (c) outputting a decoding parameter specified by the learning data;
  (d) operating an arithmetic decoding based on the decoding parameter and a code and outputting the decoding data;
  (e) measuring and informing of one of outputting a predetermined unit of the information source data and inputting a predetermined unit of the code as a predetermined interval;
  (f) detecting a carry boundary within an effective region at the predetermined interval and indicating to truncate a part of the effective region based on a result of detection; and
  (g) truncating one of equally divided upper and lower partial regions of the effective region and updating the effective region.

BRIEF DESCRIPTION OF THE DRAWINGS

A complete appreciation of the present invention and many of the attendant advantages thereof will be readily obtained as the same becomes better understood by reference to the following detailed description when considered in connection with the accompanying drawings, wherein:

FIG. 43 explains a standard model template;

FIG. 44 explains a probability estimation table;

FIG. 74 is a flowchart explaining a ROUNDOFFD process in relation to the first related art;

FIG. 75 is a flowchart explaining a BYTEIN process in relation to the first related art; and FIG. 76 is a flowchart explaining an INITDEC process in relation to the first related art.

DESCRIPTION OF THE PREFERRED EMBODIMENT

Embodiment 1

In the first embodiment of the present invention, as well as the above-described second related art, the partial region of the effective region is truncated and whether the carry-over occurs or not is determined for the code which has been already output. Further, in this embodiment, the effective region is equally divided into two partial regions and the partial region including the carry boundary is truncated.

The range of the effective region takes always the same value in the encoder and the decoder. Accordingly, when the effective region is equally divided into two partial regions, truncation can be operated by only detecting which partial region includes the carry boundary between the upper partial region and the lower partial region without precisely calculating the code value of the carry boundary in the encoding/decoding process as done in the second related art.

Figure 1:
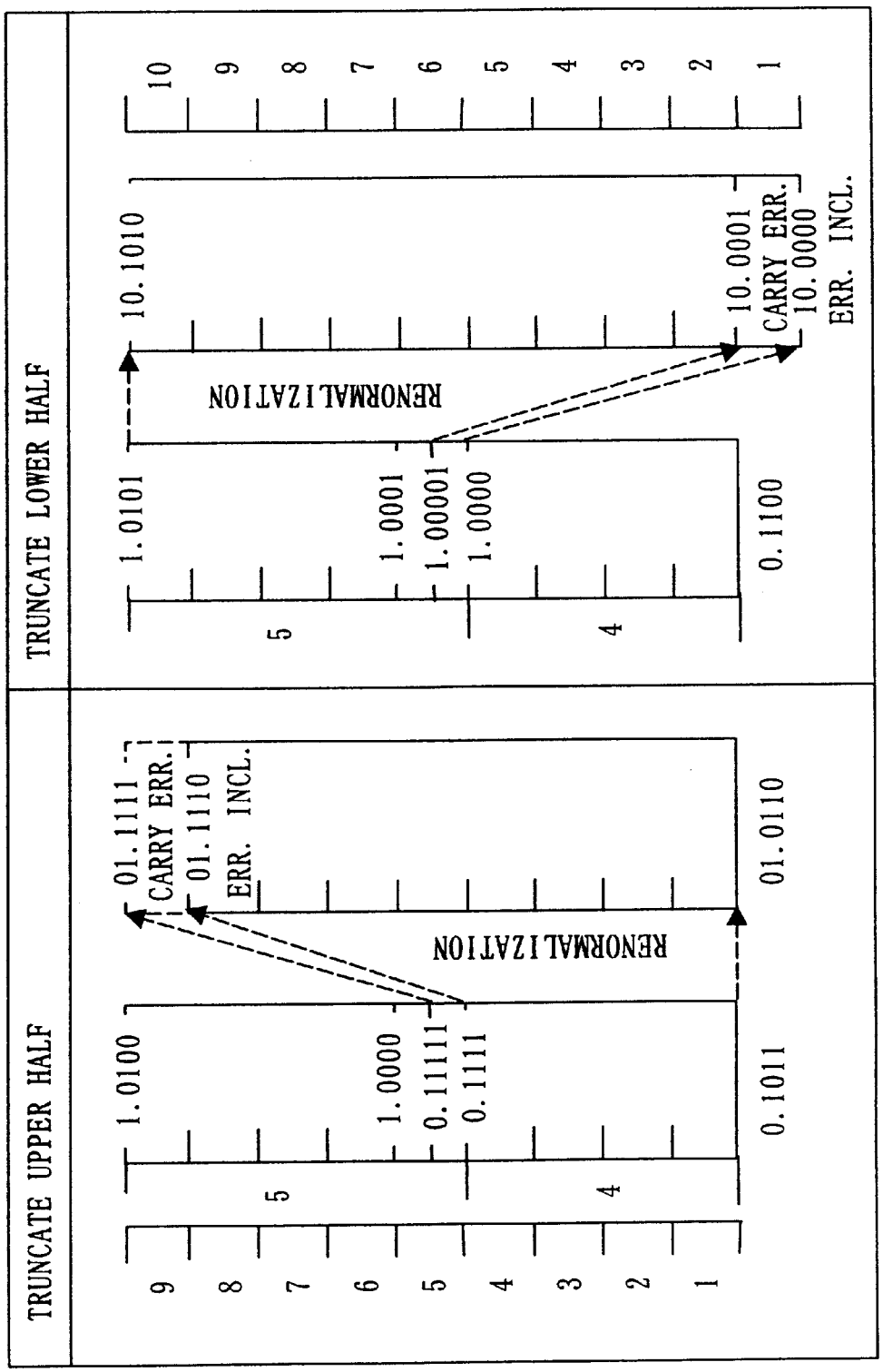
FIG. 1 explains an upper/lower region halving system in relation to the concept of the present invention.

For example, when the effective region at maximum is set to 16, the effective region is kept more than 8 by the renormahzation. At this time, it is assumed that 1.0000 is the carry boundary. When the boundary is included in the upper region, the upper half of the effective region is truncated and when the boundary is included in the lower region, the lower half is truncated. However, when the range of the effective region is an odd number, an error may occur by the carry-down due to the loss of the effective precision for expression, which should be resolved. In FIG. 1, for example, the effective region=9. Accordingly, to simply divide the effective region by two results in 4 (integer). When the lower partial region is set to 4, the upper partial region becomes 5. In this case, if the upper partial region is truncated, the lower partial region is extended twice and set to 8, and if the lower partial region is truncated, the upper partial region is extended twice and set to 10. None of the above divisions results in a precise division into equal parts.

At this time, it is certainly extended by at least twice by the renormalization after calculating a half of the value of region range register (A register) 31. Accordingly, a bit dropped by halving of the value of the A register can be compensated afterwards. In another way, it is possible to obtain a desired precise coordinate by doubling the lower limit value (the value of the C register) 30A while the region range is kept the value 9, and by adding the region range 31=9 on truncating the lower region. By any way, to apply the region halving system once always generates 1 bit code length.

Figure 2:
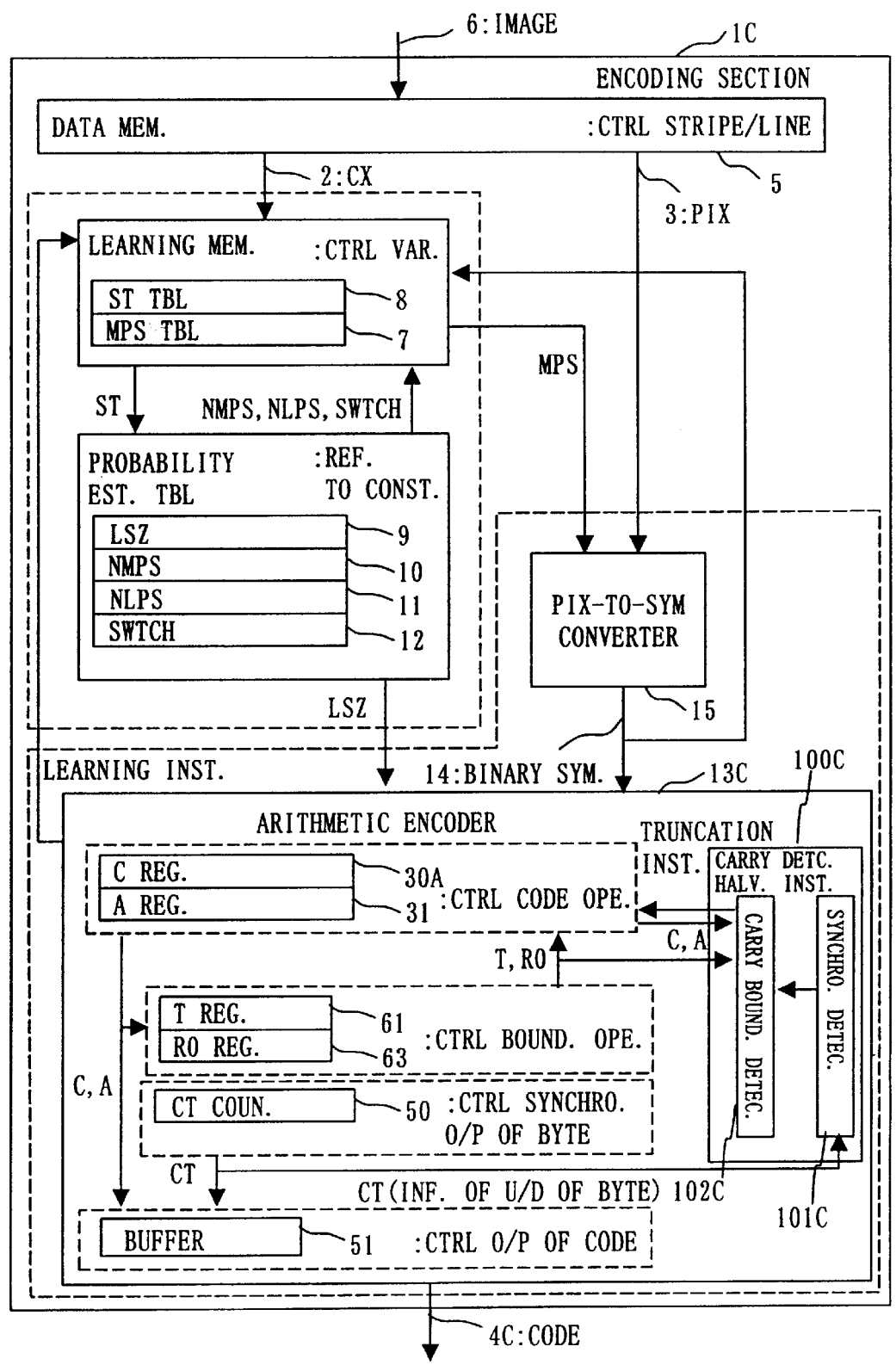
FIG. 2 is a block diagram showing a configuration of an encoding section according to the first embodiment of the invention.
Figure 3:
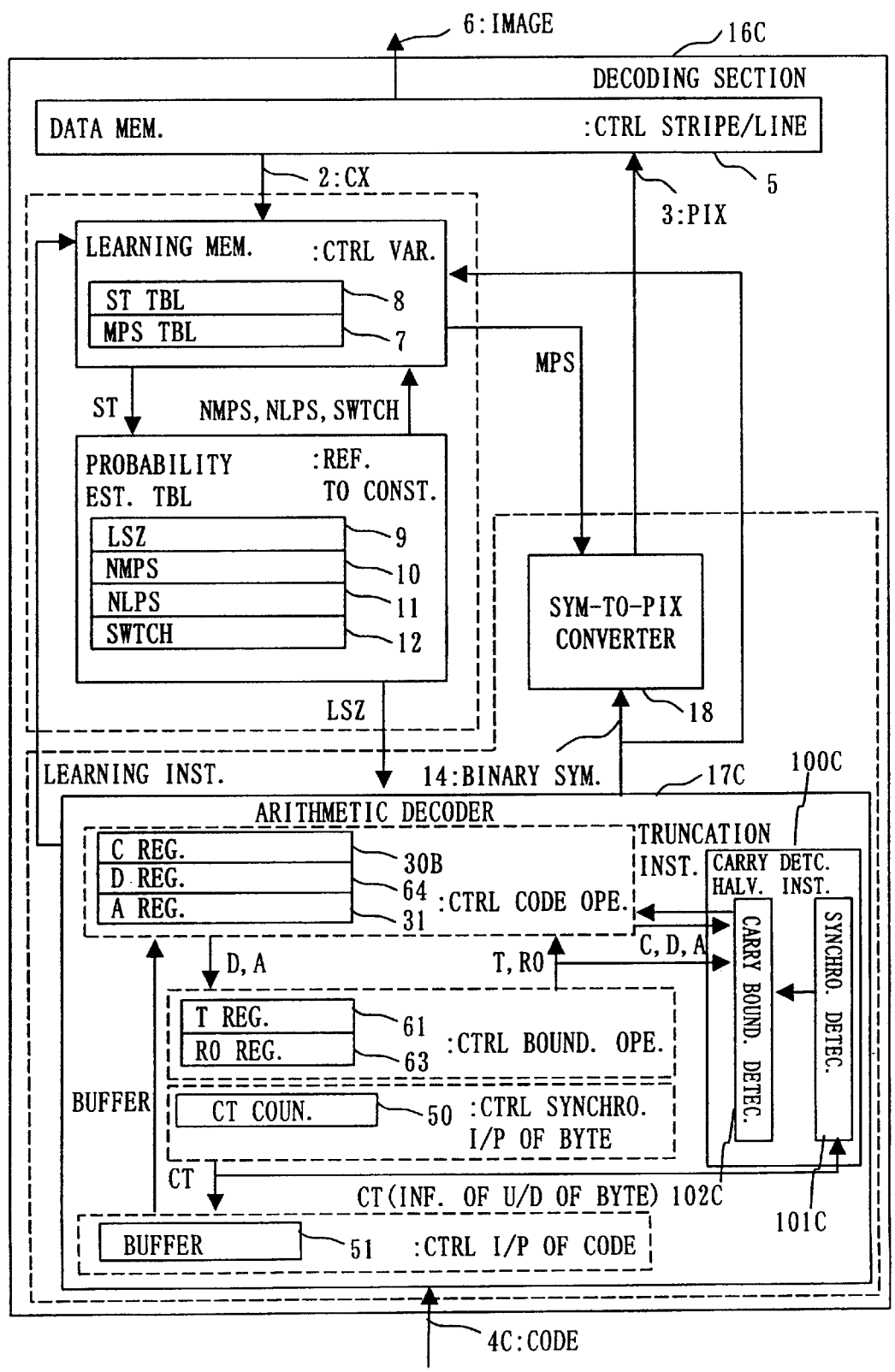
FIG. 3 is a block diagram showing a configuration of a decoding section according to the first embodiment of the invention.

In the first embodiment, an encoding section 1C is an arithmetic encoder applying the region halving system, a decoding section 16C is an arithmetic decoder corresponding to the encoder 1C. FIGS. 2 and 3 show configurations of the encoding section 1C and the decoding section 16C.

Figure 64:
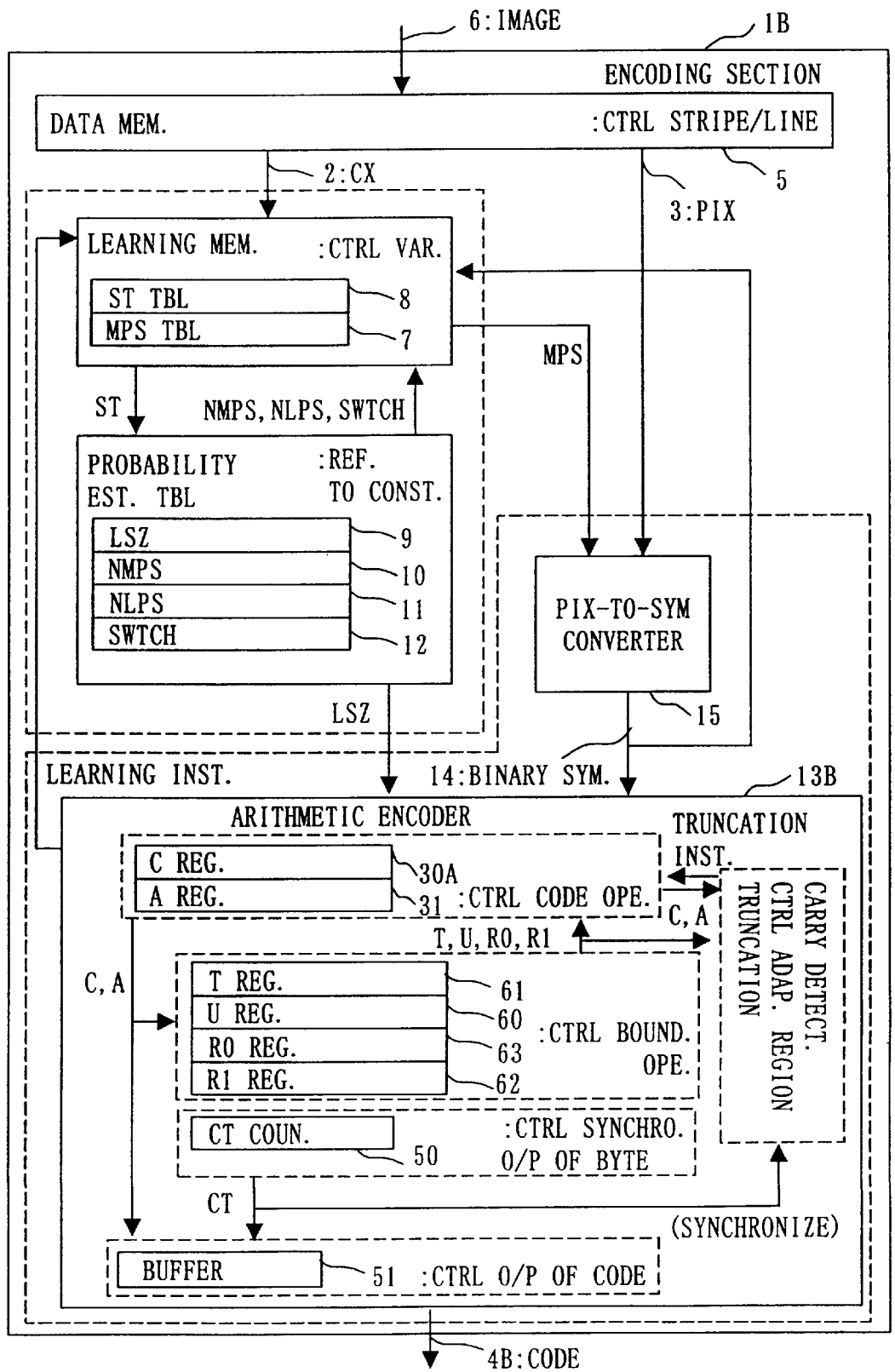
FIG. 64 is a block diagram showing a configuration of an encoder according to the second related art.
Figure 65:
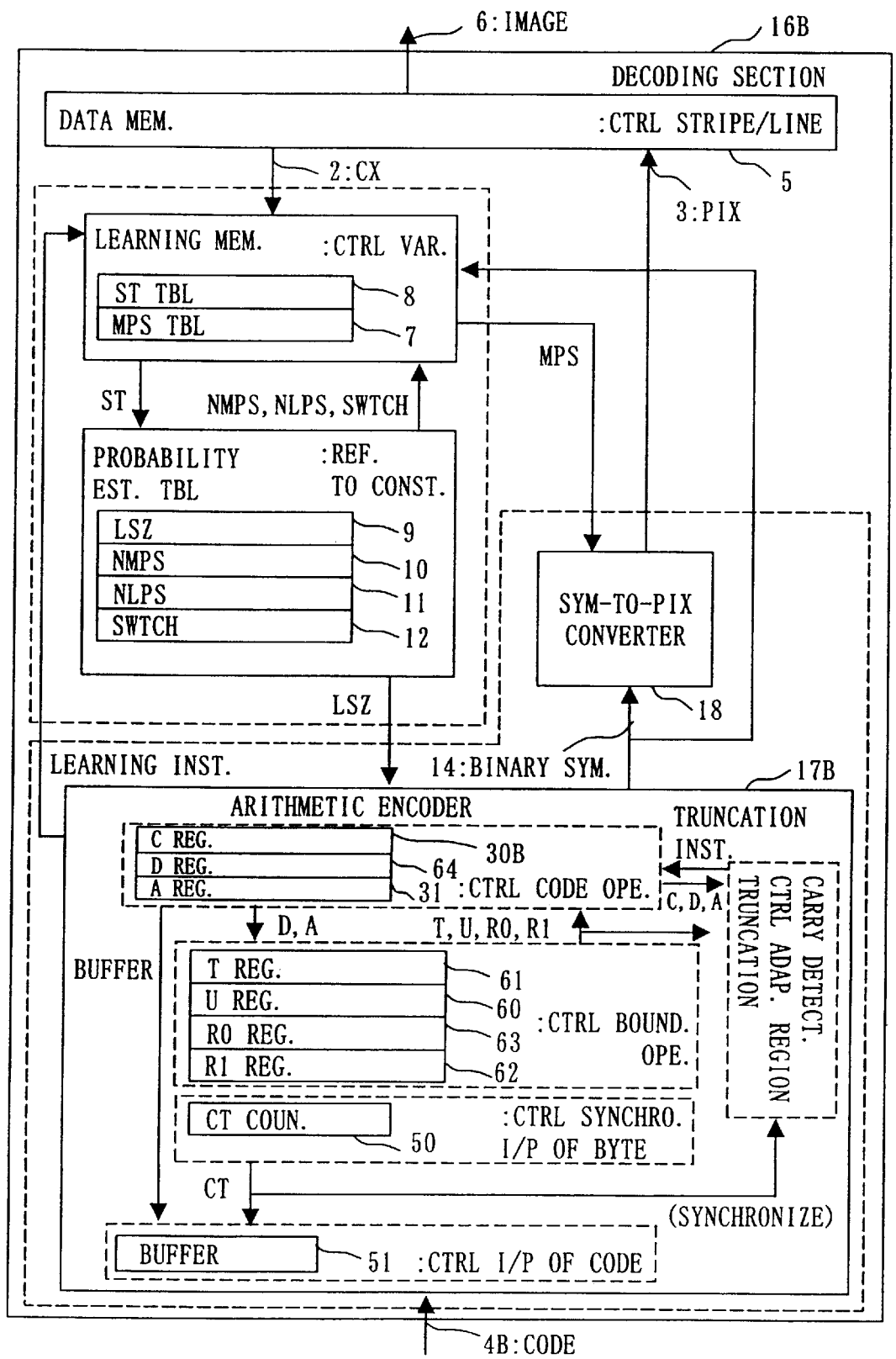
FIG. 65 is a block diagram showing a configuration of a decoder according to the second related art.
Figure 66:
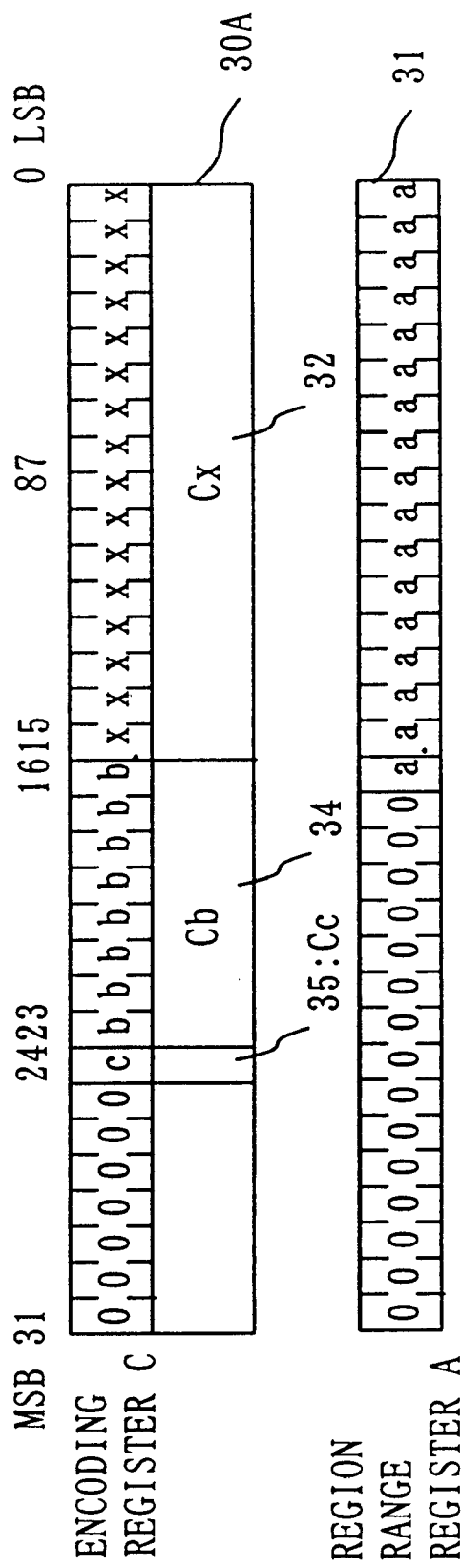
FIG. 66 shows configurations of an encoding register and a region range register in relation to the second related art.
Figure 67:
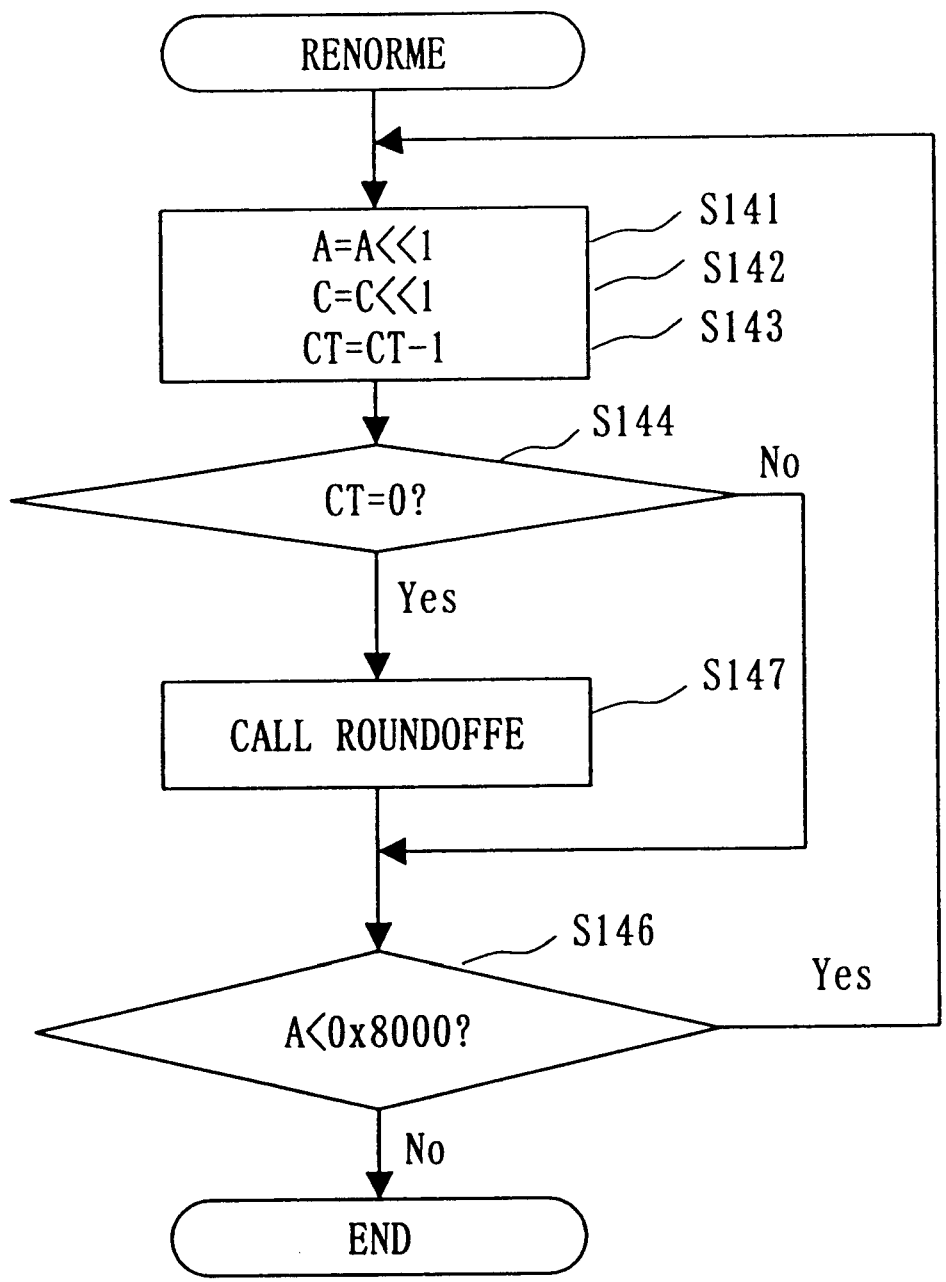
FIG. 67 is a flowchart explaining a RENORME process in relation to the second related art.

As shown in FIG. 2, the encoding section 1C is configured by substituting an arithmetic encoder 13C and a code 4C for the arithmetic encoder 13B and the code 4B included in the corresponding conventional encoding section shown in FIG. 64. Similarly, the decoding section 16C of FIG. 3 differs from FIG. 65 of the second related art by an arithmetic decoder 17C and a code 4C. Data flows among these substituted blocks and learning is implemented in the same way as done in the conventional encoding section and the decoding section shown in FIGS. 64 and 65.

In the arithmetic encoder 13C, the C register 30A and the A register 31 proceed with the encoding operation initiated by inputting the LSZ value 9 and the binary symbol 14. A CT counter 50 controls timing for outputting the code by byte unit. Synchronized with outputting the code, it is detected whether the region includes the carry boundary or not using the T register 61 and the R0 register 63. When the carry boundary is included, the region halving system is applied. Namely, it is forcibly determined if the carry-over occurs or not by modifying the values of the C register 30A and the A register 31, the code is defined by propagating the carry to the BUFFER 51 at maximum, and the code 4C is output.

In the arithmetic decoder 17C, the CT counter 50 controls timing for inputting the code by byte unit using inputs of the LSZ value 9 and the code 4C. Synchronized with inputting the code, it is detected whether the region includes the carry boundary or not using the D register 64, which is reproduced from the encoding register 30A, the T register 61 and the R0 register 63. When the carry boundary is included, the region halving system is applied and the values of the C register 30A, the D register 64, and the A register 31 are modified. Decoding operation is carried out by the C register 30B, the A register 31 and the D register 64 through the BUFFER 51, and a binary symbol 14 is output.

A synchronization detector 101C observes the CT value (updating byte) (FIGS. 2 and 3). On detecting the CT value updated, synchronized with the update of the CT value, the synchronization detector 101C informs a carry boundary detector 102C of the update of the CT value as a predetermined interval.

Then, the carry boundary detector 102C checks whether the carry boundary is included in the effective region or not using the C register, the A register (also the T register and the R0 register). When the carry boundary is included in the effective region, the carry boundary detector 102Cinstructs to halve the effective region and to update the C register and the A register.

A detailed operation within the blocks or among the blocks configured as shown in FIGS. 2 and 3 will be explained using flowcharts of FIGS. 46 through 49, 53, 54, 56, 57, and 59 explaining the above-mentioned first related art, FIGS. 67, 69 through 74, 75 and 76 explaining the second related art, FIGS. 4 through 7 explaining the procedure described below, and FIGS. 4, 6, 8 through 11 explaining the equivalent procedure in another way.

Figure 4:
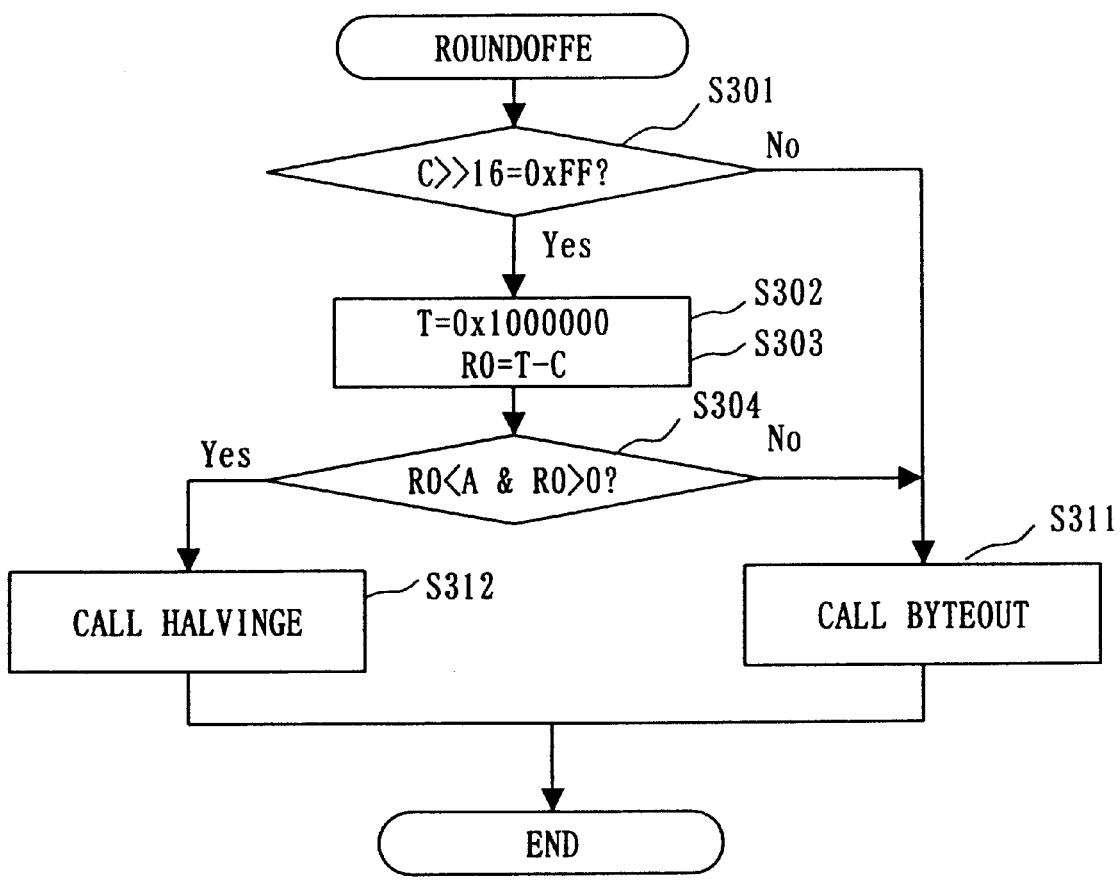
FIG. 4 shows a flowchart explaining a ROUNDOFFE process according to the first embodiment of the invention.
Figure 5:
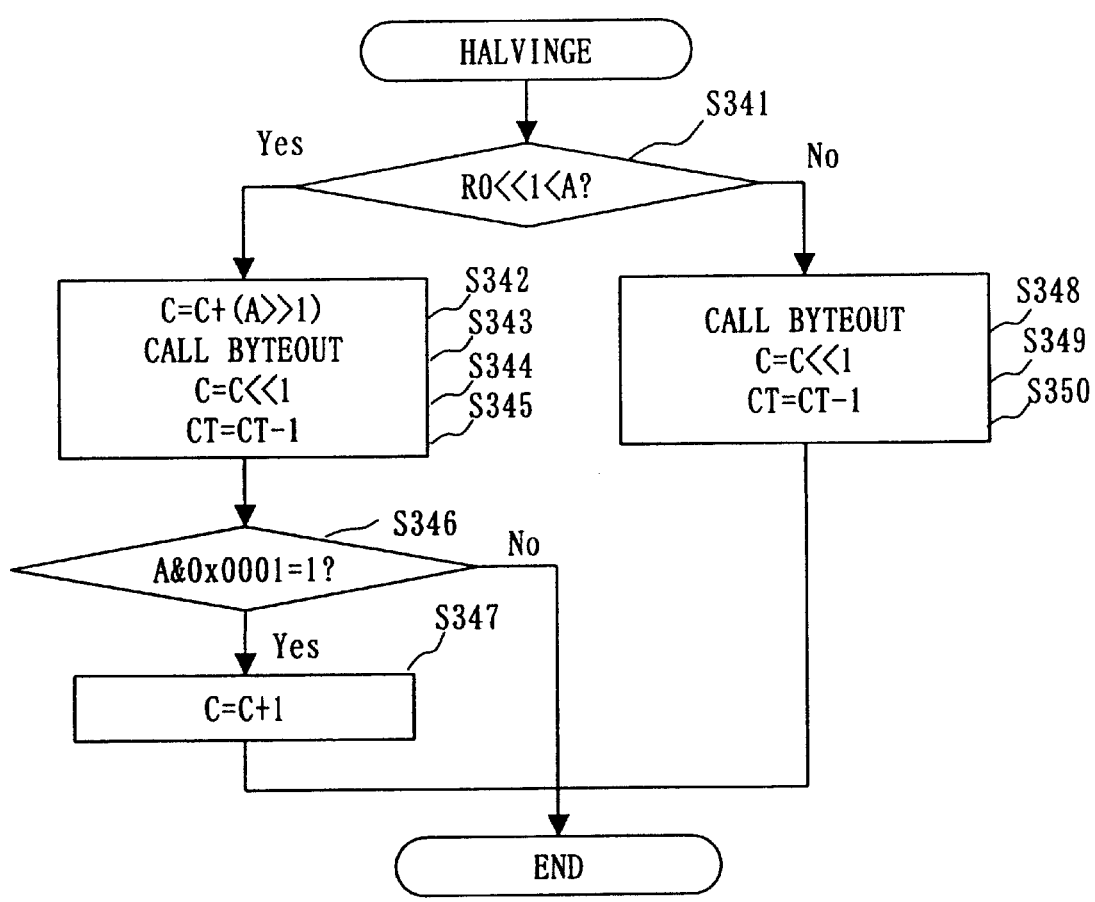
FIG. 5 shows a flowchart explaining a HALVINGE process according to the first embodiment of the invention.
Figure 6:
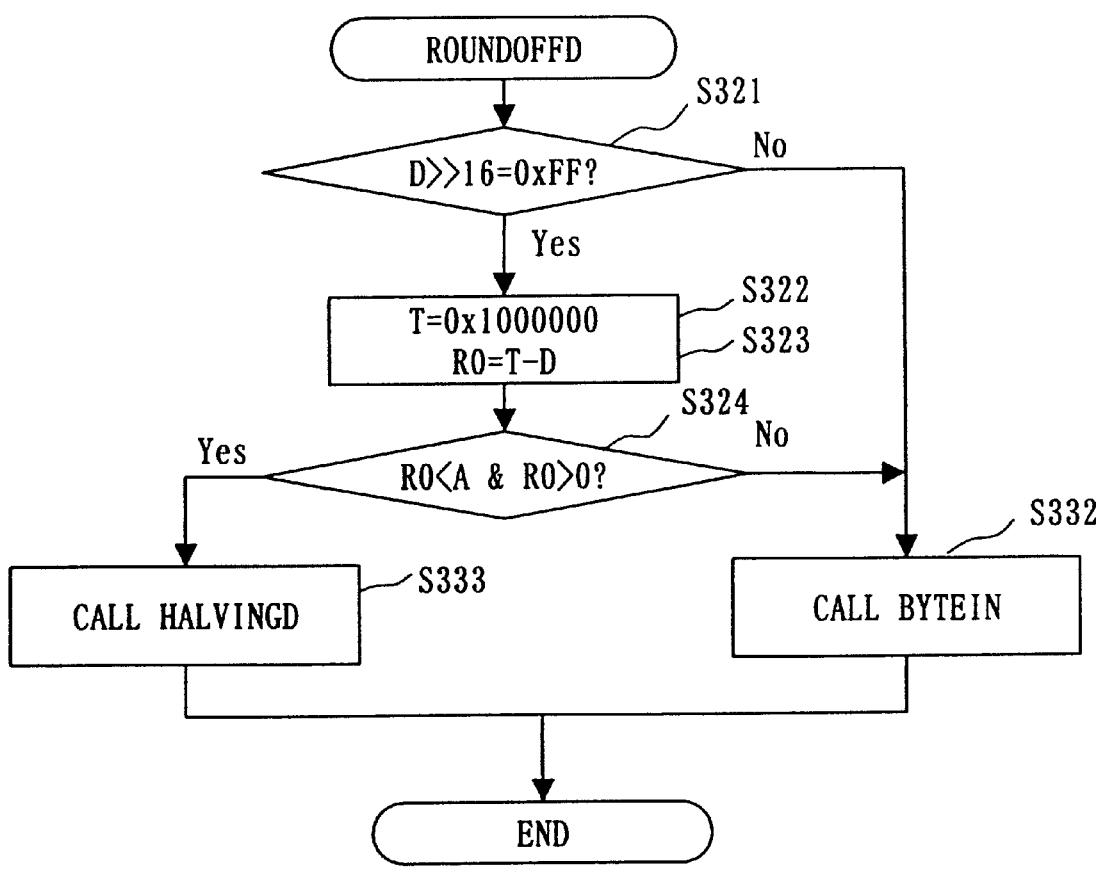
FIG. 6 shows a flowchart explaining a ROUNDOFFD process according to the first embodiment of the invention.
Figure 68:
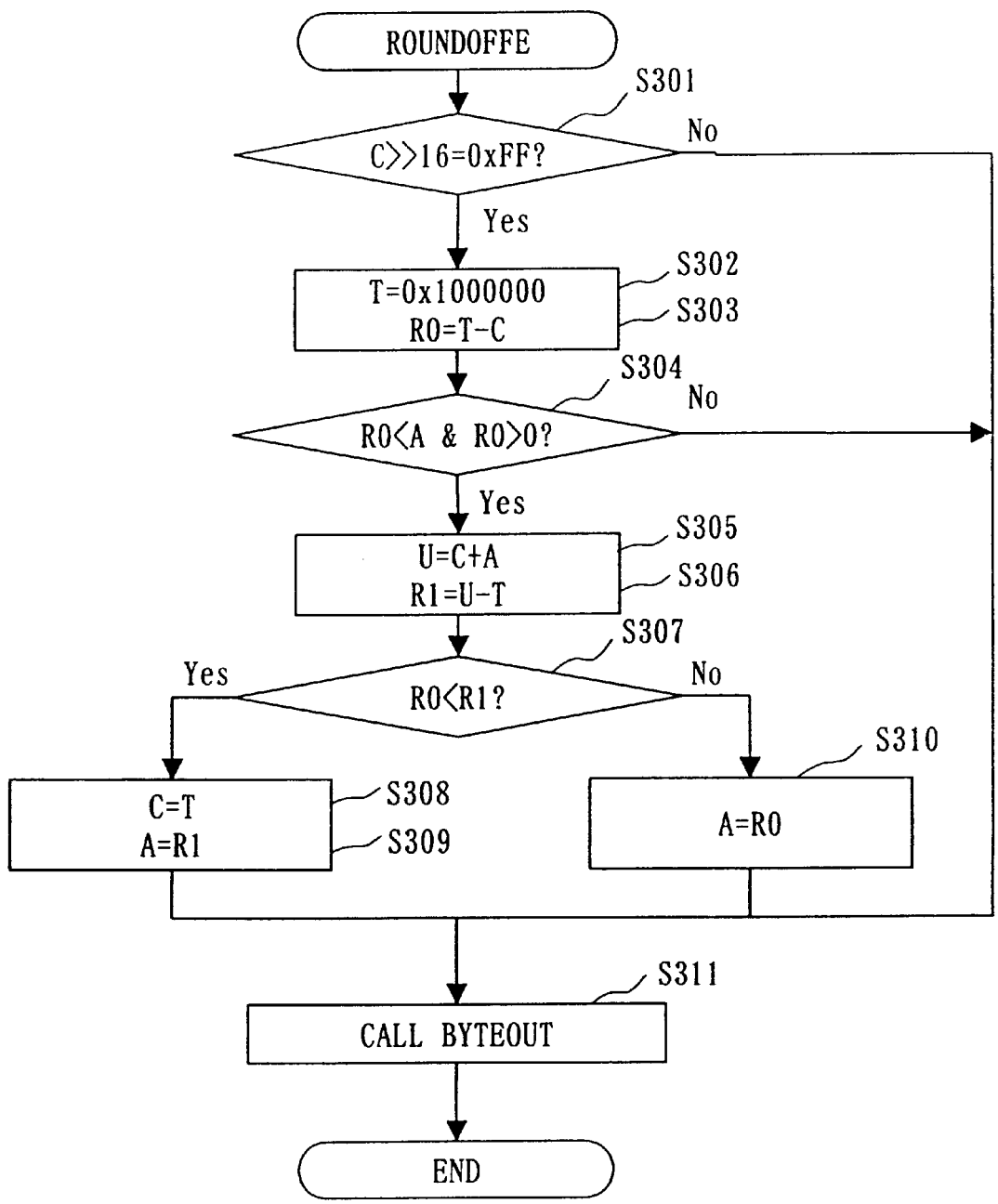
FIG. 68 is a flowchart explaining a ROUNDOFFE process in relation to the second related art.

In the first embodiment, FIG. 68 (flowchart of R0UNDOFFE) and FIG. 74 (flowchart of R0UNDOFFD) showing the truncation process of the carry/carryless region are replaced by FIGS. 4 and 6, respectively. The region halving process according to the present embodiment is implemented by adding FIG. 5 (flowchart of HALVINGE) and FIG. 7 (flowchart of HALVINGD) respectively called within the processes shown in FIGS. 4 and 5.

FIG. 4 is a flowchart explaining R0UNDOFFE process for judging whether the region halving process should be applied or not.

In the figure, step S 301 through S304, and S311 called by the result of steps S301 and S304 (when results in "No") are the same operation with the steps shown in FIG. 68. When step S304 results in "Yes", HALVINGE process for halving the effective region is called at step S312.

FIG. 5 is a flowchart explaining HALVINGE process for halving the effective region.

When twice of the range of the carryless region R0 is smaller than the value of A register 31 at step S341 (results in "Yes"), the lower half region is detected to include the carry boundary. On the contrary, when twice of the carryless region R0 is not smaller than the value of A register 31 (results in "No"), the upper half region is detected to include the carry boundary. These detected half region including the carry boundary is to be truncated. When the lower half region is truncated, at step S342, the value of the C register (lower limit value of the effective region) 30A is updated by adding a half of the value of the A register (effective region) 31, and BYTEOUT process is called at step S343. Though, the value of the A register 31 should be halved according to halving the region, the value is not updated here because the value is to be extended to twice soon by the renormalization. Processes of steps S344 and S345 corresponding to the renormalization are operated on the C register 30A and the value of the CT counter 50. At step S346, it is checked if the value of the A register 31 is odd or not. When the value of the A register 31 is detected to be odd, the bit lost by halving the value of the A register 31 is compensated at step S347. In case the upper half region is truncated, the value of the C register 30A is not updated, and at step S348, BYTEOUT process is called. Processes of steps S349 and S350 corresponding to the renormalization are operated on the C register 30A and the value of the CT counter 50.

FIG. 6 is a flowchart explaining R0UNDOFFD process for judging whether the region halving process should be applied or not.

In the figure, steps S321 through S324, and S332 called by the result of steps S321 and S324 (when both of the steps result in "No") are the same operation with the steps shown in FIG. 74. When step S324 results in "Yes", HALVINGD process is called at step S333 for halving the region.

Figure 7:
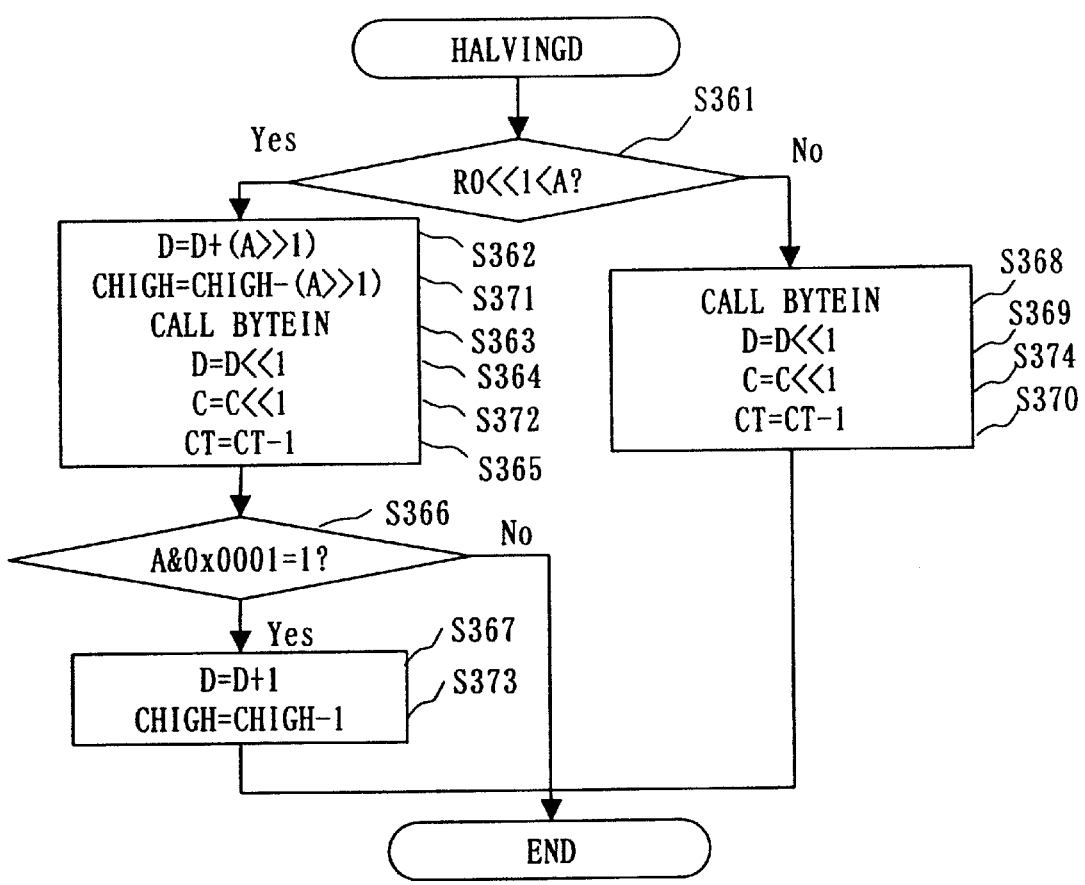
FIG. 7 shows a flowchart explaining a HALVINGD process according to the first embodiment of the invention.

FIG. 7 is a flowchart explaining HALVINGD process for halving the effective region.

Compared with HALVINGE process shown in FIG. 5, FIG. 7 specifies the variable D64 instead of the variable C30A of the encoding register. Steps S361 through S370 correspond to steps S341 through S350. Steps S371, S372, S373 and S374 are added for halving the region on the encoding register C30B of the decoder corresponding to the encoding register 30A of the encoder (register D64). Finally, at step S368, BYTEIN process is called instead of BYTEOUT process called at S311 in FIG. 68.

Figure 8:
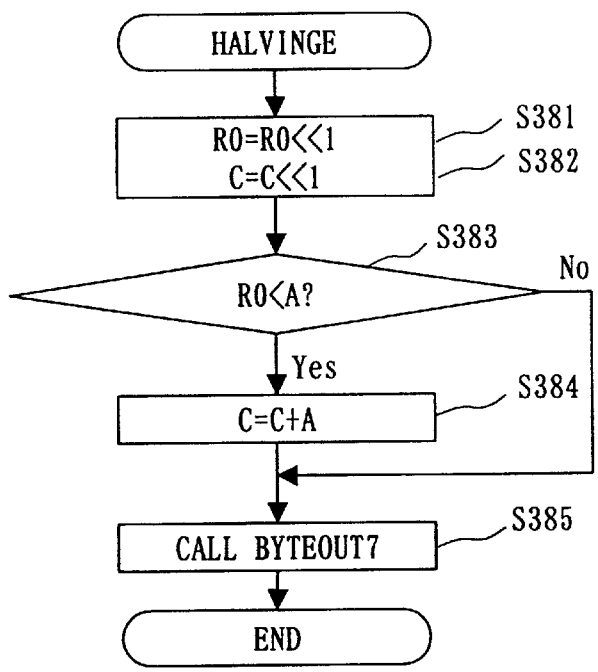
FIG. 8 shows a flowchart explaining a HALVINGE process according to the first embodiment of the invention.
Figure 9:
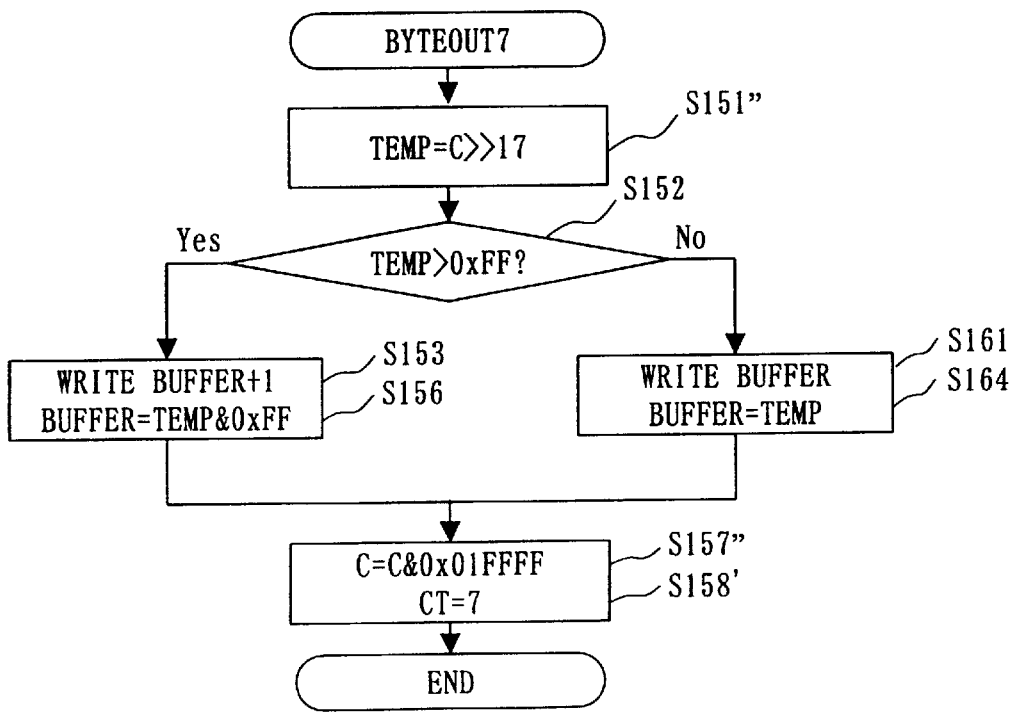
FIG. 9 shows a flowchart explaining a BYTEOUT7 process according to the first embodiment of the invention.
Figure 10:
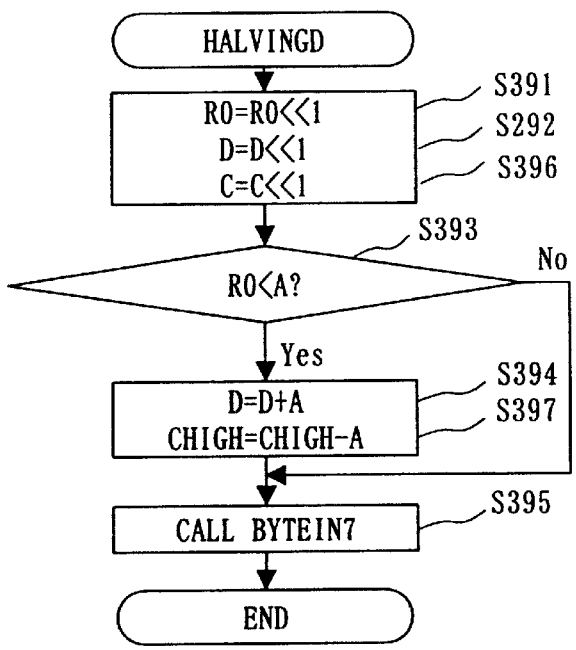
FIG. 10 shows a flowchart explaining a HALVINGD process according to the first embodiment of the invention.
Figure 11:
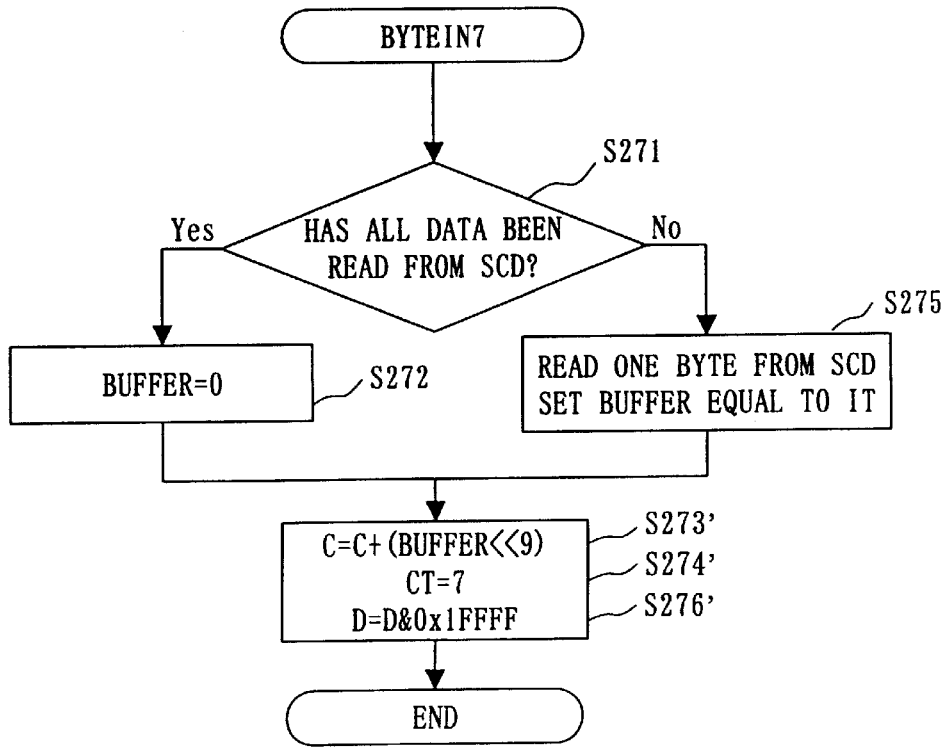
FIG. 11 shows a flowchart explaining a BYTEIN7 process according to the first embodiment of the invention.
Figure 69:
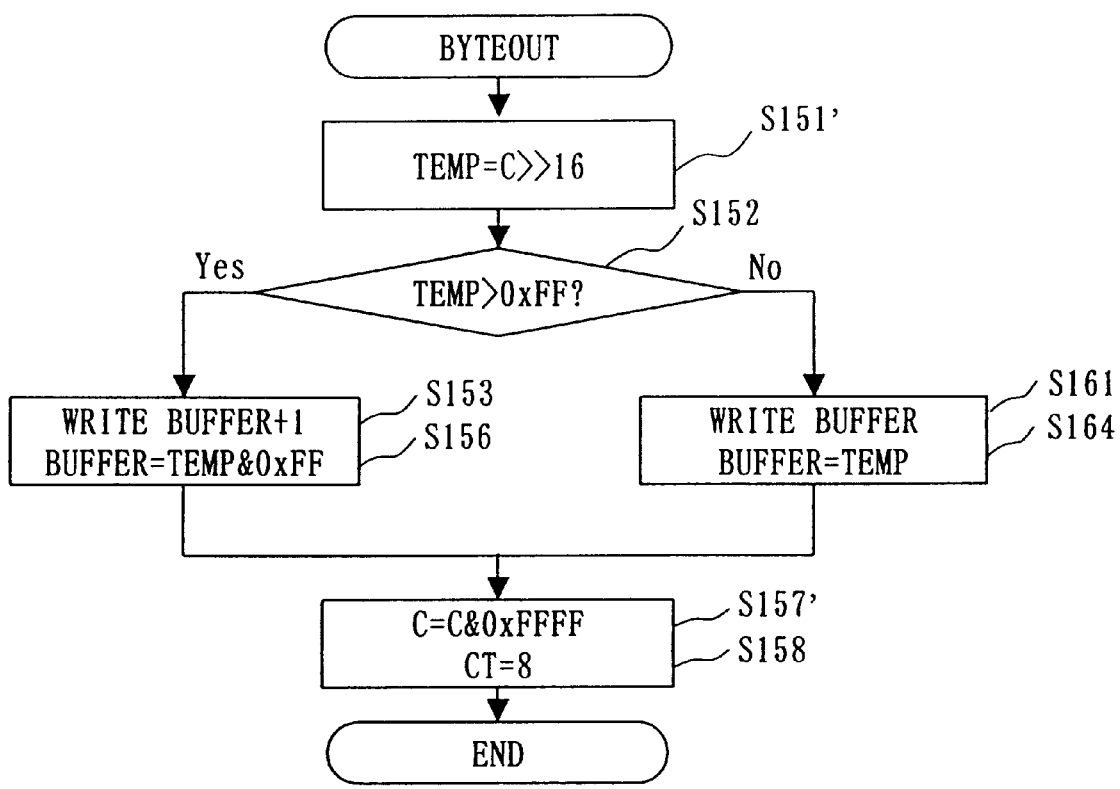
FIG. 69 is a flowchart explaining a BYTEOUT process in relation to he second related art.
Figure 70:
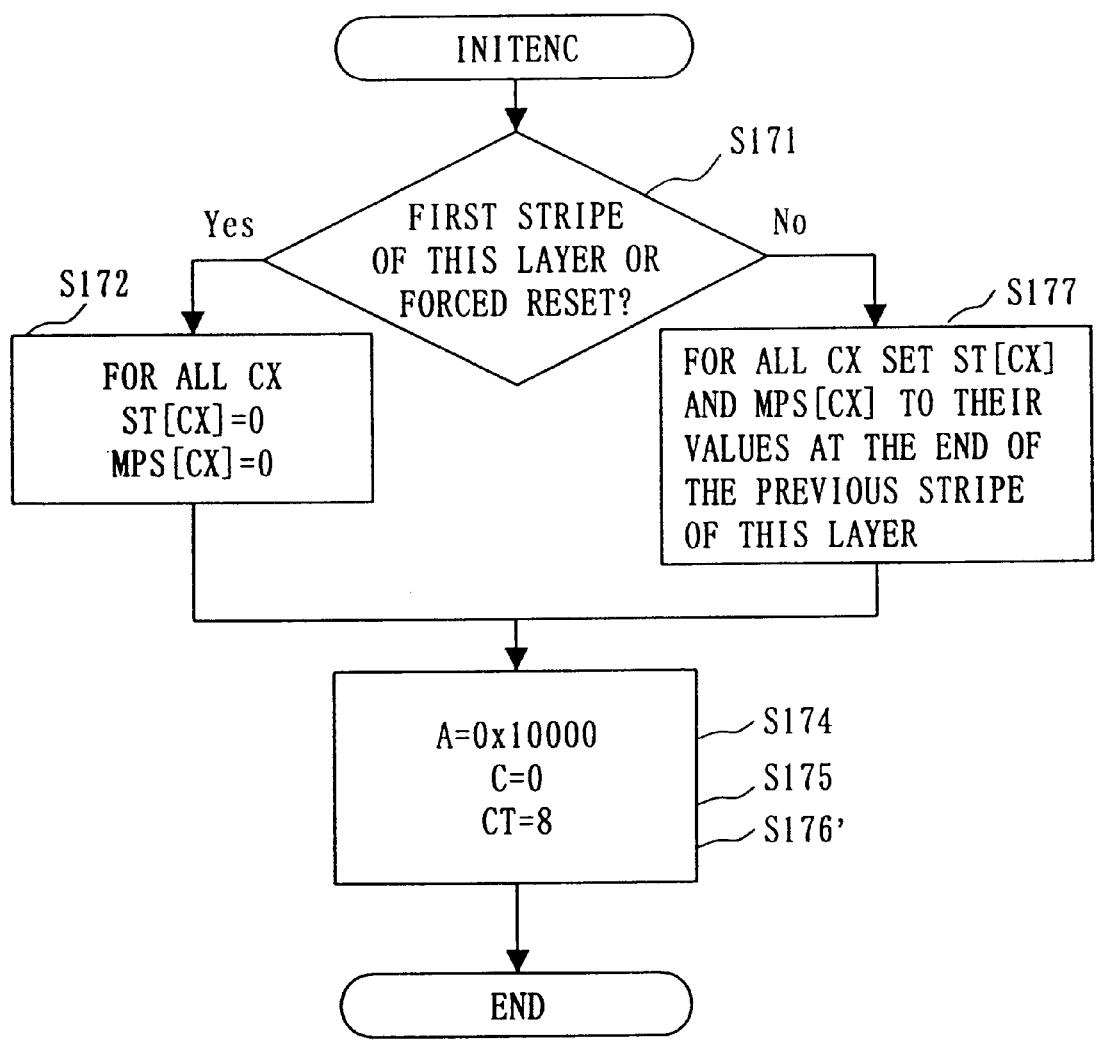
FIG. 70 is a flowchart explaining an INITENC process in relation to the second related art.
Figure 71:
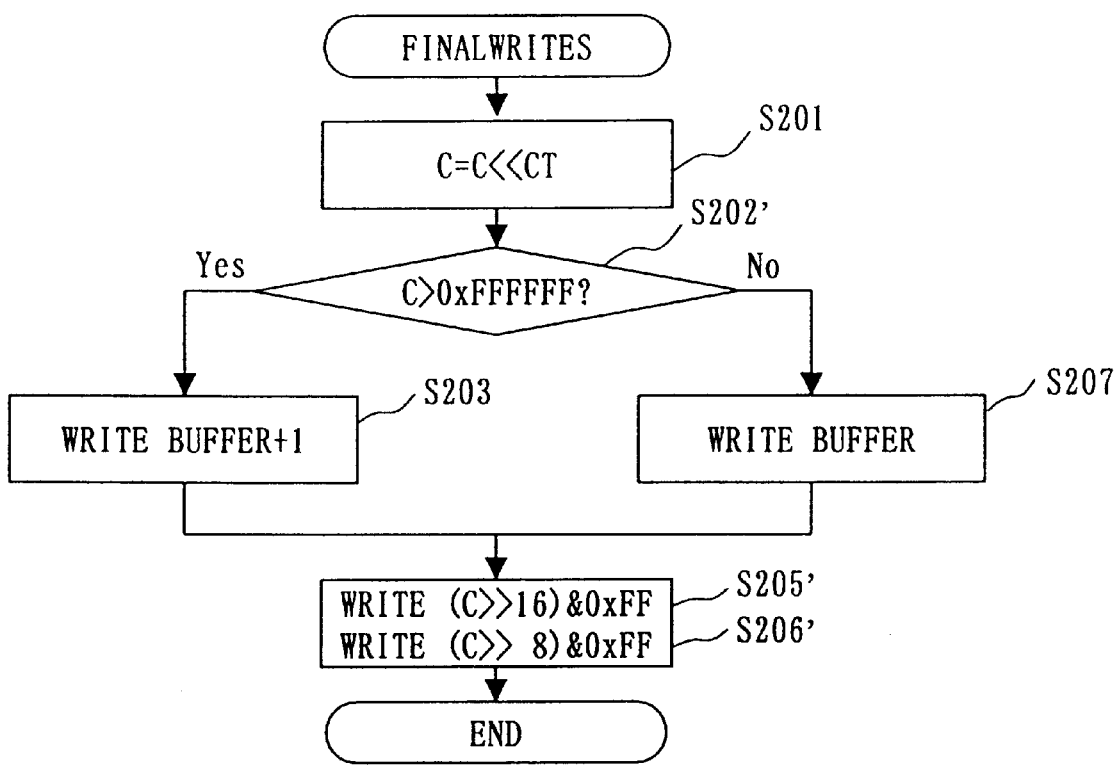
FIG. 71 is a flowchart explaining a FINALWRITES process in relation to the second related art.
Figure 72:
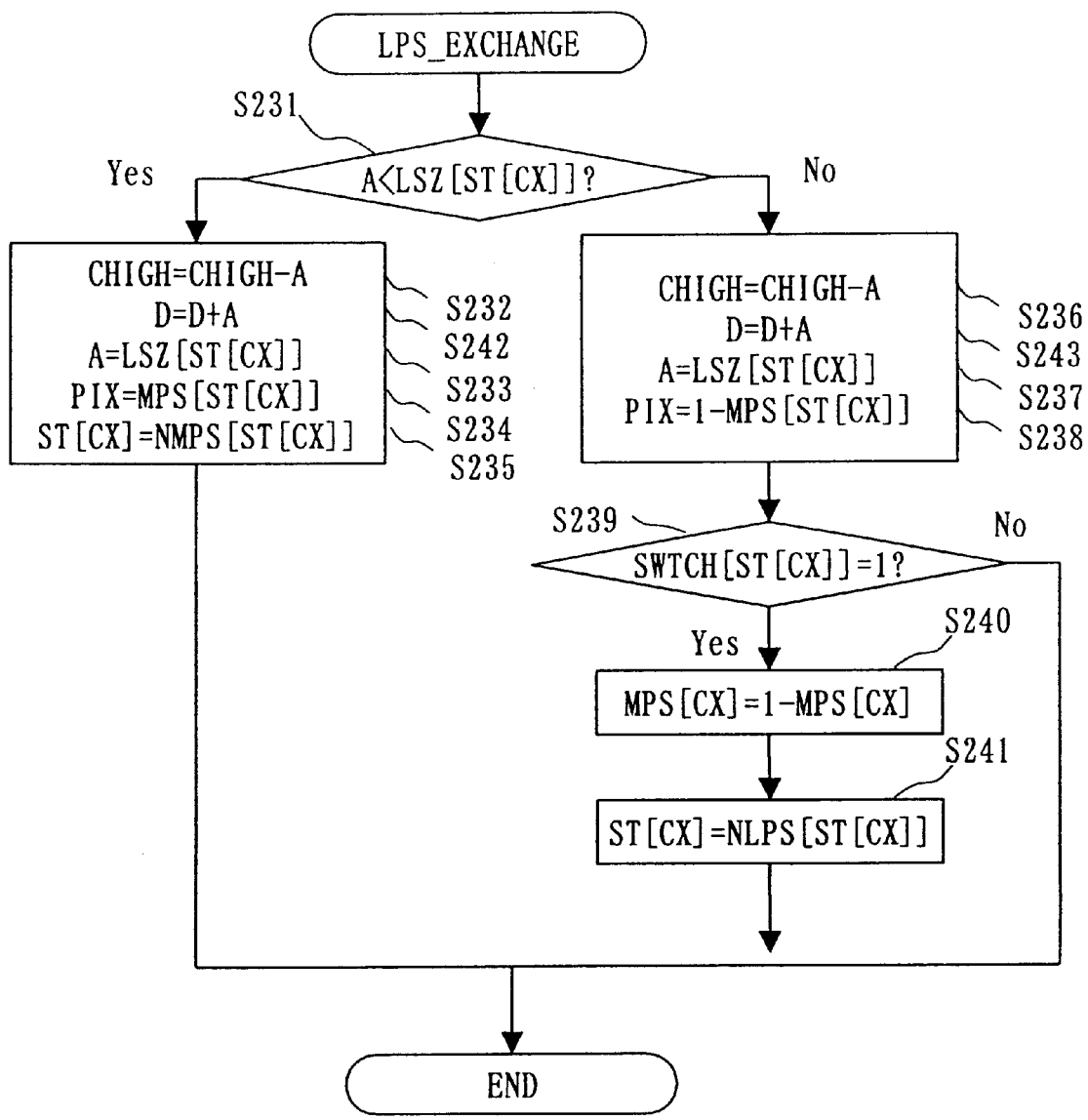
FIG. 72 is a flowchart explaining an LPS_EXCHANGE process in relation to the second related art.
Figure 73:
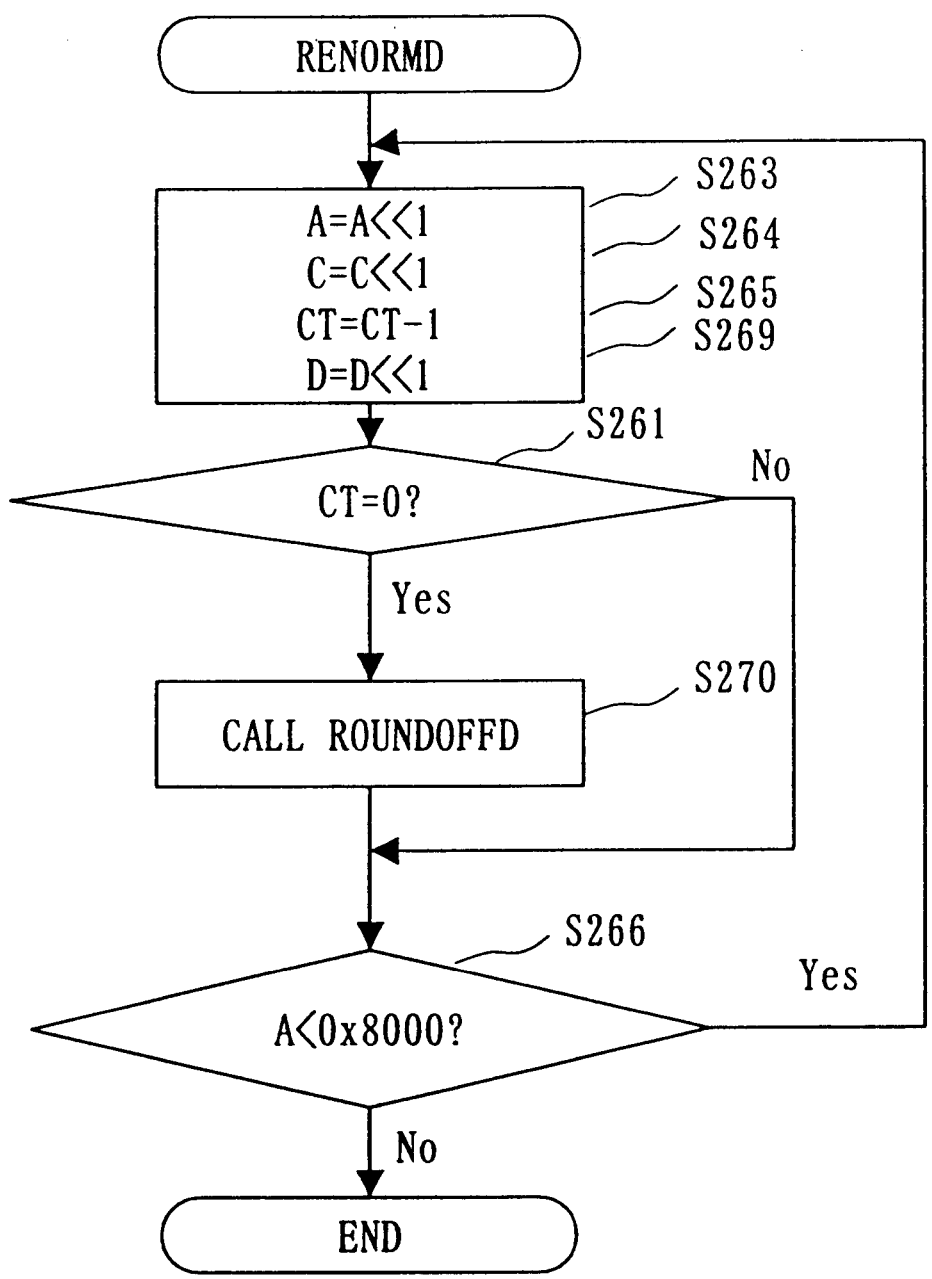
FIG. 73 is a flowchart explaining a RENORMD process in relation to the second related art.

The flowcharts of FIG. 5 explaining HALVINGE process and FIG. 7 explaining HALVINGD process as well as FIG. 69 explaining BYTEOUT process called in HALVINGE and FIG. 75 explaining BYTEIN process called in HALVINGD can be replaced with the flowcharts of FIG. 8 explaining HALVINGE process, FIG. 9 explaining BYTEOUT7 process, FIG. 10 explaining HALVINGD process, and FIG. 11 explaining BYTEIN7 process. In the flowcharts explaining BYTEOUT7 process and BYTEIN7 process, the value of the A register (region range) 31 is not halved, but the value of the C register 30B is previously extended to twice to prevent overflow. Accordingly, inputting/outputting position of byte is shifted to the higher order by one bit from the normal position indicated in flowcharts of BYTEOUT process and of BYTEIN process. In particular, the encoder is required to guarantee the precision with one more bit in the higher order.

FIG. 8 is a flowchart explaining HALVINGE process for halving the effective region.

At steps S381 and S382, the value of the C register 30A and the value of the R0 register 63 are respectively extended to twice for previously performing a process corresponding to the renormalization. At step S383, it is checked if the value of the carryless region R0 register 63 is smaller than the value of the A register 31. When step S383 results in "Yes", the lower half region includes the carry boundary and on the contrary, when step S383 results in "No", the upper half region includes the carry boundary. When the lower half region is truncated (results in "Yes"), at step S384, the value of the C register 30A (the lower limit value of the effective region) is updated by adding the value of the A register 31 (the range of the effective region). In this processing flow, extension of the region to twice (renormalization), which is essentially to be performed directly after BYTEOUT process, has been previously performed, so that at step S385, BYTEOUT7 process is called instead of BYTEOUT process before outputting the code byte.

FIG. 9 is a flowchart explaining BYTEOUT7 process in detail.

This BYTEOUT7 process is different. from FIG. 69 (flowchart explaining BYTEOUT process) by the following: Steps S151" and S157" are modified from steps S151' and S157' because the position of outputting the code is shifted by one bit to the higher order. Step S158' is modified from step S158 because the process corresponding to the renormalization has already been performed at step S382 in FIG. 8.

FIG. 10 is a flowchart explaining HALVINGD process for halving the effective region. Compared with HALVINGE process shown in FIG. 8, FIG. specifies the variable D64 instead of the variable C30A in the encoding register. Processes of steps S391 through S395 correspond to processes of steps S381 through S385. Steps S396, S397 are added for operating the process corresponding to the encoding register 30A of the encoder (reproduced as the register D64) on the encoding register C30B of the decoder. Finally, at step S395, BYTEIN7 process is called instead of BYTE-OUT7 process called at step S385 in FIG. 8.

FIG. 11 is a flowchart explaining BYTEIN7 process in detail

This BYTEIN7 process is different from FIG. 75 (flowchart of BYTEIN) by the following: Steps S273' and S276' are modified from steps S273 and S276 because the position of inputting the code is shifted by one bit to the higher order. Step S274' is modified from step S274 because the process corresponding to the renormalization has been already performed at steps S392, S396 in FIG. 10.

As has been described, according to the first embodiment, it is sufficient to detect which half region includes the carry boundary for halving the region, so that the carry region range R162 (the value of the R1 register 62) is not required to be calculated.

Embodiment 2

In the QM-Coder as described in the above first related art, the code which has been output, but has not been determined the code value waits at the variable BUFFER 51 and the SC counter 52. In this case, however, depending on the specification of the encoder, the SC counter 52 might overflow during the encoding process. As a result, the code might lose code byte (0xFF or 0x00) by the maximum number of the counter at each overflow, which prevents outputting the correct code.

Generally, the final image size is not always previously known, however, it is possible to estimate the code amount in a worst case when encoding is implemented by a unit of stripe (or line) divided by finite size. In the arithmetic encoding, it is known the code size of the worst case is approximately a little more than one bit. Accordingly, the specification of the counter 52 to be prepared for the size of divided stripes (or lines) can be previously determined, and it is sufficient for the counter 52 to count the run of twice of the code byte 0xFF. In the present second embodiment, at each end of the stripe the code byte which has been waiting for outputting is forcibly determined and flushed. Because of this, the maximum delay time for determining the code can be estimated as processing time of encoding stripes. The region halving system is applied for determining method of the code byte.

In the adaptive region truncation system as described in the second related art, it is possible to sequentially output the code after only the code of one byte waits for outputting. However, the position of the carry boundary should be calculated precisely within the effective region so that the loss of code length should be minimized due to the region truncation. Therefore, the decoder cannot decode the code without the encoding register 30A reproduced from the encoding register included in the encoder. Further, to implement the adaptive region truncation process should be synchronized with inputting/outputting the byte from the encoder or the decoder due to the elimination of the Cs register 33, or otherwise, the exclusive synchronization means should be provided. Detection of such as synchronization may increase the load of encoding/decoding. To synchronize the encoder with the decoder without eliminating the Cs register 33, for example, the encoder includes a counter with renormalized shifting number as the above exclusive synchronization means so that each eight bits (multiples of eight) is assumed to be a synchronization timing, or in another way, the counter is reproduced from the CT counter 50 in the decoder.

In the second embodiment of the present invention, the limitation of the synchronization due to including/excluding the Cs register 33 can be resolved by implementing the region halving process at the timing of finishing the stripe. Further, independent from the value of the code byte output from the C register 30A, and even if the carry boundary is not included in the effective region, the region halving is always implemented. Therefore, the decoder does not need to include the encoding register reproduced from the encoding register 30A in the encoder, and the decoding can be performed without precise calculation of the carry boundary only by truncating the upper or lower half region which is not indicated by the value of the C register 30B.

Here, the encoder determines the half region to be truncated as described above and updates the effective region. This process can be considered as encoding a dummy symbol. The decoder updates the effective region with the half region indicated by the encoding register, which can be considered as decoding the dummy symbol. Therefore, the symbol can be ignored when the effective region is updated by either of the upper half region and the lower half region.

In the region halving according to the second embodiment, the code with one bit can be generated by the region halving even if the encoding process of the stripe does not generate the code bit. Therefore, encoding eight stripes can output the code with one byte at worst, while the overflow of the SC counter 52 is suspected. The time required for the above process can be the estimated delay time at maximum for determining the code.

Figure 12:
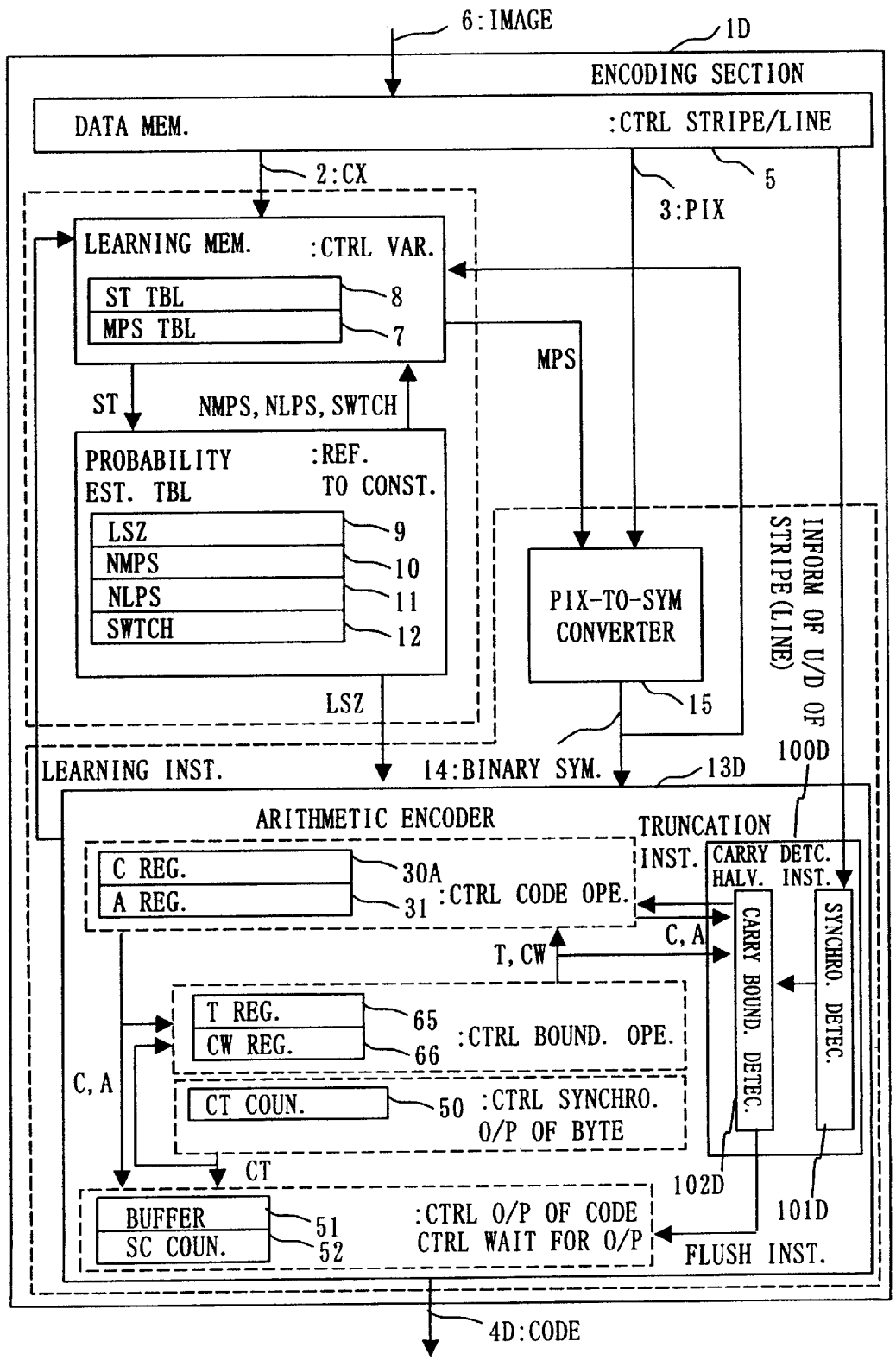
FIG. 12 is a block diagram showing a configuration of an encoding section according to the second embodiment of the invention.
Figure 13:
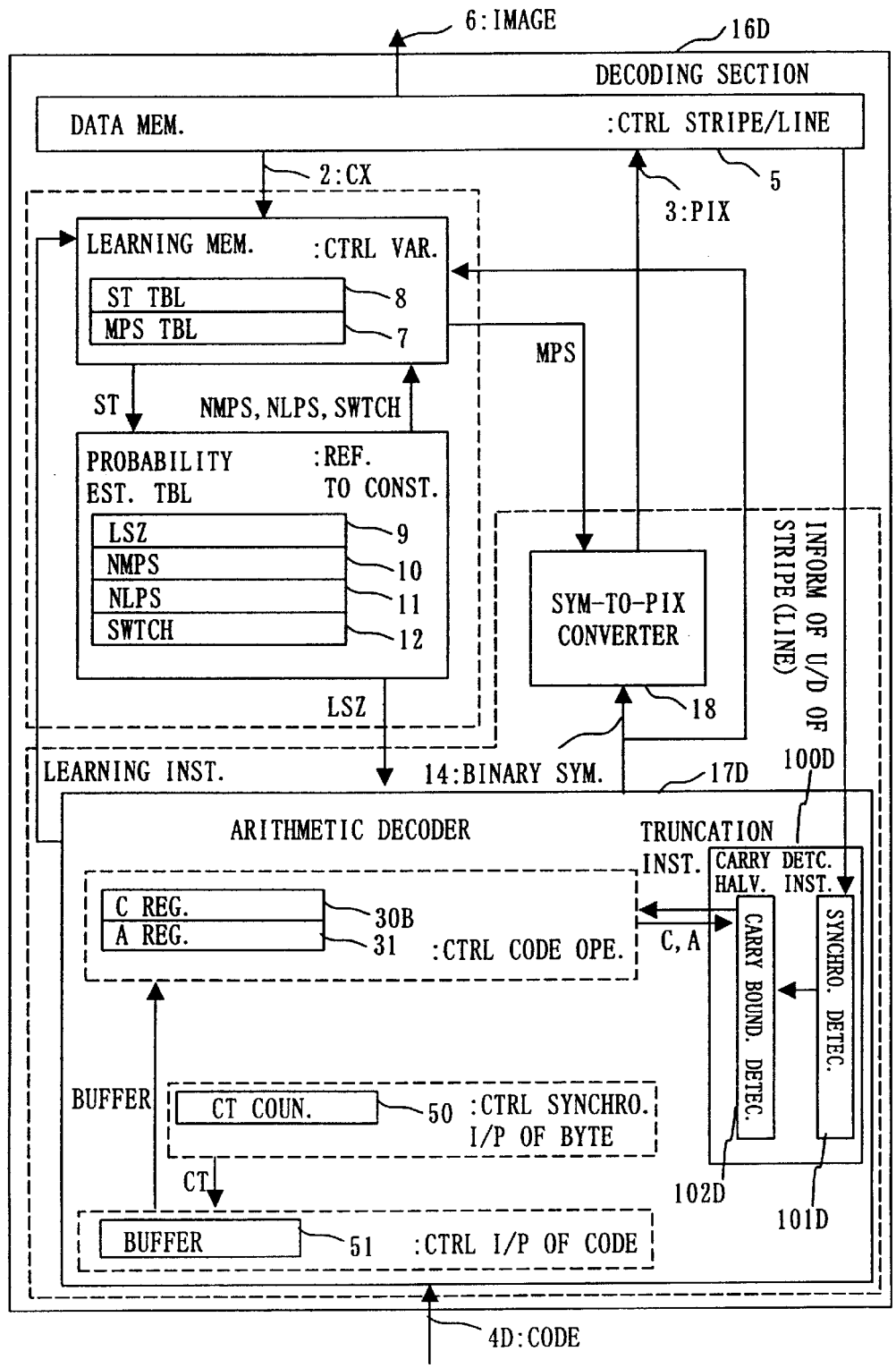
FIG. 13 is a block diagram showing a configuration of a decoding section according to the second embodiment of the invention.

FIGS. 12 and 13 respectively show general configurations of an encoding section 1C of the arithmetic encoder and a decoding section 16C of the arithmetic decoder which employ region halving system.

Figure 39:
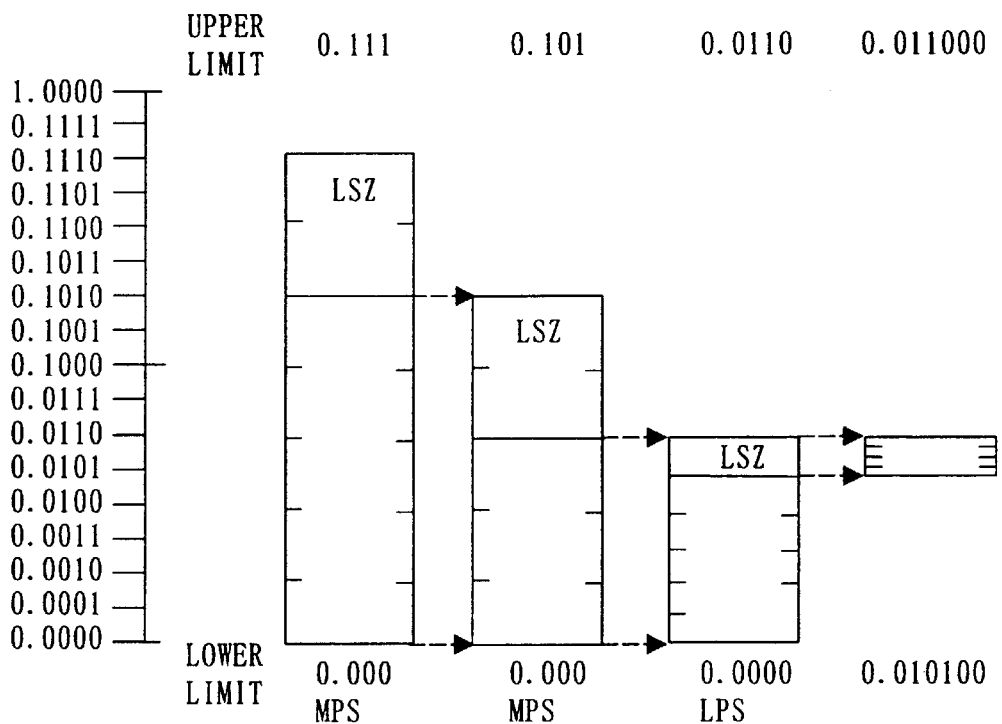
FIG. 39 explains a concept of the conventional arithmetic encoding.
Figure 40:
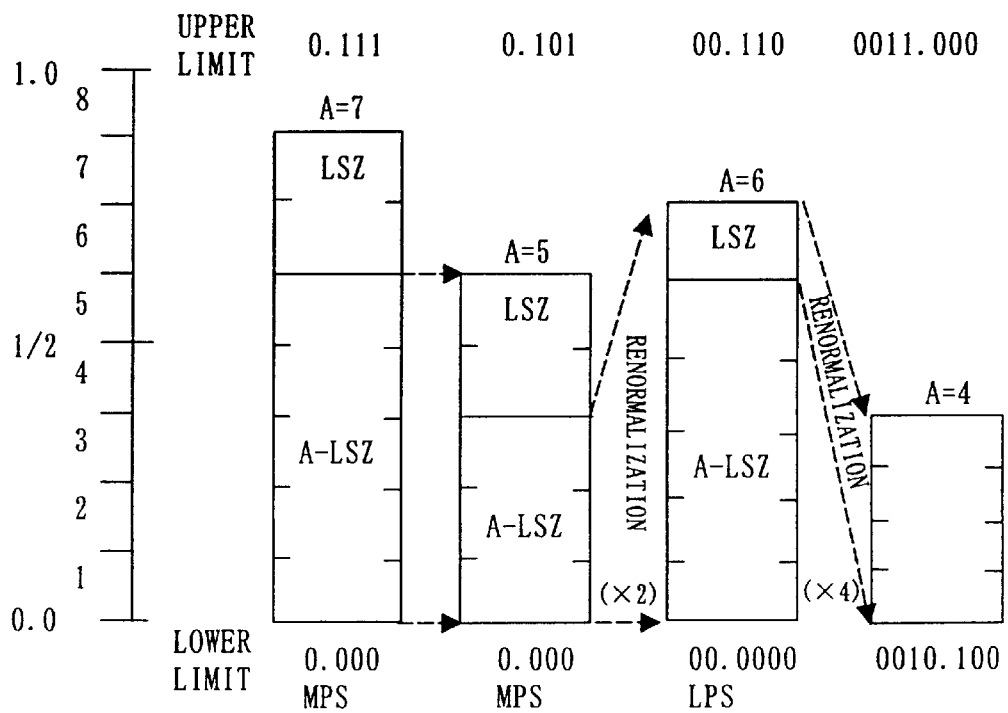
FIG. 40 explains the conventional renormalization for flushing higher order bit to an integer part by keeping the decimals with precision of region division.
Figure 41:
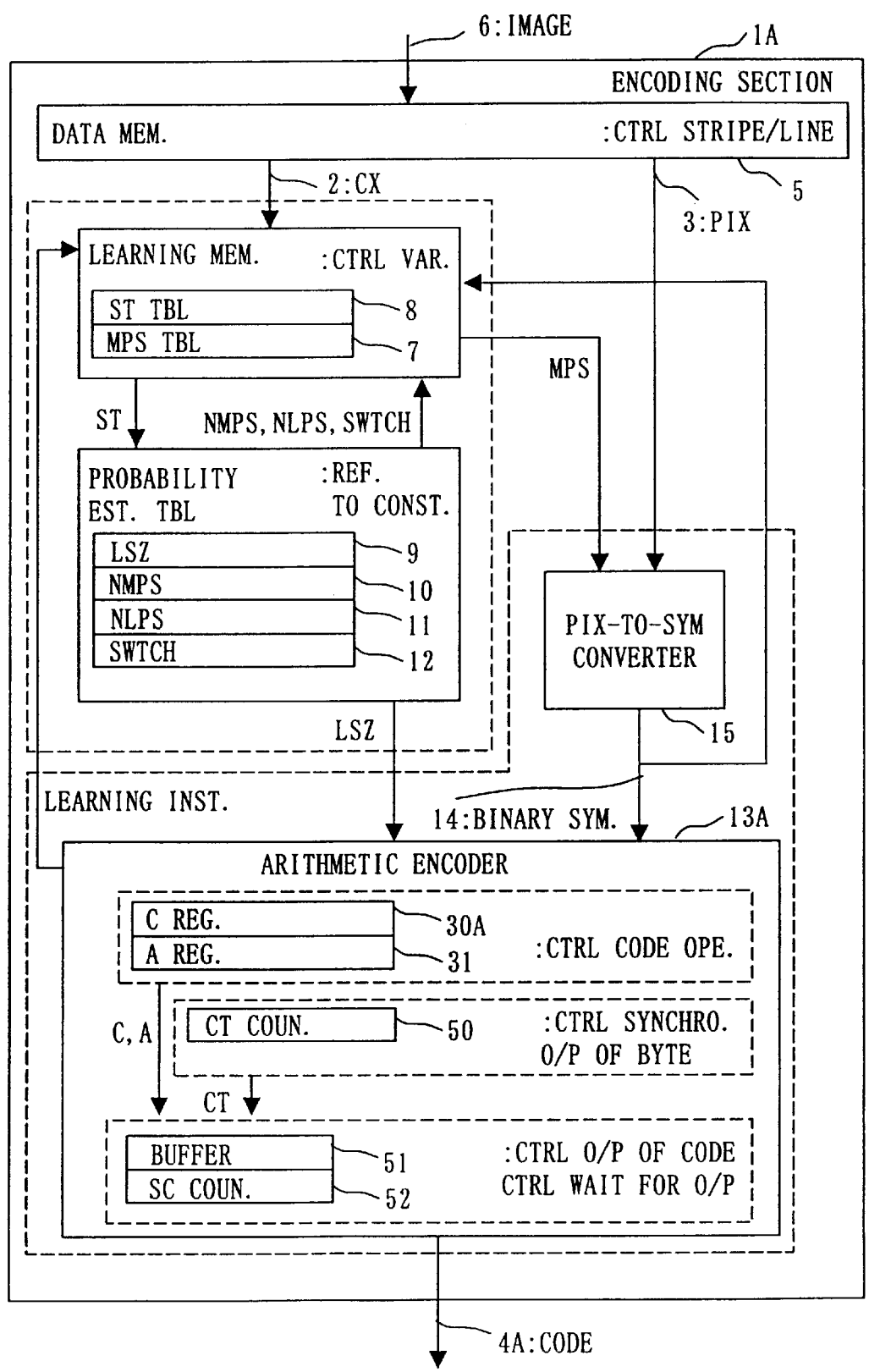
FIG. 41 is a block diagram showing a configuration of an encoder according to the first related art.
Figure 42:
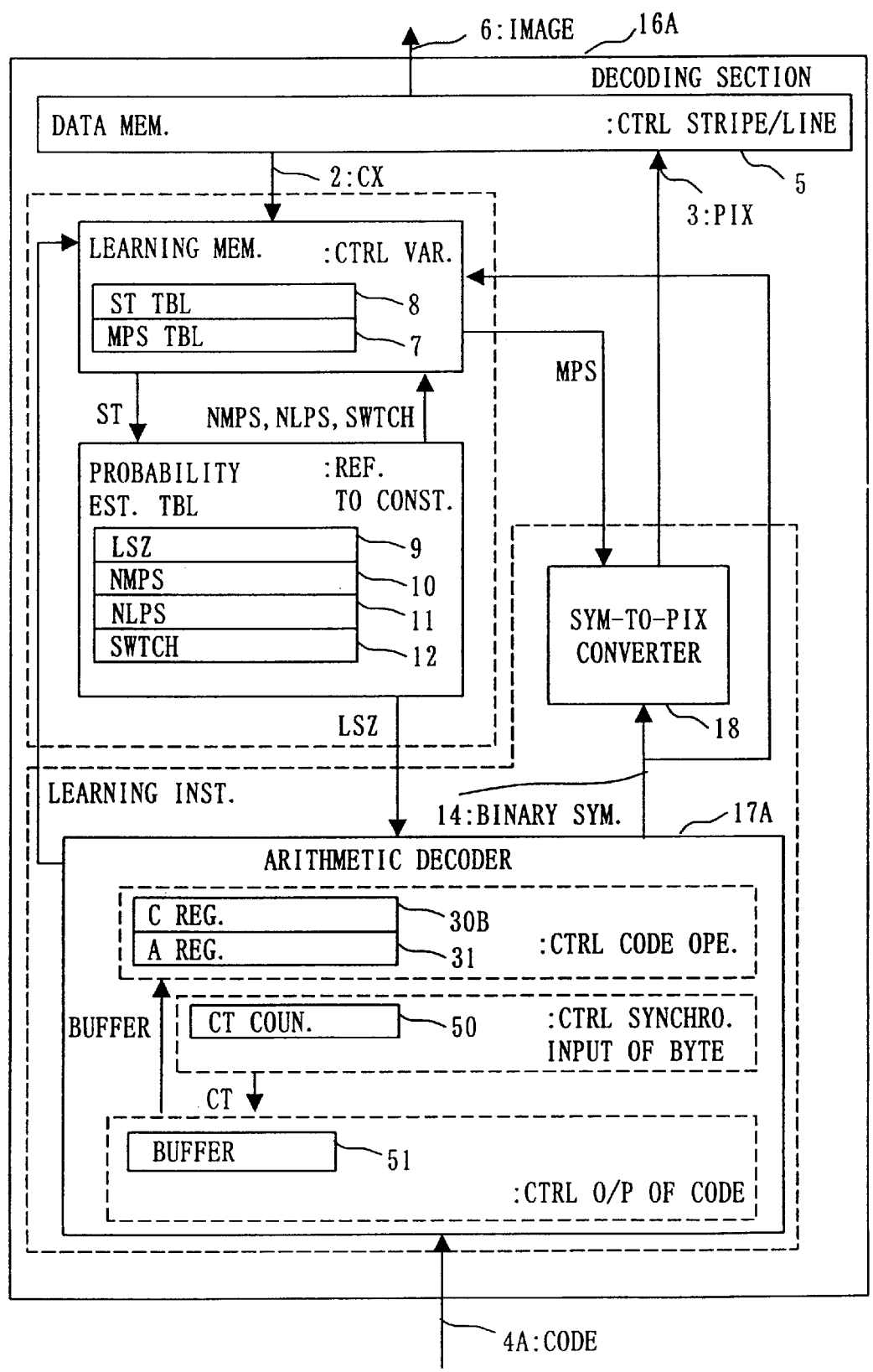
FIG. 42 is a block diagram showing a configuration of a decoder according to the first related art.

As shown in FIG. 12, the encoding section 1D is configured by substituting an arithmetic encoder 13D and a code 4D for the arithmetic encoder 13B and the code 4B included in the corresponding conventional encoding section shown in FIG. 64. Similarly, the decoding section 16D of FIG. 13 differs from FIG. 40 of the first related art by an arithmetic decoder 17D and a code 4D. Data flows among these substituted blocks and learning is implemented in the same way as performed in the conventional encoding section and the decoding section according to the first related art and shown in FIGS. 39 and 40.

In the arithmetic encoder 13D, the C register 30A and the A register 31 proceed with the encoding operation initiated by inputting the LSZ value 9 and the binary symbol 14. The CT counter 50 controls timing for outputting the code by byte unit. As well as the first related art, the BUFFER 51 and the SC counter make the undetermined code having a possibility of the carry-over wait and output the determined code 4D. Synchronized with detection of the end of line (or the end of stripe), it is detected whether the region includes the carry boundary or not using the T register 65 and the CW register 66. When the carry boundary is detected to be included, the region halving system is applied. Namely, it is forcibly determined whether the carry-over occurs or not by modifying the C register 30A and the A register 31, the code is defined by propagating the carry to the BUFFER 51 at maximum, and the code 4D is output.

In the arithmetic decoder 17D, the CT counter 50 controls timing for inputting the code by byte unit using the LSZ value 9 and input of the code 4D. Decoding operation is carried out by the C register 30B and the A register 31 through the BUFFER 51, and the binary symbol 14 is output. Then, synchronized with the detection of the end of line (or the end of stripe), the C register 30B and the A register 31 are modified by applying the region halving to truncate the half region which is not indicated by the C register 30B.

A synchronization detector 101D observes the update of the stripe (or line) (FIGS. 12 and 13). On detecting the stripe updated, synchronized with the update of the stripe, the synchronization detector 101D informs a carry boundary detector 102D of the update of the stripe as a predetermined value.

Then, the carry boundary detector 102D checks if the carry boundary is included in the effective region or not using the C register, the A register (also the T register and the R0 register). When the carry boundary is included in the effective region, and the carry boundary detector 102D instructs to halve the effective region and to update the C register and the A register.

A detailed operation within the blocks or among the blocks configured as shown in FIGS. 12 and 13 will be explained using flowcharts of FIGS. 47 through 55, 57 through 62 explaining the above-mentioned first related art, and FIGS. 14 through 19 explaining the procedure described below. In the second embodiment, FIGS. 14 and 18 show the cases in which the region halving is implemented on detecting the end of stripe.

Figure 45:
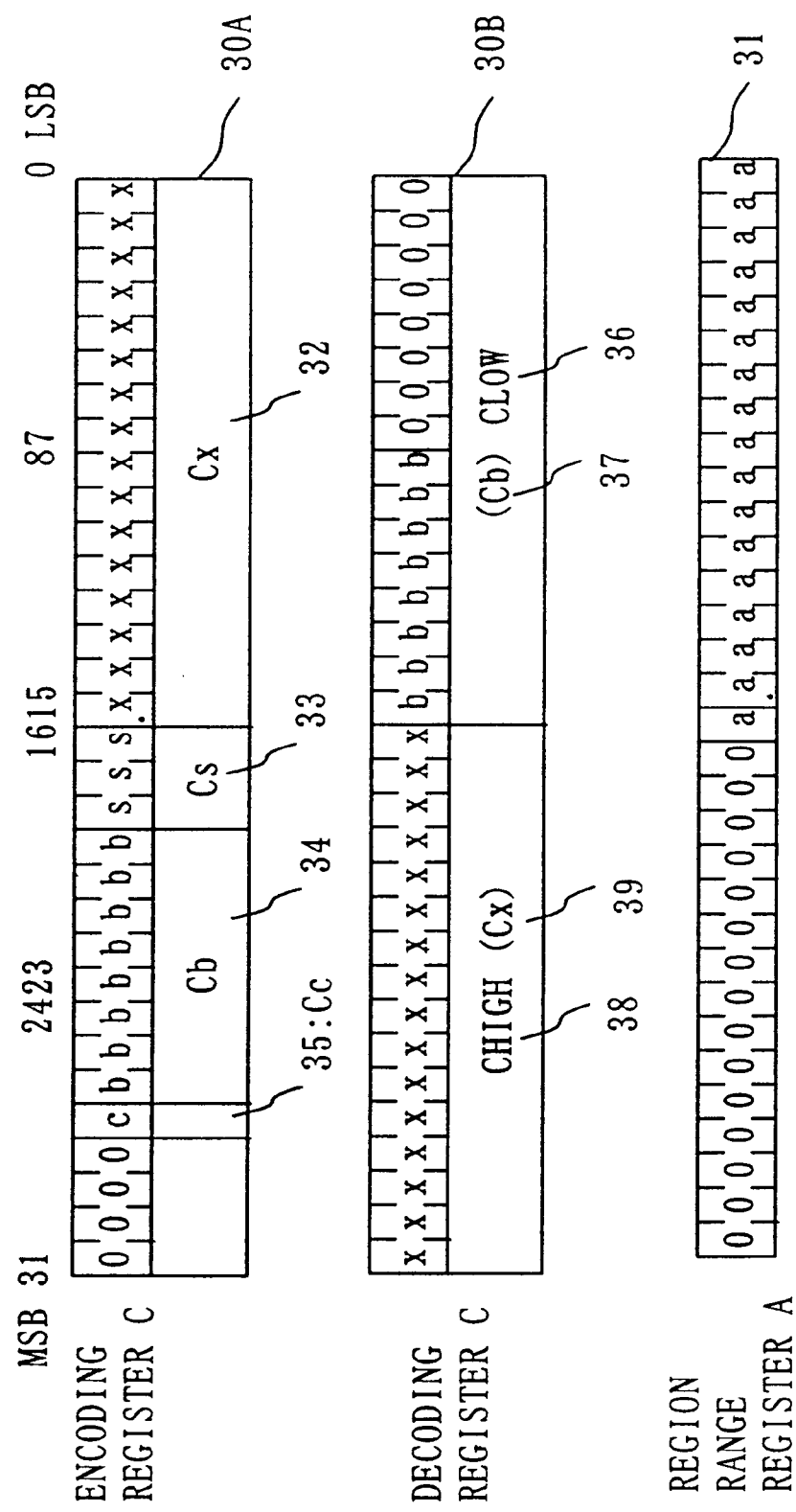
FIG. 45 shows configurations of an encoding register, a decoding register and a region range register.
Figure 46:
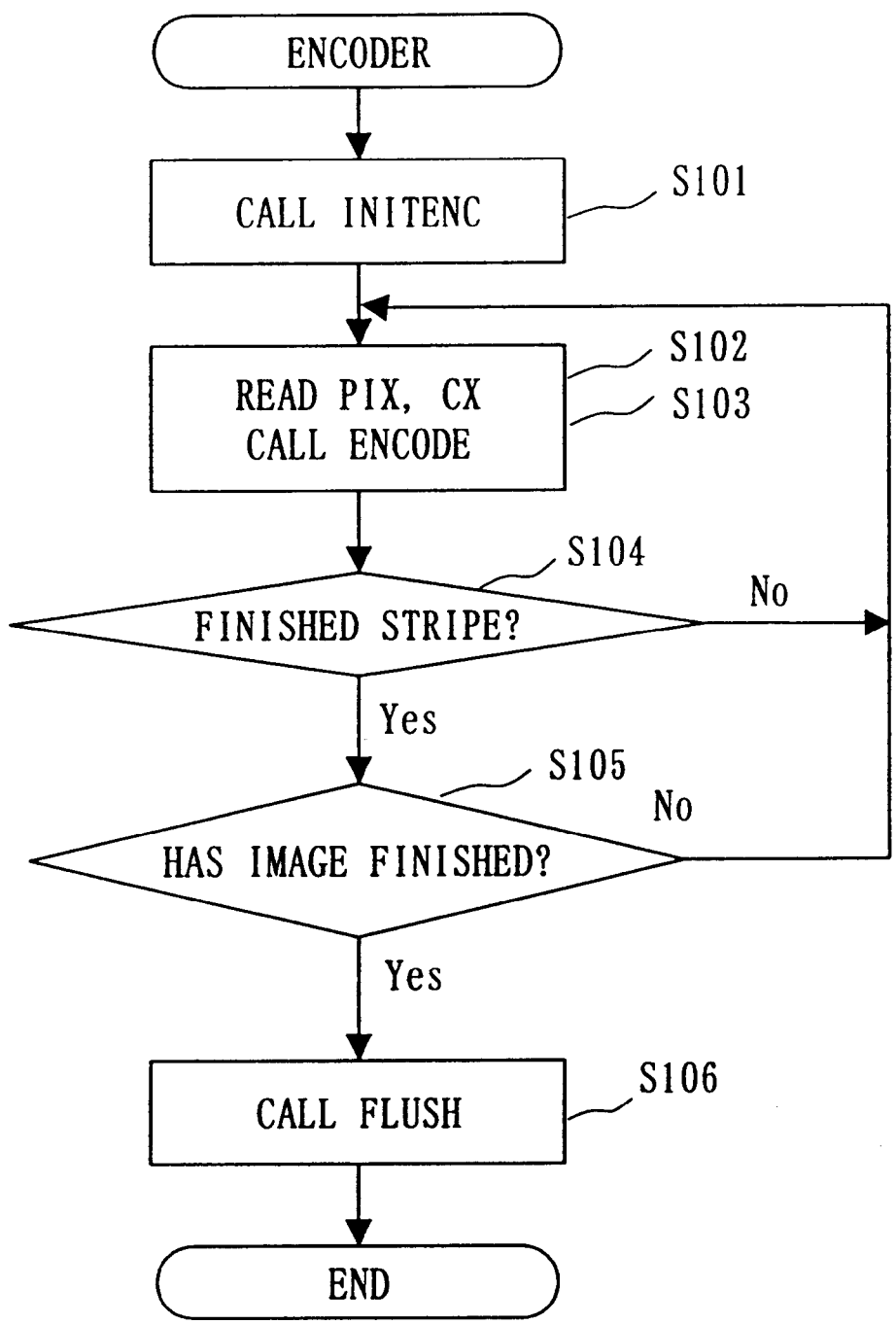
FIG. 46 is a flowchart explaining an ENCODER process in relation to the first related art.
Figure 47:
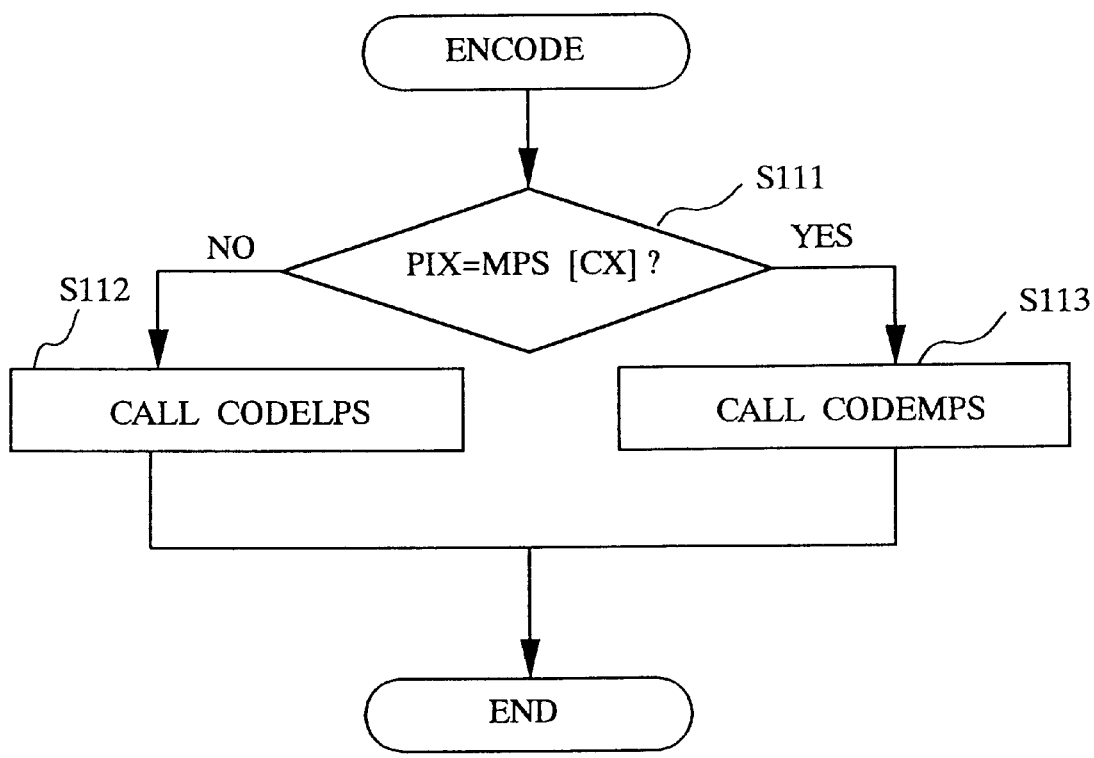
FIG. 47 is a flowchart explaining an ENCODE process in relation to the first related art.
Figure 48:
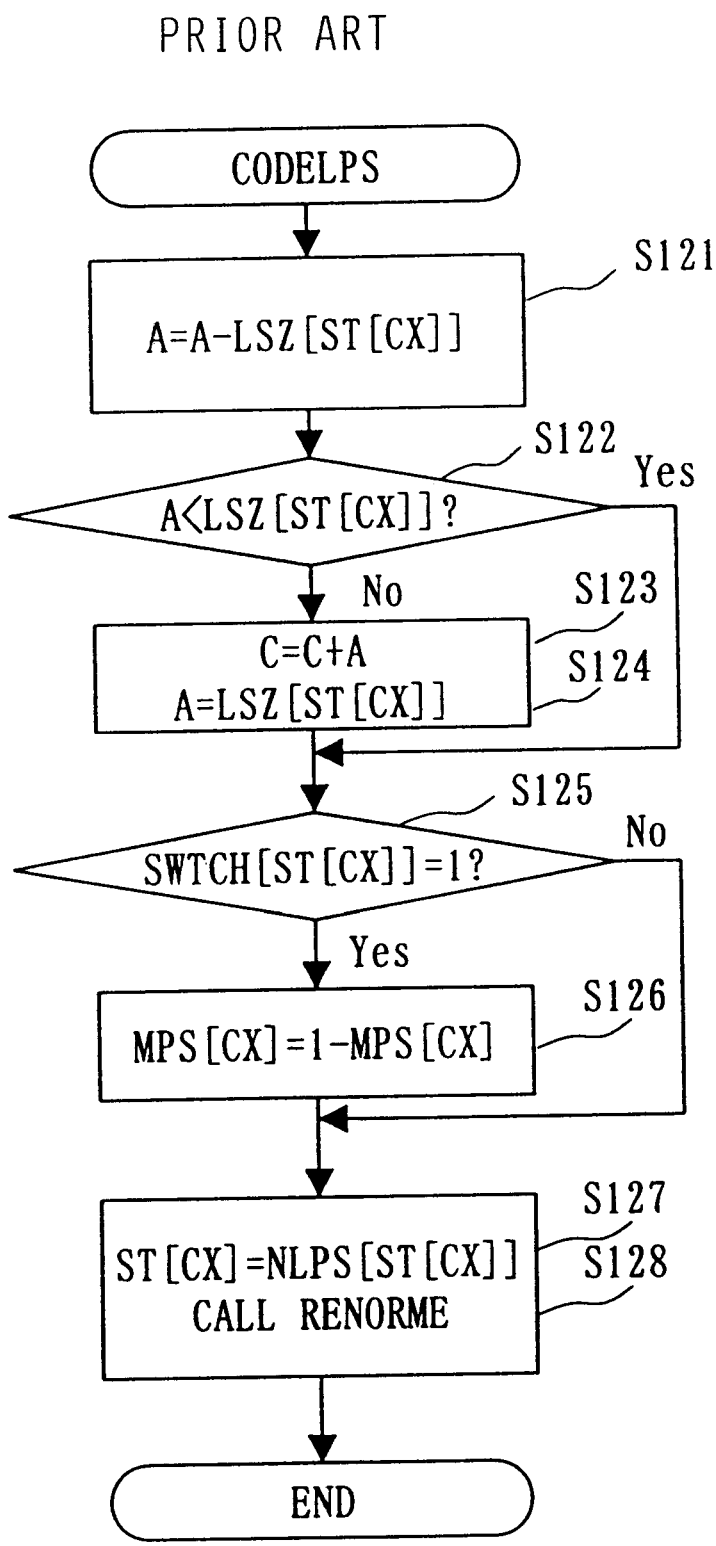
FIG. 48 is a flowchart explaining a CODELPS process in relation to the first related art.
Figure 49:
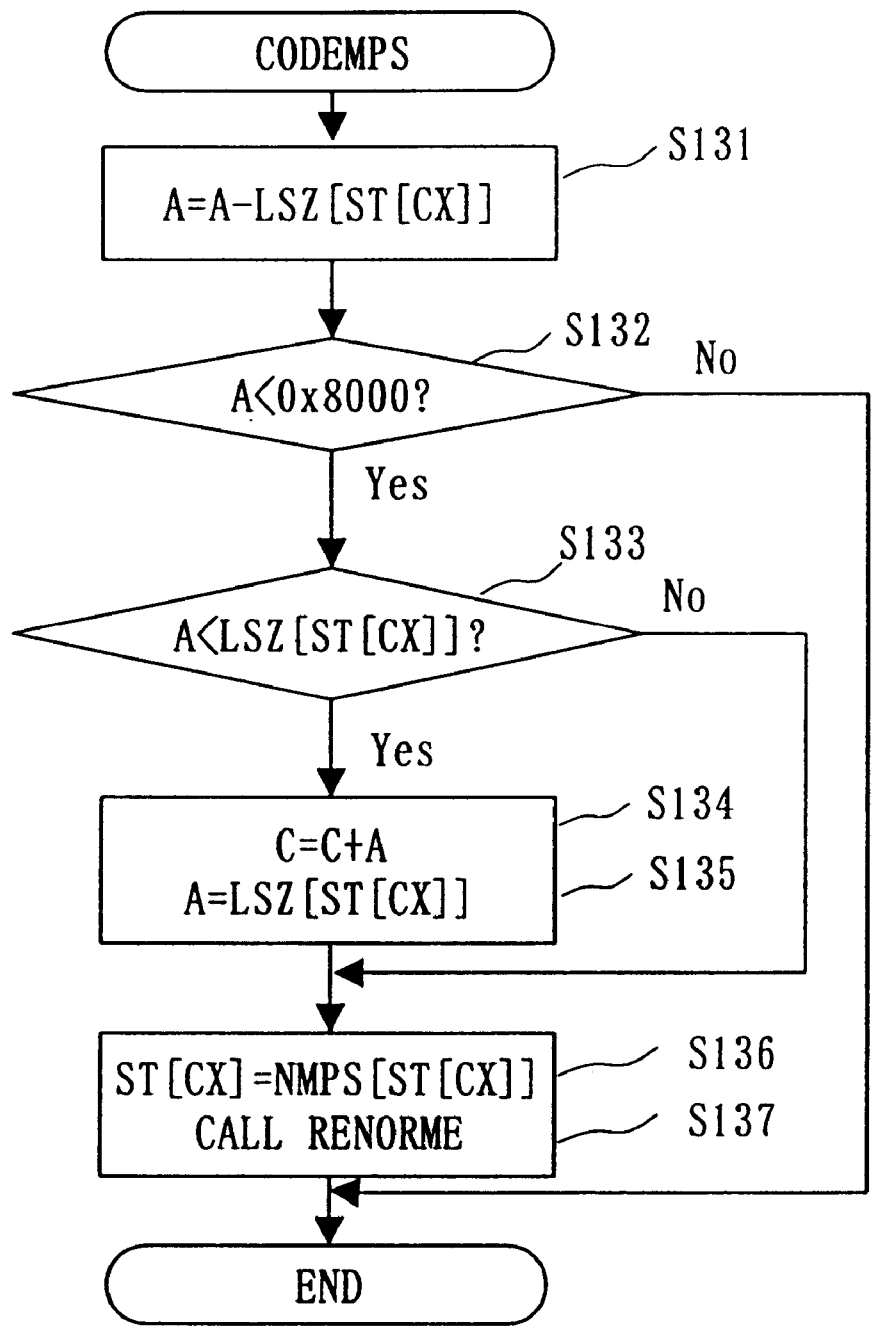
FIG. 49 is a flowchart explaining a CODEMPS process in relation to the first related art.
Figure 50:
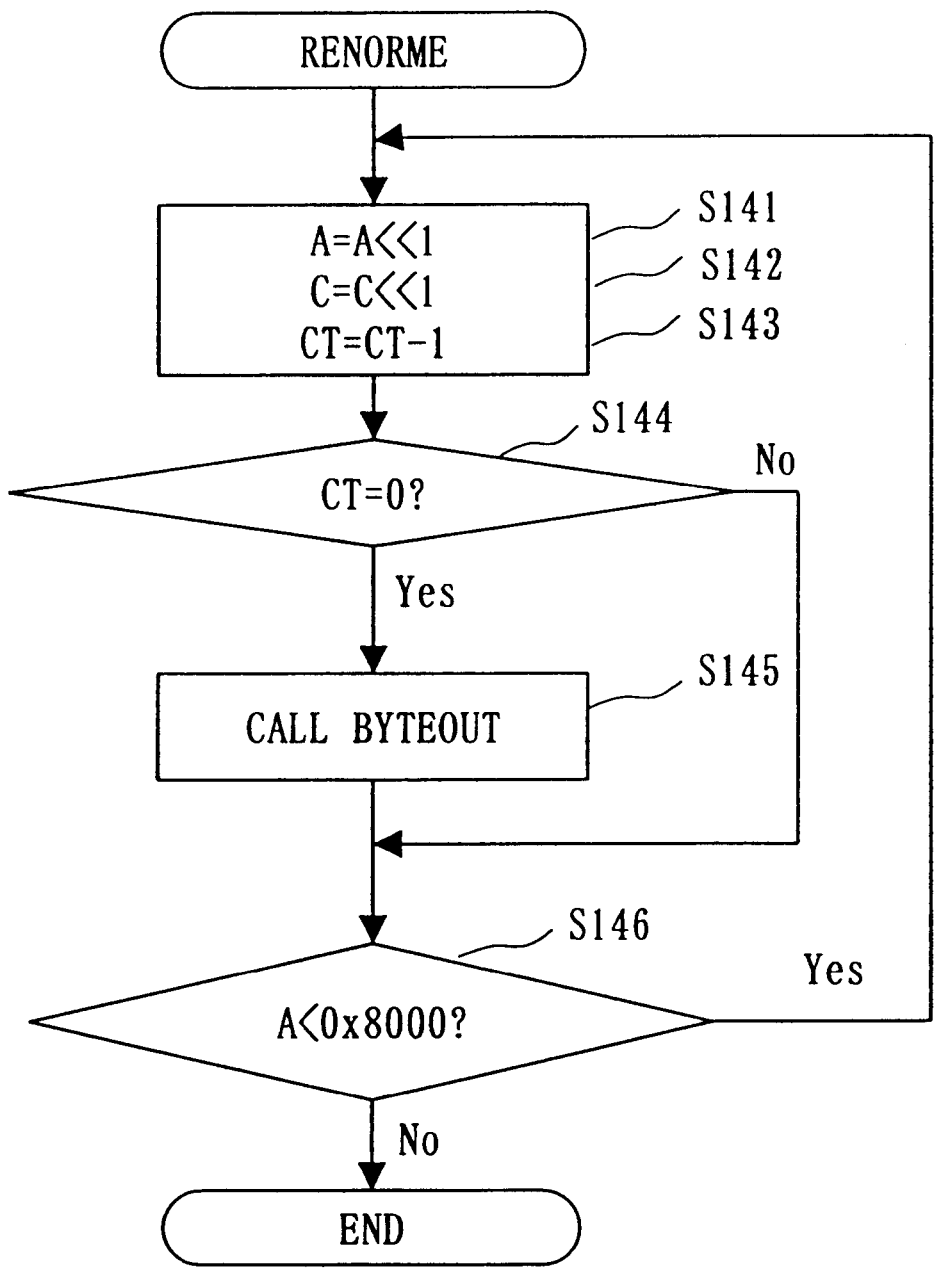
FIG. 50 is a flowchart explaining a RENORME process in relation to the first related art.
Figure 51:
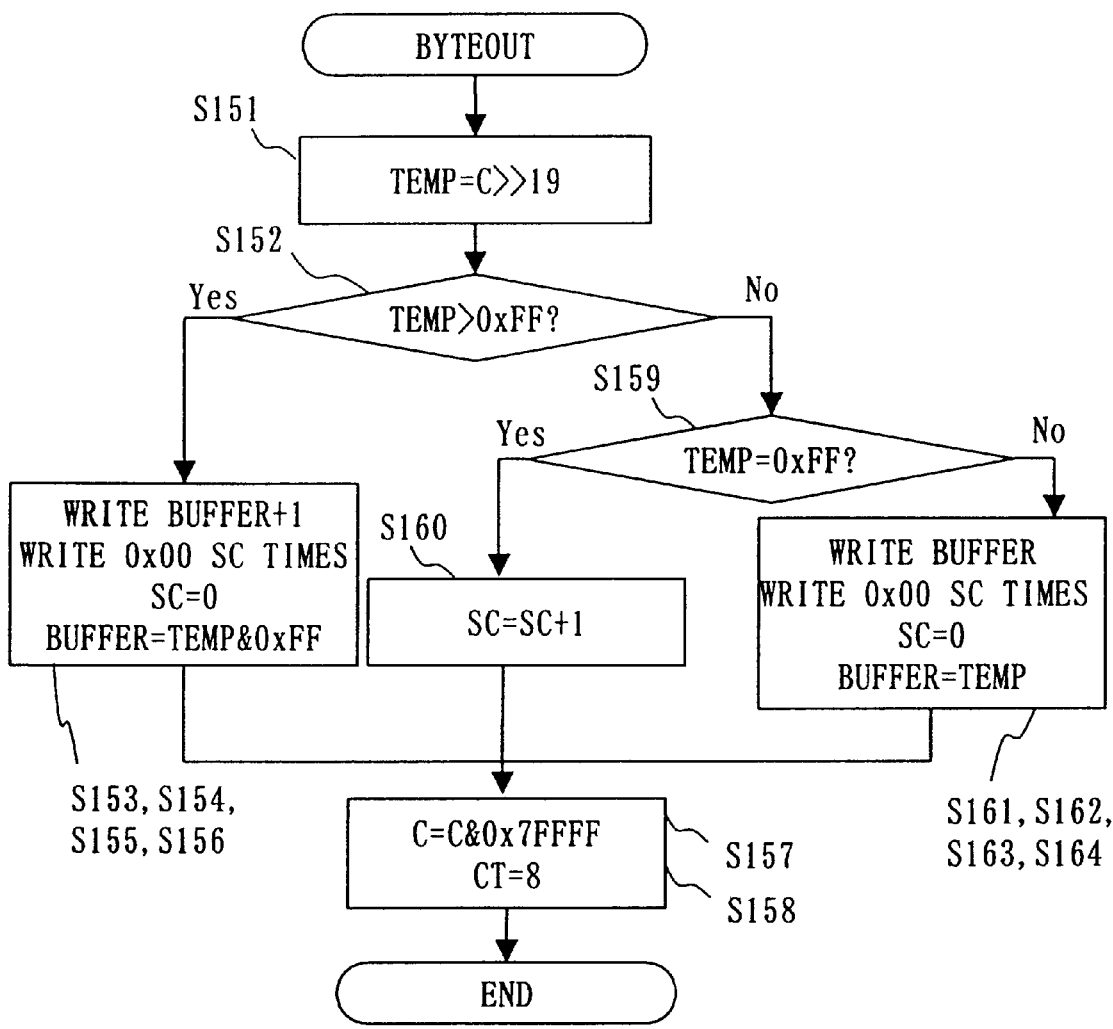
FIG. 51 is a flowchart explaining a BYTEOUT process in relation to the first related art.
Figure 52:
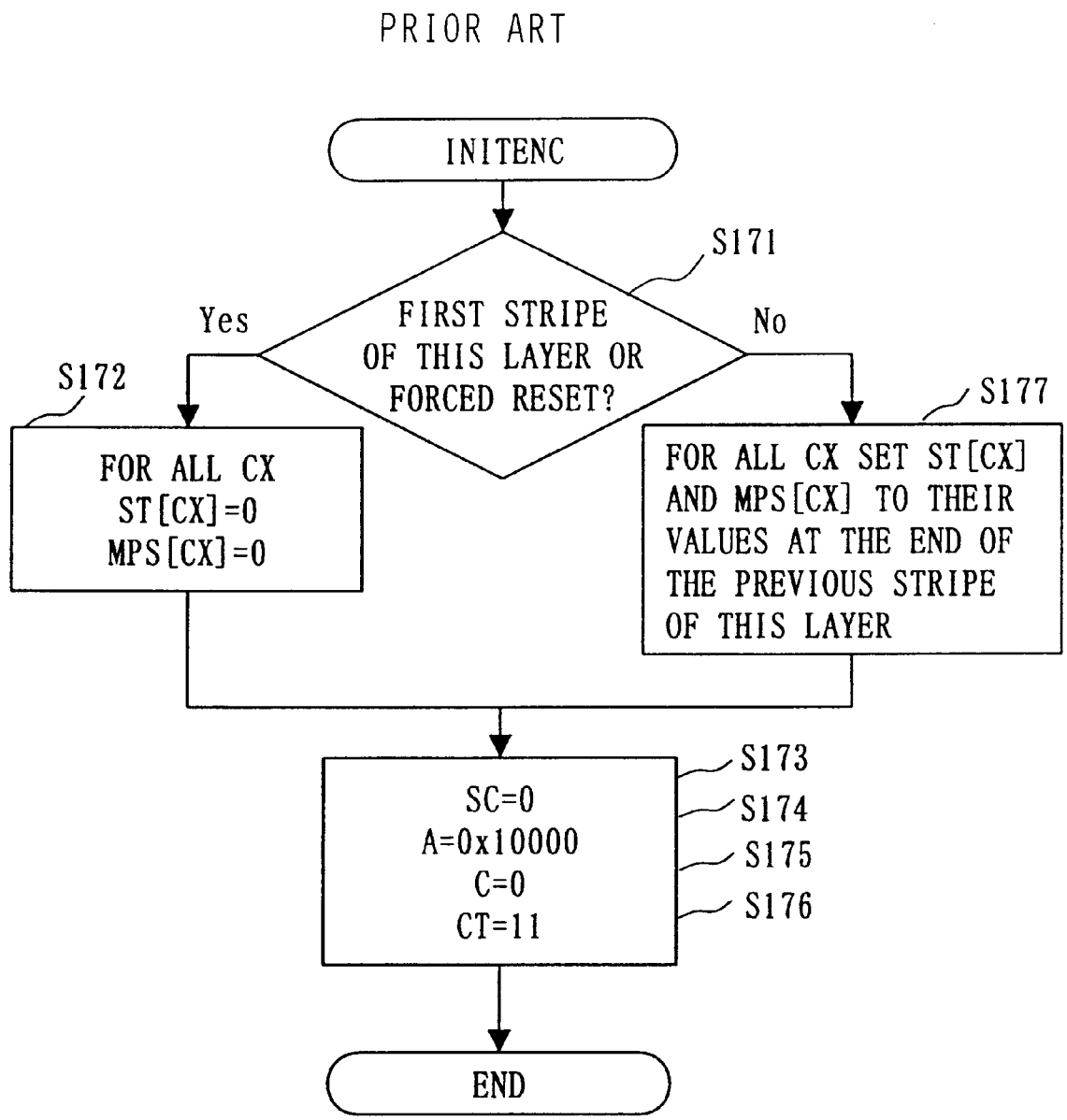
FIG. 52 is a flowchart explaining an INITENC process in relation to the first related art.
Figure 53:
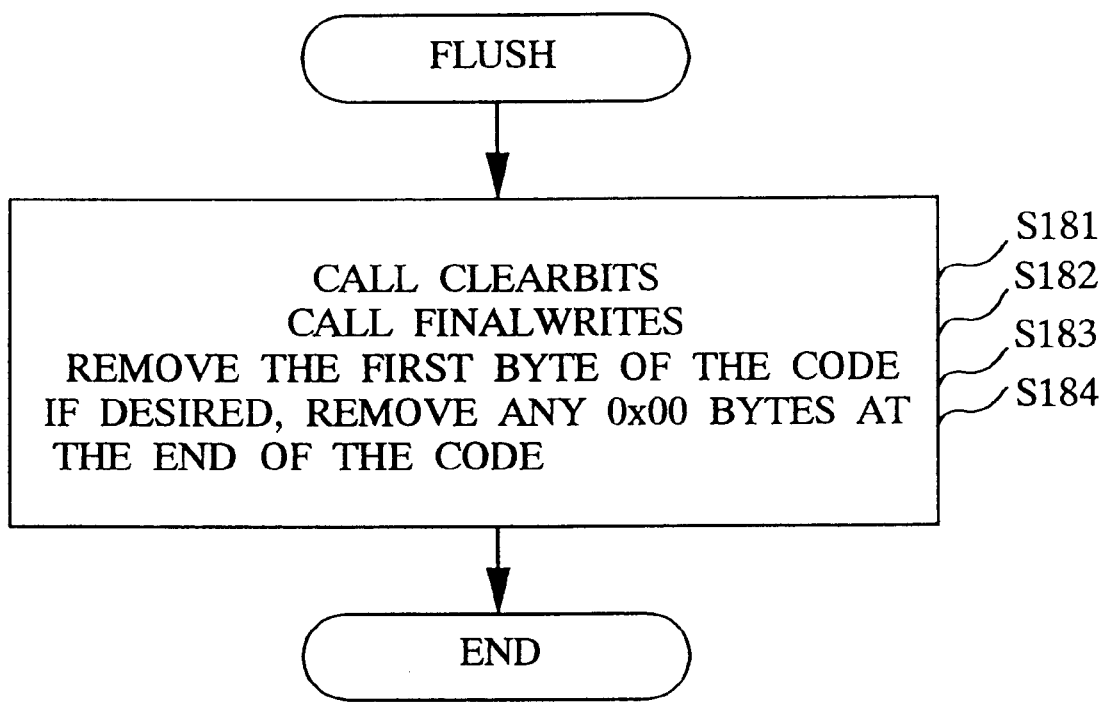
FIG. 53 is a flowchart explaining a FLUSH process in relation to the first related art.
Figure 54:
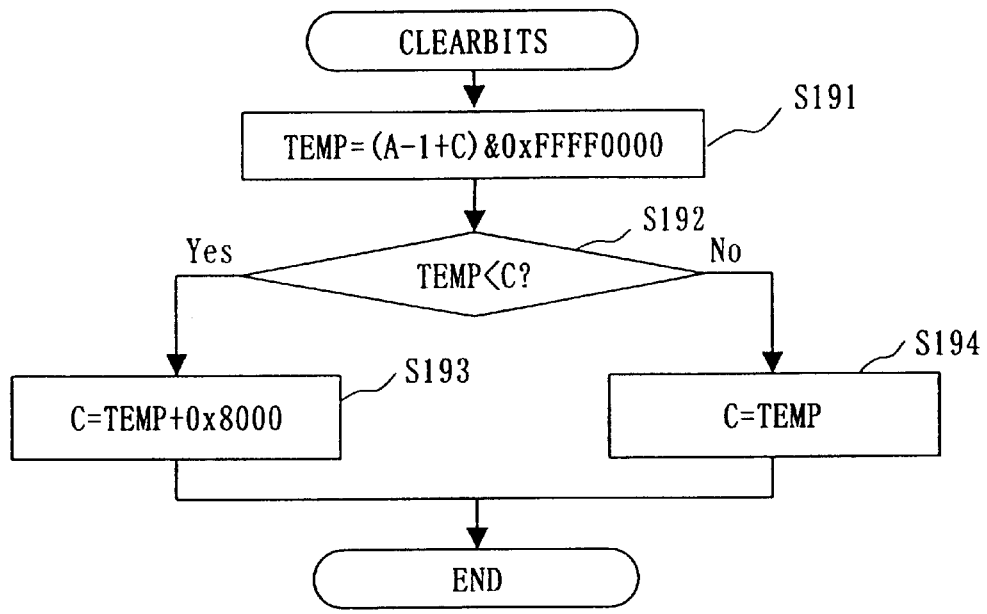
FIG. 54 is a flowchart explaining a CLEARBITS process in relation to the first related art.
Figure 55:
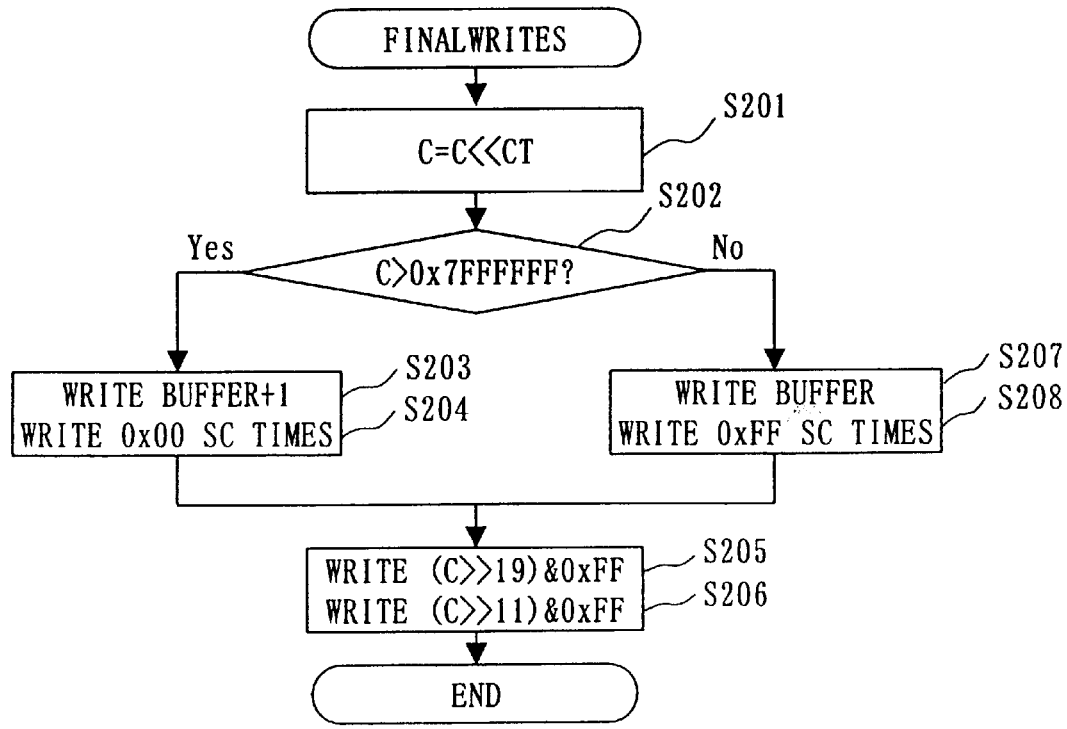
FIG. 55 is a flowchart explaining a FINALWRITES process in relation to the first related art.

One example of the region halving system according to the second embodiment will be explained by adding a necessary modifincation to the flowcharts explaining the encoding/decoding process of the QM-Coder described in the first related art. The encoding/decoding/region range registers are the same as ones shown in FIG. 45. The processing flows of FIGS. 47 through 55 concerning the encoder, and FIGS. 57 through 62 concerning the decoder are the same as ones in the above first related art. For explanation of the operation, the variable which will be additionally introduced to the present embodiment are a half region boundary value T65 of the effective region, and a carry boundary value CW 66 defined by the variable CT50.

Figure 14:
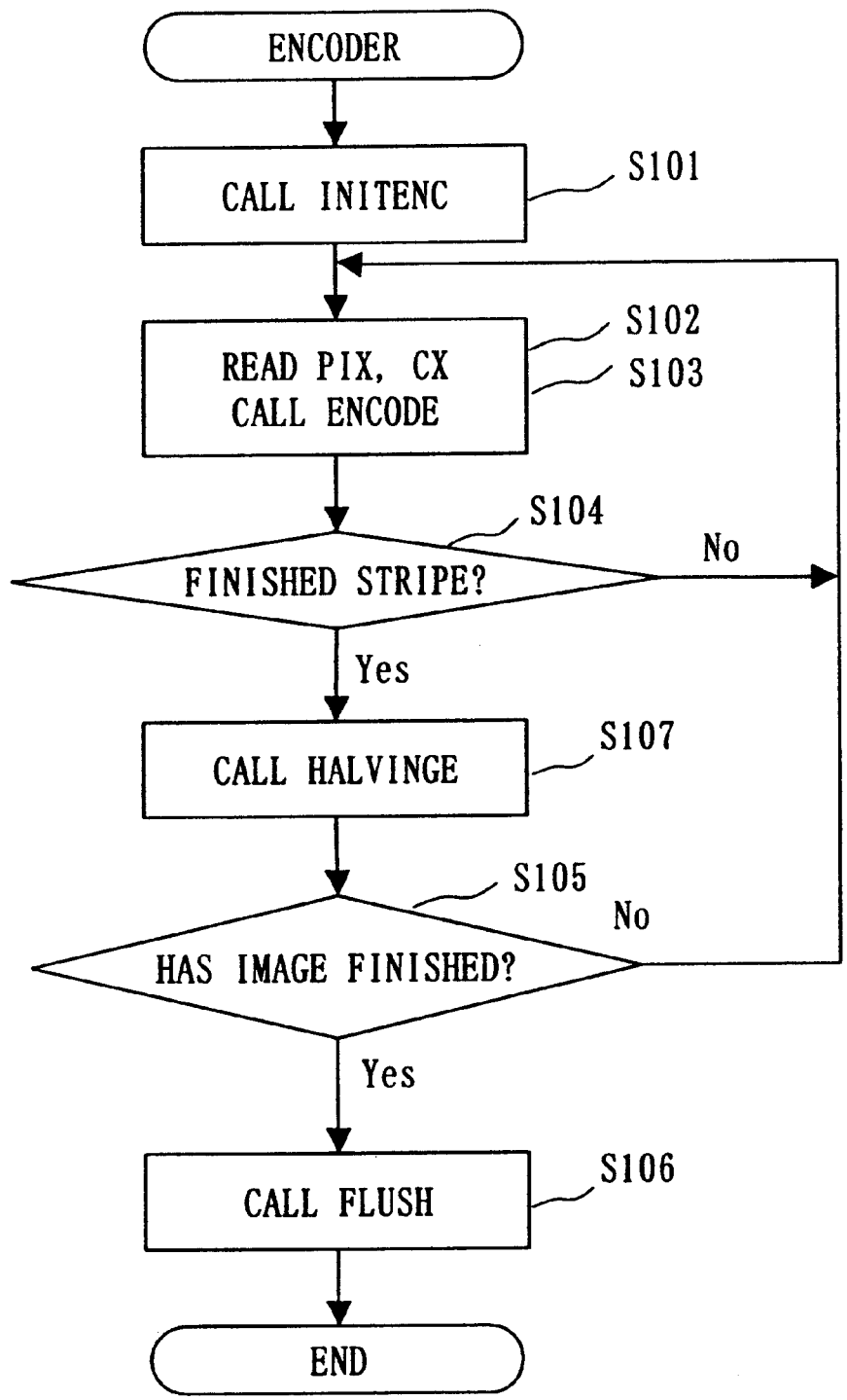
FIG. 14 shows a flowchart explaining an ENCODER process according to the second embodiment of the invention.

FIG. 14 is a flowchart explaining ENCODER process showing a general encoding processing flow. Compared with a flowchart of FIG. 46, a step S107 is added for calling HALVINGE halving the region between the step S104 detecting the finished stripe and the step 105 detecting the completion of the image.

Figure 15:
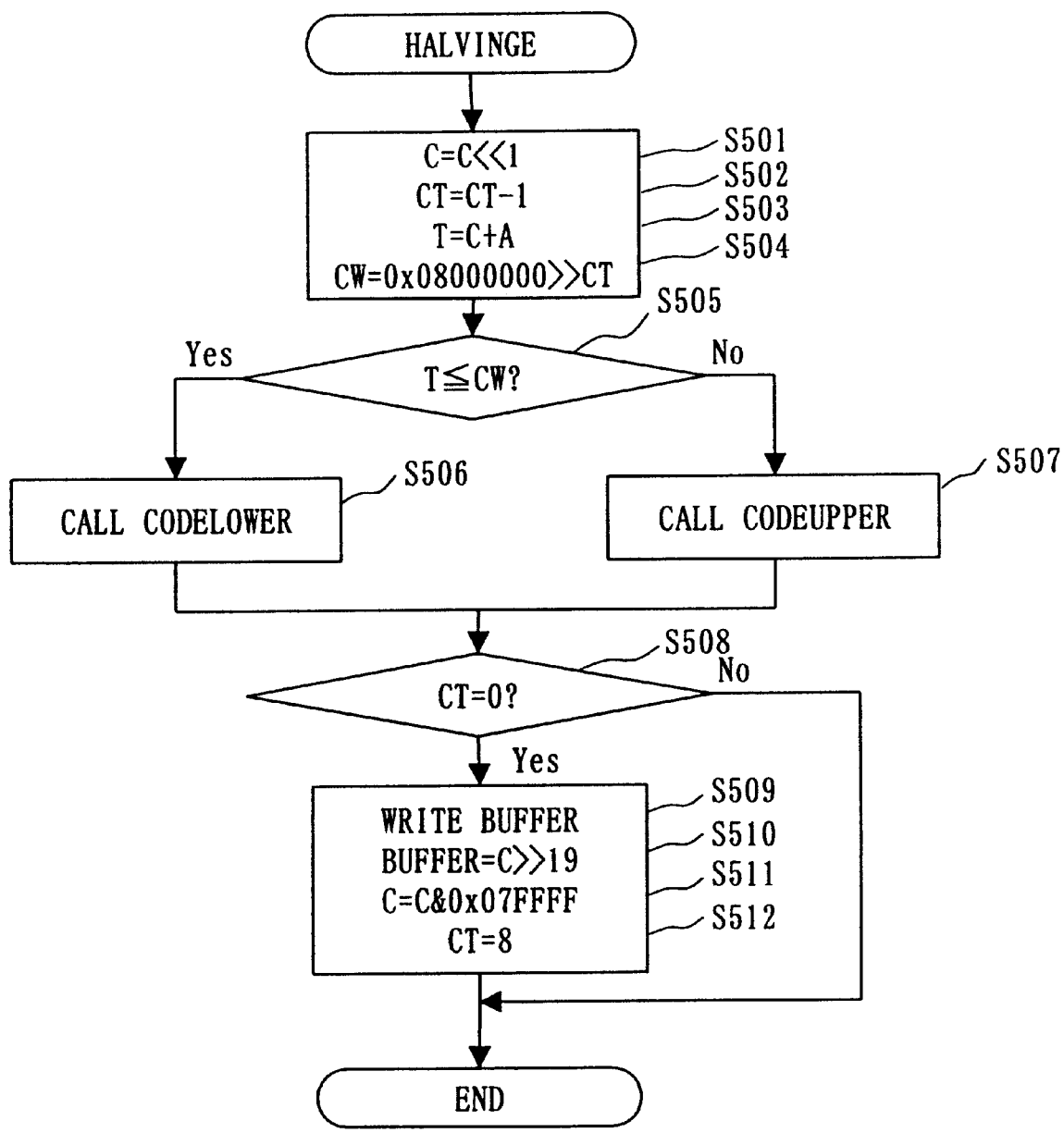
FIG. 15 shows a flowchart explaining a HALVINGE process according to the second embodiment of the invention.

FIG. 15 is a flowchart explaining HALVINGE halving the effective region.

Processes of steps S501 and S502 correspond to the renormalization for the C register 30A and the CT counter 50. The A register 31 keeps its value as it is. The half region boundary value T65 within the effective region and the carry boundary value CW66 defined by the value of the CT counter 50 are respectively set at steps S503 and S504. At step S505, it is checked if the half region boundary value T65 is equal to or less than the carry boundary value CW66. When the result is "Yes", the carry boundary is included in the upper half region. Therefore, the code byte which is waiting for outputting and is not effected by propagation of the carry is output and a CODELOWER process is called at step S506 for setting the lower half region as the effective region. When the result is "No", the carry boundary is included in the lower half region. Therefore, the code byte which is waiting for outputting and to which the carry is propagated is output and a CODEUPPER process is called at step S507 for setting the upper half region as the effective region. Finally, the variable CT50 is checked to be 0 or not at step S508. When the CT50 is 0, the value of BUFFER 51 is written at step S509, the value of the Cb register 34 is set in the BUFFER 51 at step S510, the Cc register 35 and the Cv register 34 are cleared at step S511, and at step S512, the CT counter 50 is set to 8. Up to this step, it has been already determined if the carry-over occurs or not, and if the carry-over occurs, the carry is propagated (after the carry is propagated, the value of the Cc register 35=0), and the waiting code byte has been flushed (after the code byte is flushed, the value of the variable SC 52=0) at step S 506 or S507. The processes of steps S509 through S512 correspond to the processes of steps S161, S164 (TEMP=the value of the Cb register), S157, and S158 of the BYTEOUT process (shown in FIG. 51) which eliminate the redundancy part as much as possible. At step S510, it causes no problem if the BUFFER 51 is byte 0xFF.

Figure 16:
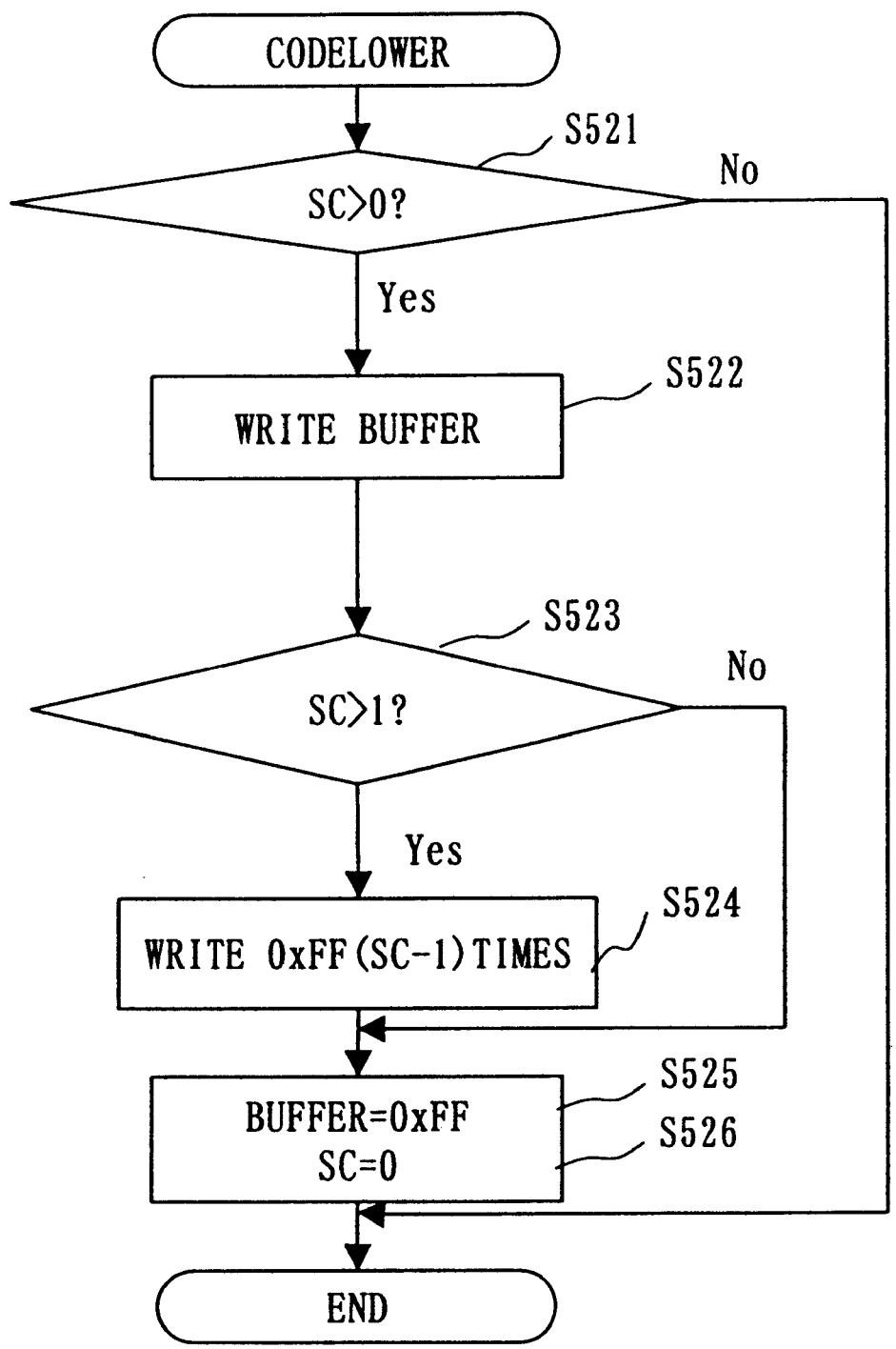
FIG. 16 shows a flowchart explaining a CODELOWER process according to the second embodiment of the invention.

FIG. 16 is a flowchart explaining a CODELOWER process truncating the upper half region and flushing the code which is waiting for outputting when the carry-over does not occur. When the variable SC 52 is detected to be positive at step S521, the value of BUFFER 51 is written at step S522. Further, when the variable SC 52 is larger than 1 at step S523, the code byte 0xFF is written (SC-1) times at step S524. At step S525, the BUFFER 51 is set to 0xFF which is the final waiting code byte, and at step S526, the variable SC 52 is set to 0.

Figure 17:
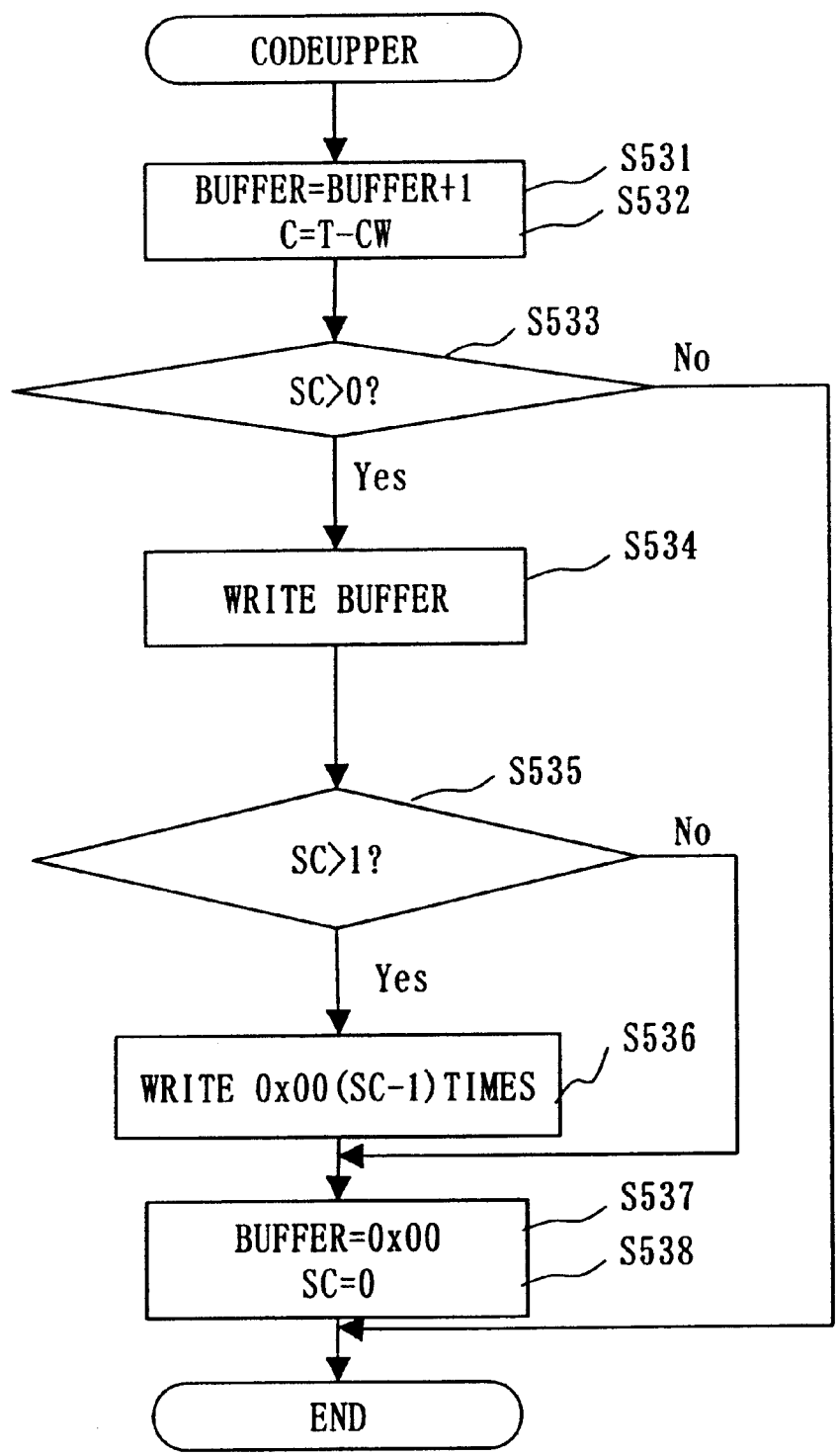
FIG. 17 shows a flowchart explaining a CODEUPPER process according to the second embodiment of the invention.
Figure 18:
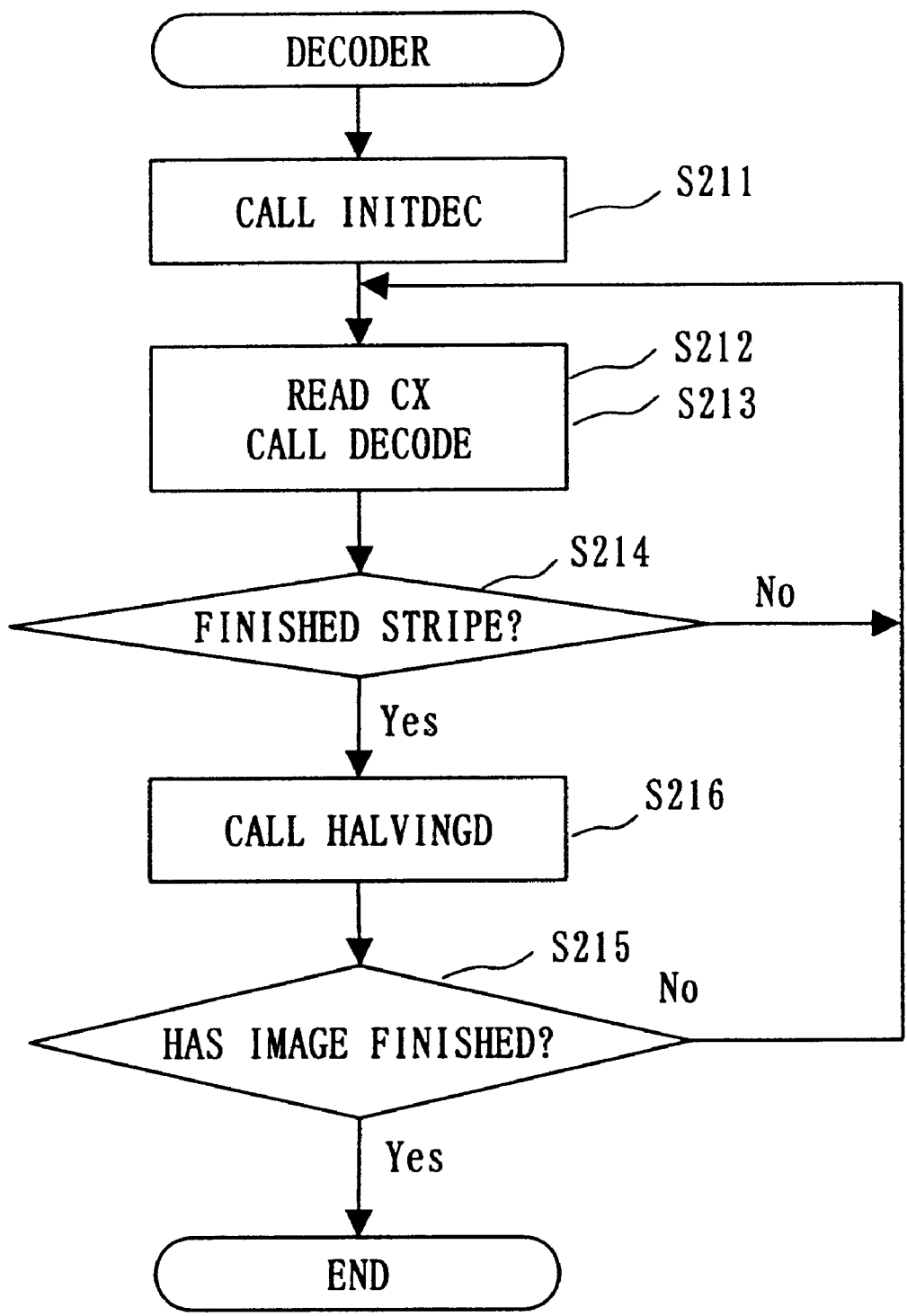
FIG. 18 shows a flowchart explaining a DECODER process according to the second embodiment of the invention.

FIG. 17 is a flowchart explaining a CODEUPPER process truncating the lower half region and flushing the code which is waiting for outputting when the carry-over occurs.

At step S531, the carry is propagated to the BUFFER 51, and the same number of bits as the bits propagated (the carry boundary value CW66) to the BUFFER 51 are cleared from the C register 30A. When the value of the variable SC 52 is detected to be positive at step S533, the value of BUFFER 51 is written at step S534. Further, at step S535, the variable SC 51 is larger than 1, the code byte 0x00 is written (SC-1) times at step S536. At step S537, the BUFFER 51 is set to 0x00 which is the final waiting code byte, and at step S537, the variable 52 is set to 0.

FIG. 18 is a flowchart explaining a DECODER process showing a general processing flow of the decoding process.

Figure 56:
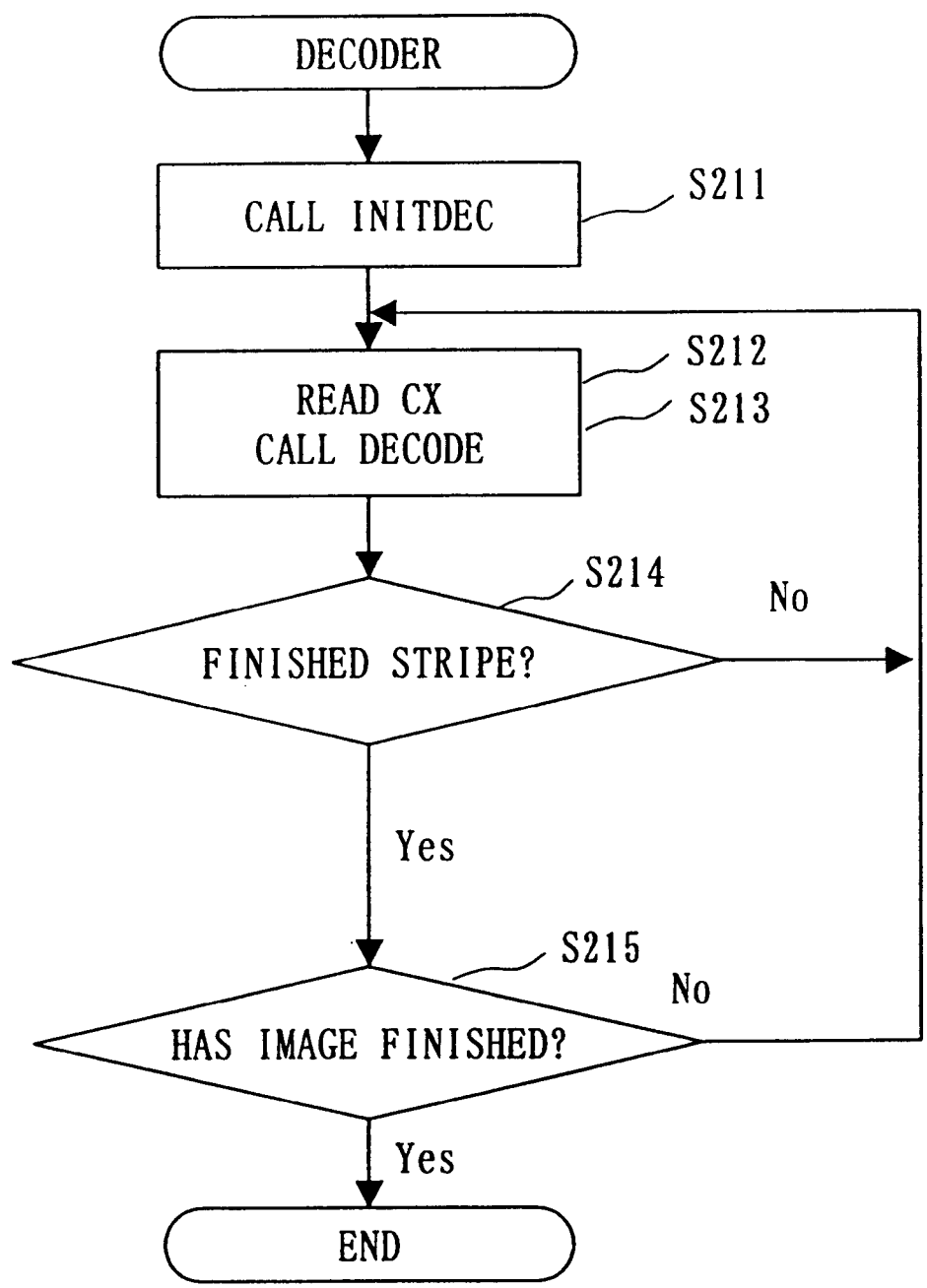
FIG. 56 is a flowchart explaining a DECODER process in relation to the first related art.
Figure 57:
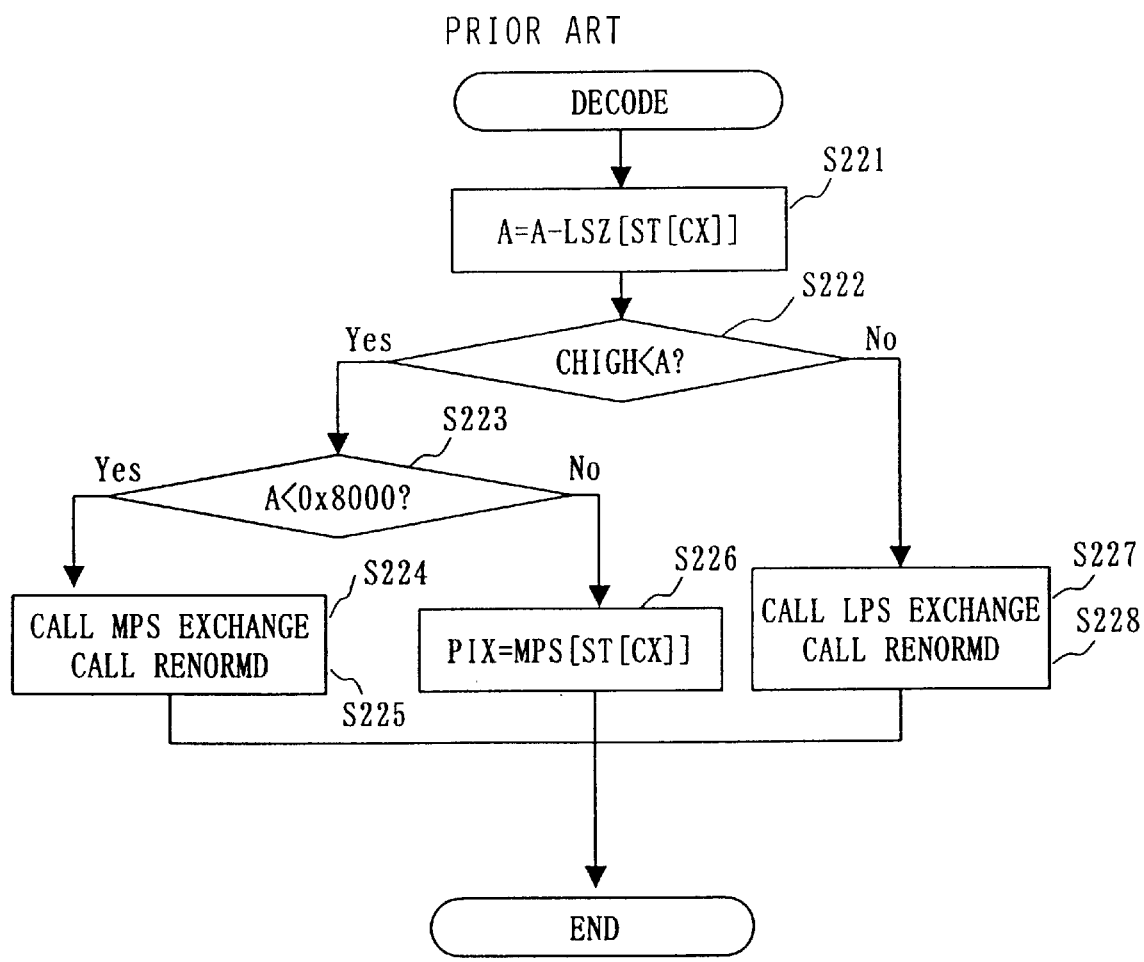
FIG. 57 is a flowchart explaining a DECODE process in relation to the first related art.
Figure 58:
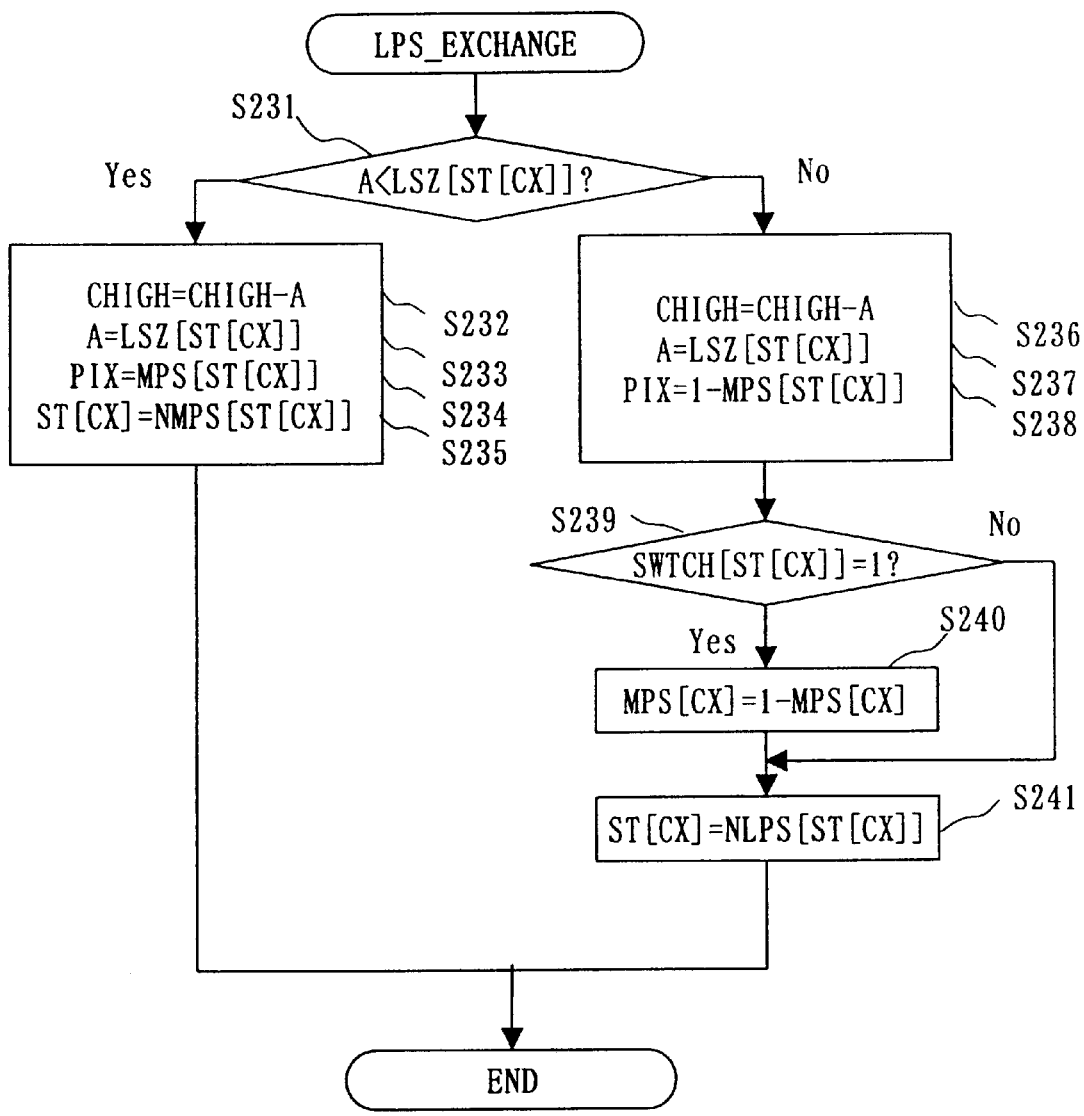
FIG. 58 is a flowchart explaining an LPS_EXCHANGE process in relation to the first related art.
Figure 59:
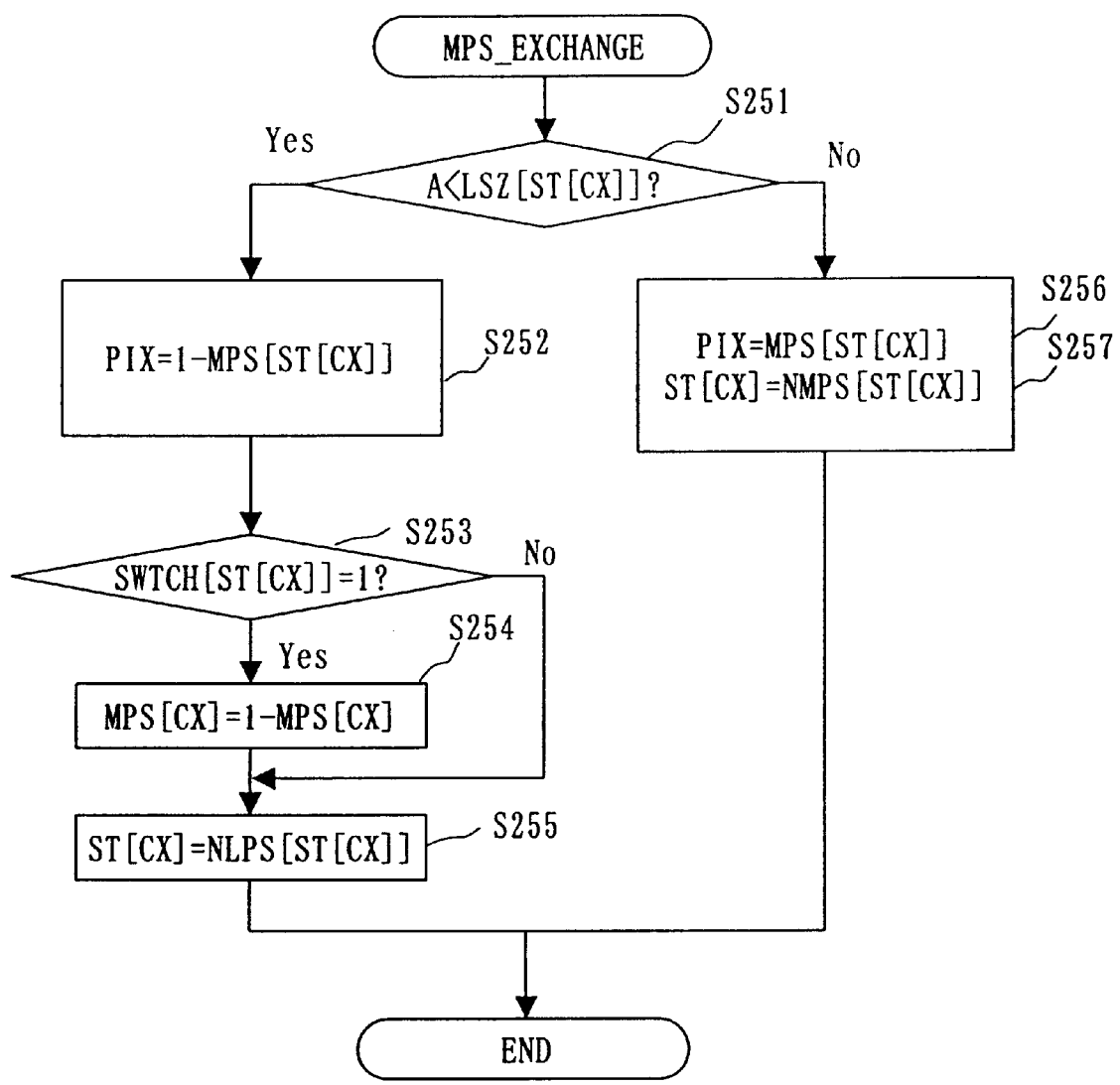
FIG. 59 is a flowchart explaining an MPS_EXCHANGE process in relation to the first related art.
Figure 60:
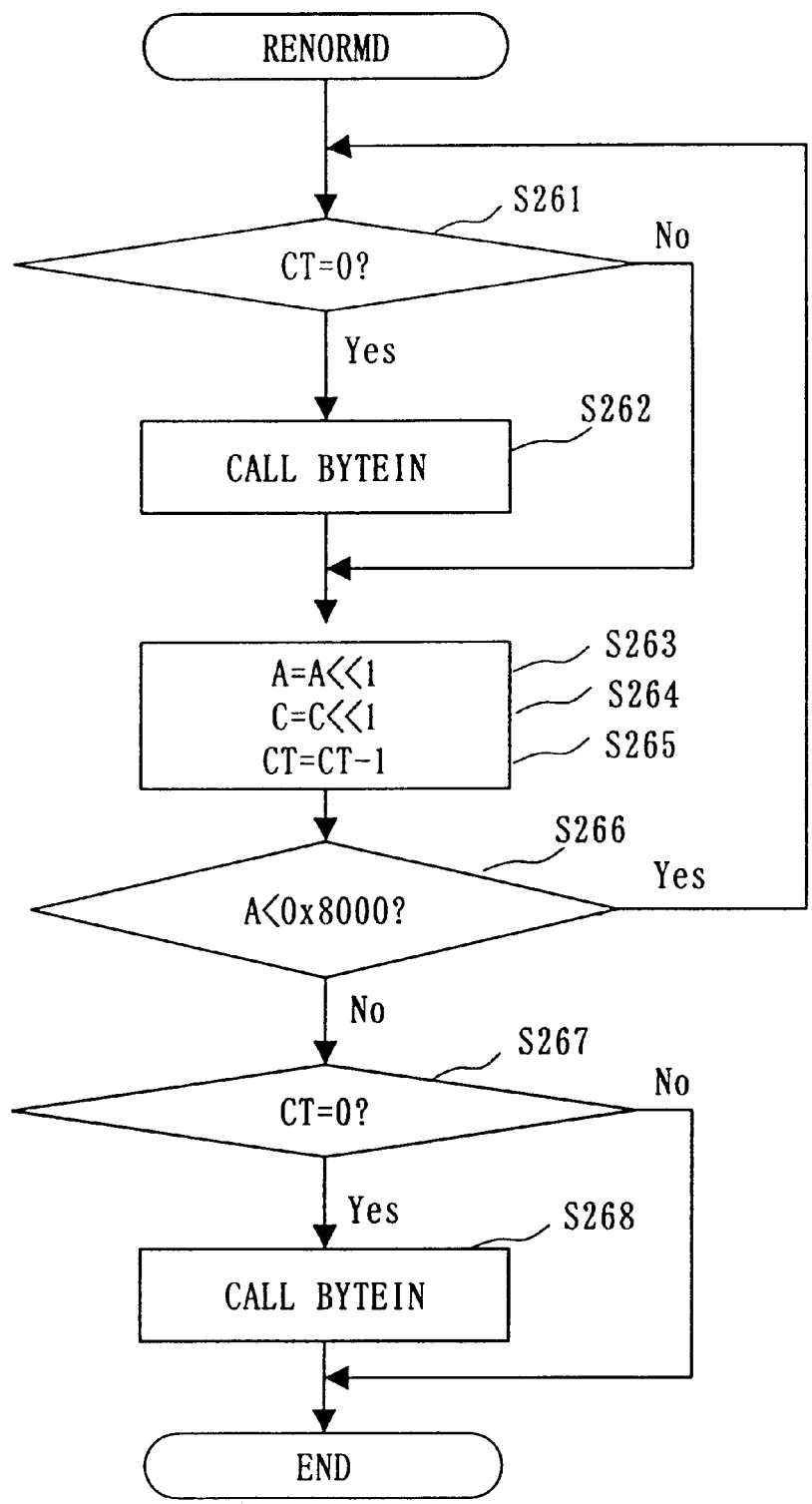
FIG. 60 is a flowchart explaining a RENORMD process in relation to the first related art.
Figure 61:
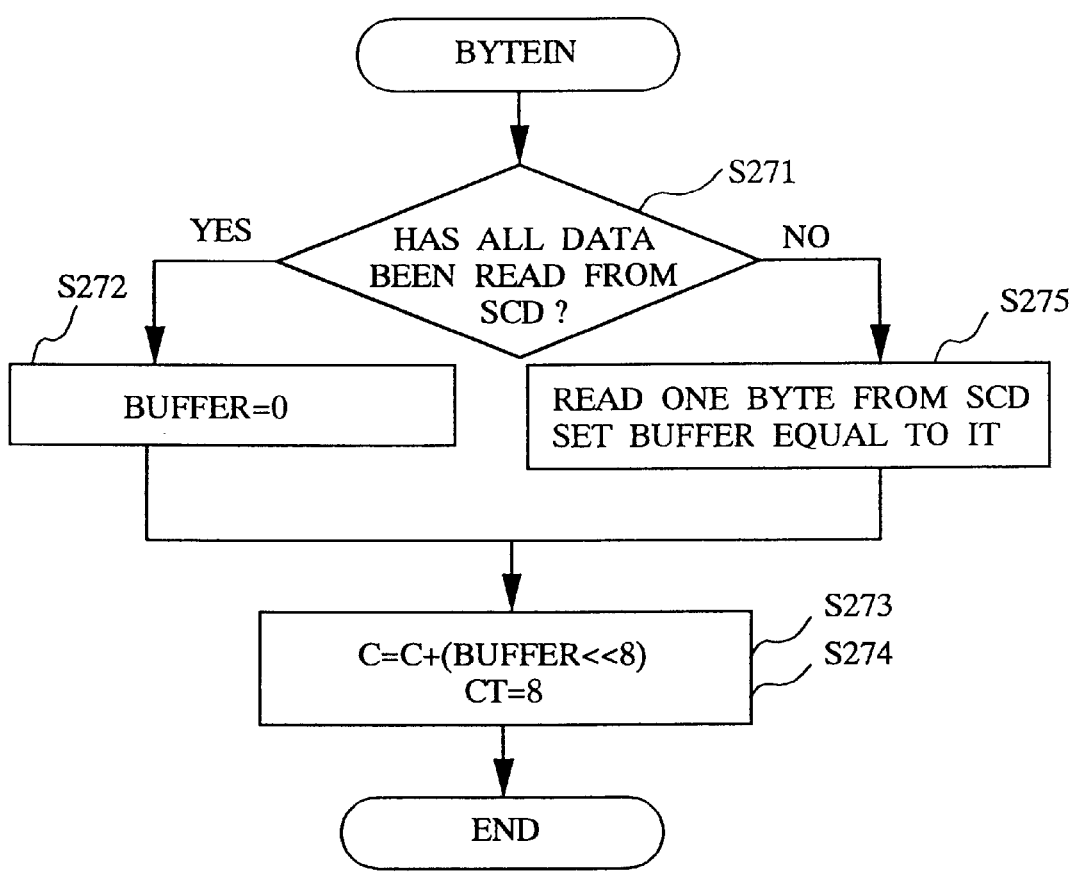
FIG. 61 is a flowchart explaining a BYTEIN process in relation to the first related art.
Figure 62:
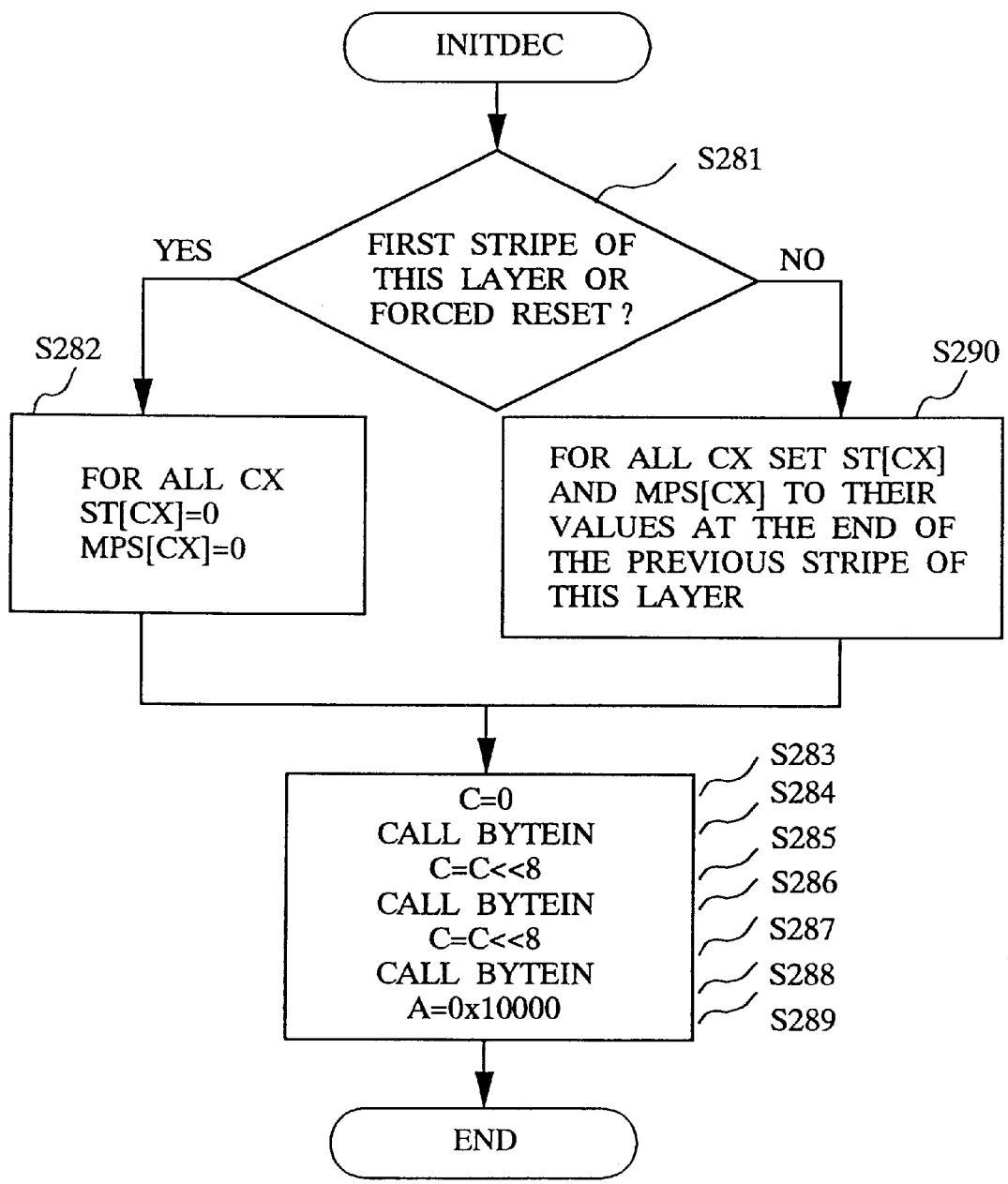
FIG. 62 is a flowchart explaining an INTDEC process in relation to the first related art.
Figure 63:
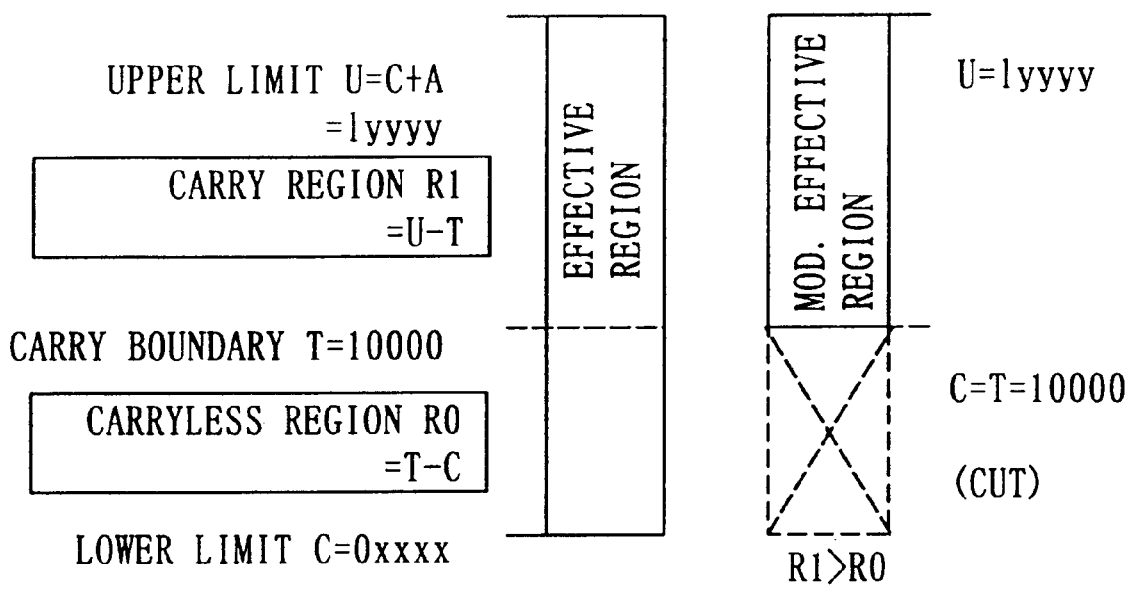
FIG. 63 explains a carry/carryless region truncation process in relation to the second related art.

Compared with the flowchart of the decoding process shown in FIG. 56, a step S216 is added for calling a HALVINGD process halving the effective region between the step S214 for detecting the finished stripe and the step S215 for detecting the completion of the image.

Figure 19:
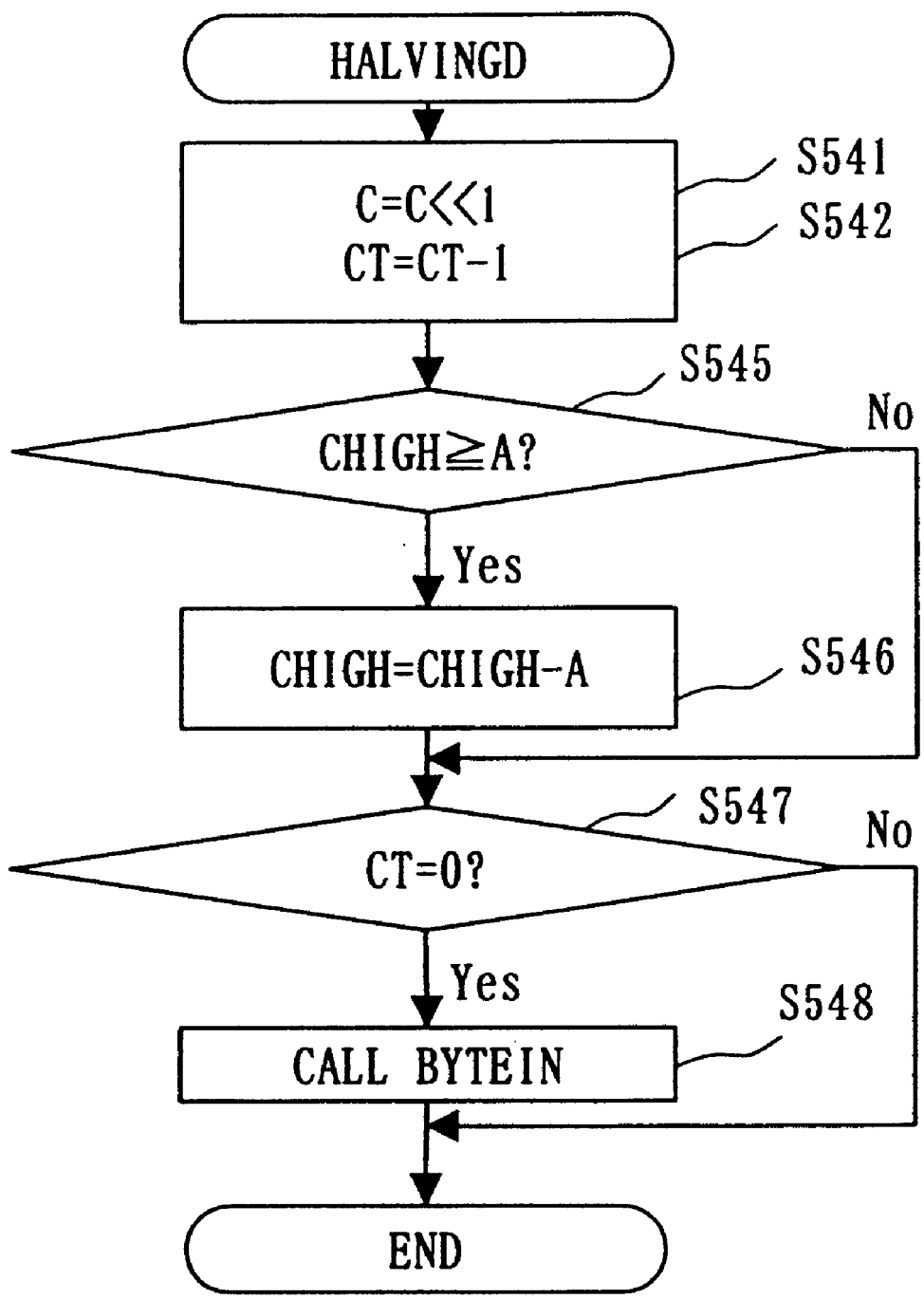
FIG. 19 shows a flowchart explaining a HALVINGD process according to the second embodiment of the invention.

FIG. 19 is a flowchart explaining a HALVINGD process for halving the effective region. Processes of steps S541 and S542 correspond to the renormalization for the C register 30B and the CT counter 50, respectively. The value of the A register 31 is kept as it is. At step S545, it is checked if the value of the CHIGH register 38 is equal to or more than the value of the A register 31. When the result is "Yes", the lower half region is detected to be truncated. Therefore, the value of the A register 31 is subtracted from the value of the CHIGH register 38 at step S546. When the result is "No", the upper half region is detected to be truncated. Finally, when the variable CT50 is 0 at step S547, a BYTEIN process is called.

When the carry boundary value CW66 is equal to the half region boundary value T65, whichever of the upper half region and the lower half region can be truncated. However, according to the International Standard Recommendation T.82, as the STUFF byte (0x00) is inserted directly after the code byte 0xFF for controlling the transmission (to secure the marker code), therefore, the final code length sometimes becomes shorter when the carry is propagated.

In the present embodiment, the specification of the SC counter 52 can be determined to be prepared for the configuration size (the number of bytes) of the stripes (or lines) dividing the image. On the contrary, if the specification of the SC counter 52 cannot be changed, the configuration size of the stripes (or lines) can be set with a such number of bits that the SC counter 52 would not be overflown.

Embodiment 3

In the above second embodiment, the maximum delay is eight stripes and when the code bit is not generated, the delay becomes large until the code is determined without halving the effective region because it is resolved if the carry-over occurs or not. In this case, a redundant code bit associated with the halving the effective region is made not to be generated in the code while the SC counter 52 is kept not to be overflown.

Figure 20:
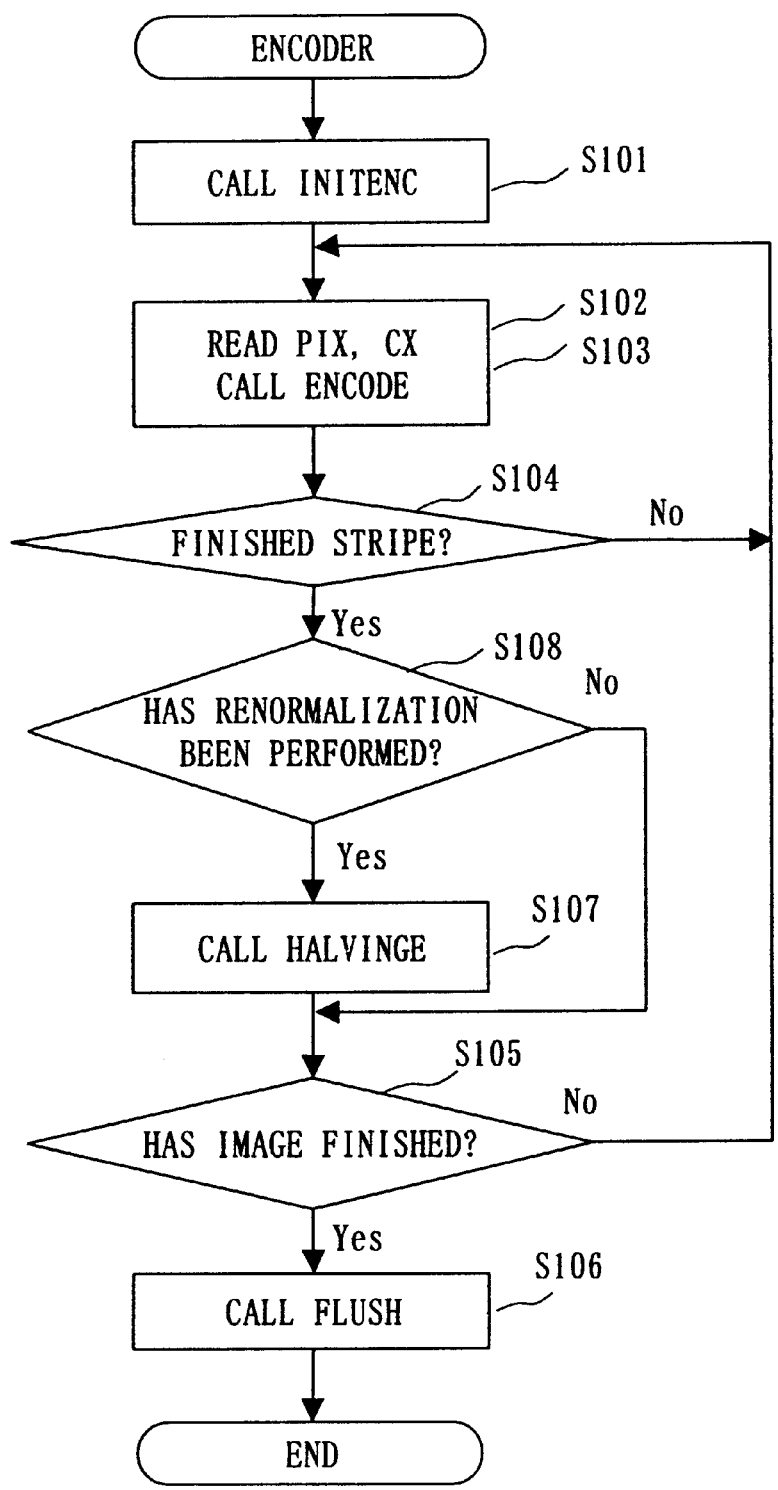
FIG. 20 shows a flowchart explaining an ENCODER process according to the third embodiment of the invention.
Figure 21:
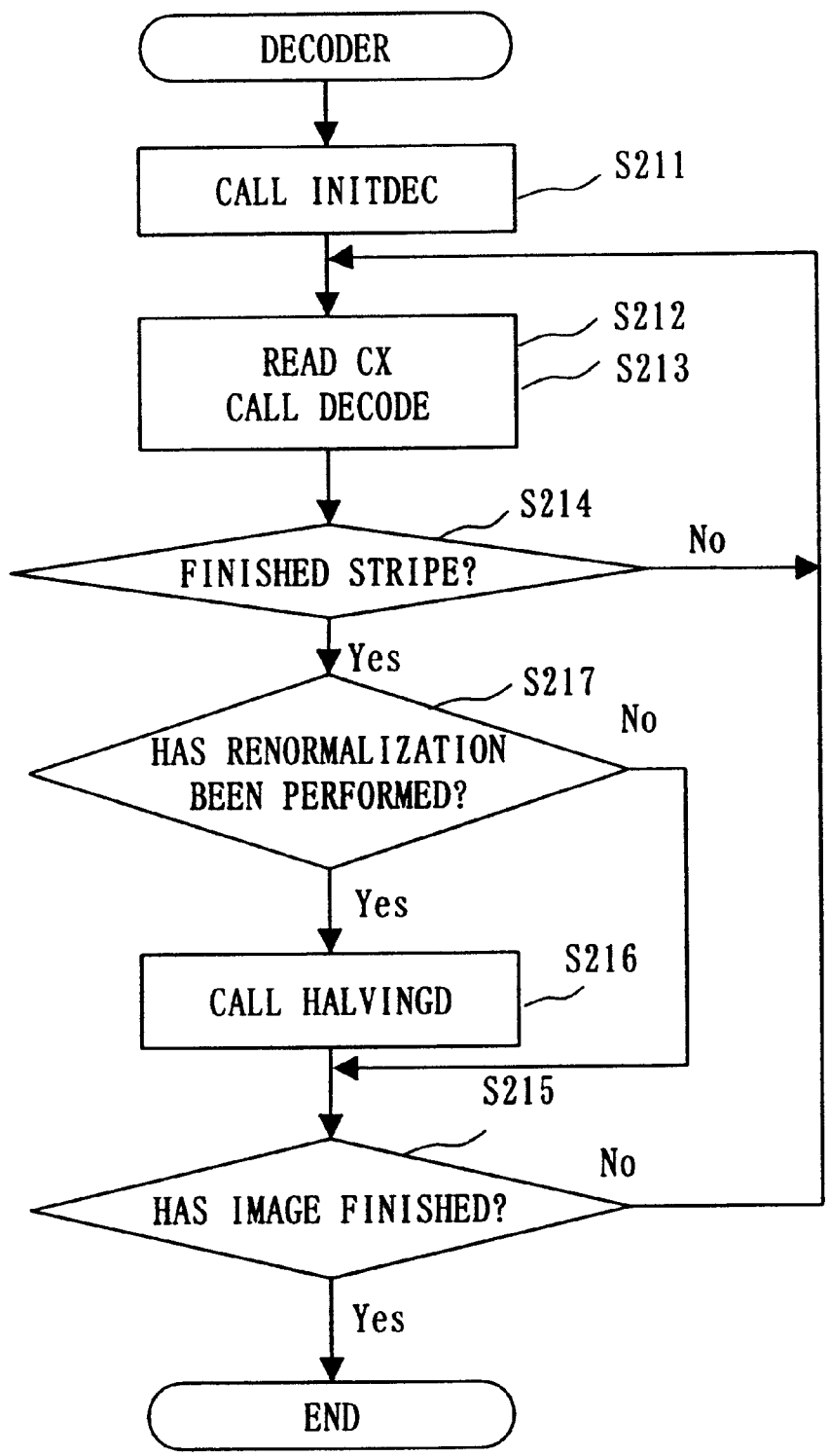
FIG. 21 shows a flowchart explaining a DECODER process according to the third embodiment of the invention.

In the third embodiment, for example, the processing flows of FIGS. 14 and 18 respectively explaining the ENCODER process and the DECODER process are exchanged with FIGS. 20 and 21.

FIG. 20 is a flowchart of an ENCODER process showing a general processing flow of encoding. Compared with FIG. 14, a step S108 is added for checking if the renormalization is performed (if the code bit is generated) during the encoding process of the stripes between the step S104 for detecting the finished stripe and the step 107 for calling the HALVINGE process halving the effective region. The region halving is implemented if the checking result at S108 is "Yes".

FIG. 21 is a flowchart of a DECODER process showing a general processing flow of decoding.

Compared with FIG. 18, a step S217 is added for checking if the renormalization is performed (if the code bit is read) during the decoding process of the stripes between the step S214 for detecting the finished stripe and the step 216 for calling the HALVINGD process halving the effective region. The region halving is implemented if the checking result at S217 is "Yes".

If the specification of the encoding register C30A is made the same with the one of the first embodiment, it is possible to synchronize inputting and outputting the byte to/from the encoder/decoder. Accordingly, in the third embodiment, it is possible to implement the region halving based on the code byte input/output during processing the line (it can be checked by introducing the detection flag or detecting the increase of the number of the code bits) instead of to implement based on the renormalization performed or not. In this case, even if the renormalization is performed for less than some bits until inputting/outputting the byte, the region halving is not implemented. Accordingly, the redundant code bit associated with the region halving can be eliminated.

Embodiment 4

The above second embodiment shows a case where an initialization and a post-processing of an encoder/a decoder are performed only once on encoding/decoding an image by dividing into stripes. In the fourth embodiment, the region halving is implemented on processing each line, and the initialization and the post-processing of the encoder/the decoder are performed on processing each stripe.

Since the post-processing (a processing flow explaining FLUSH process) of the encoder includes determination of undetermined code and flushing process of the determined code, the half region truncation is implemented each end of line, assuming each stripe consists of a plurality of lines.

In the fourth embodiment, for example, a case will be explained where the processing flow of the ENCODER process (FIG. 14) and of the DECODER process (FIG. 18) explained in the above second embodiment are altered respectively with FIGS. 22 and 23.

Figure 22:
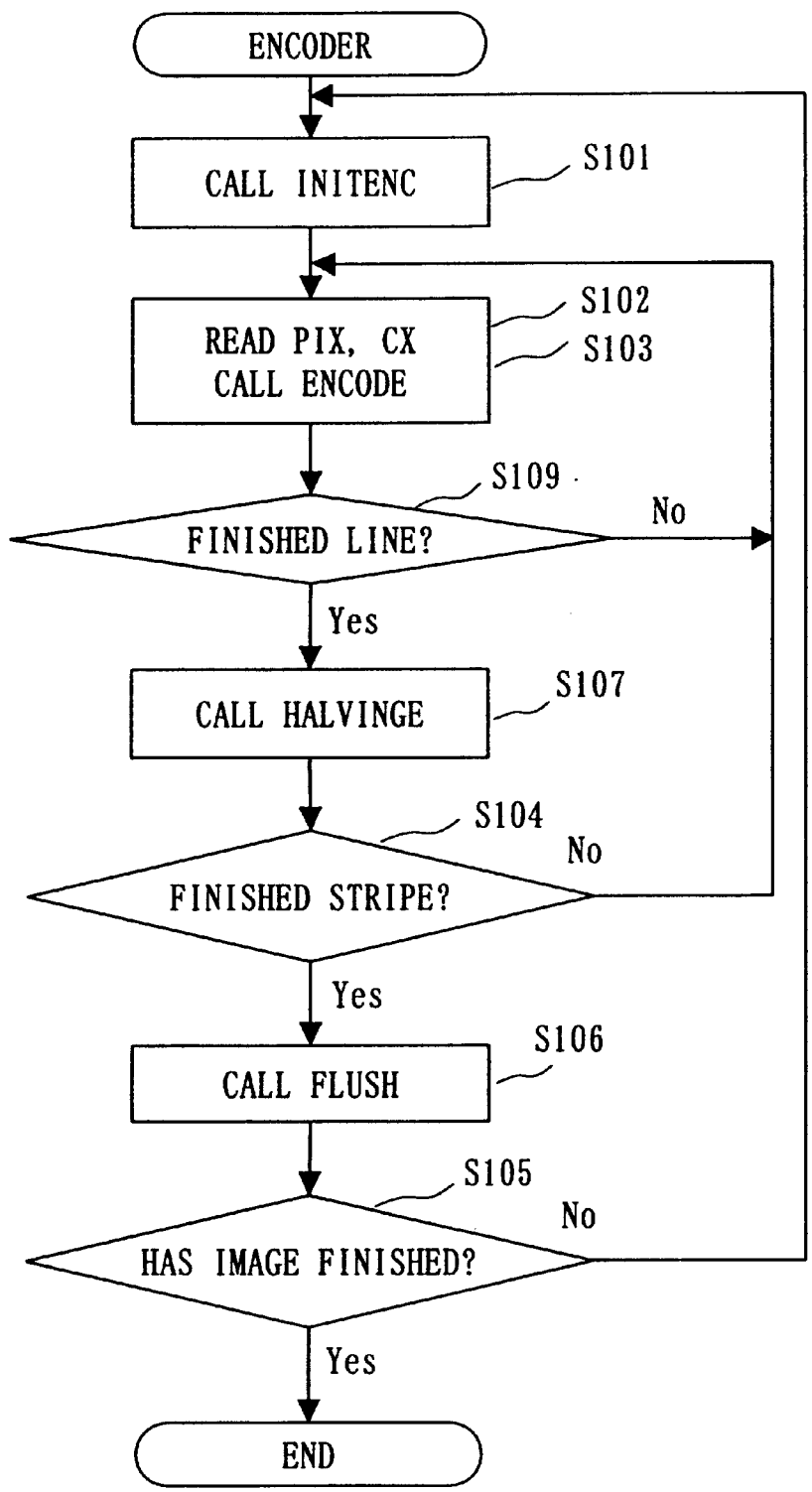
FIG. 22 shows a flowchart explaining an ENCODER process according to the fourth embodiment of the invention.

FIG. 22 is a flowchart of an ENCODER process showing a general processing flow of encoding. Compared with FIG. 14, a step S109 is added for detecting the finished line, which reforms the processes of steps S104 for detecting the finished stripe and S107 for detecting the end of the image. Then, the region halving is implemented for each line (at step S107), the initialization and the post-processing are performed for each stripe respectively at steps S101 and S106).

Figure 23:
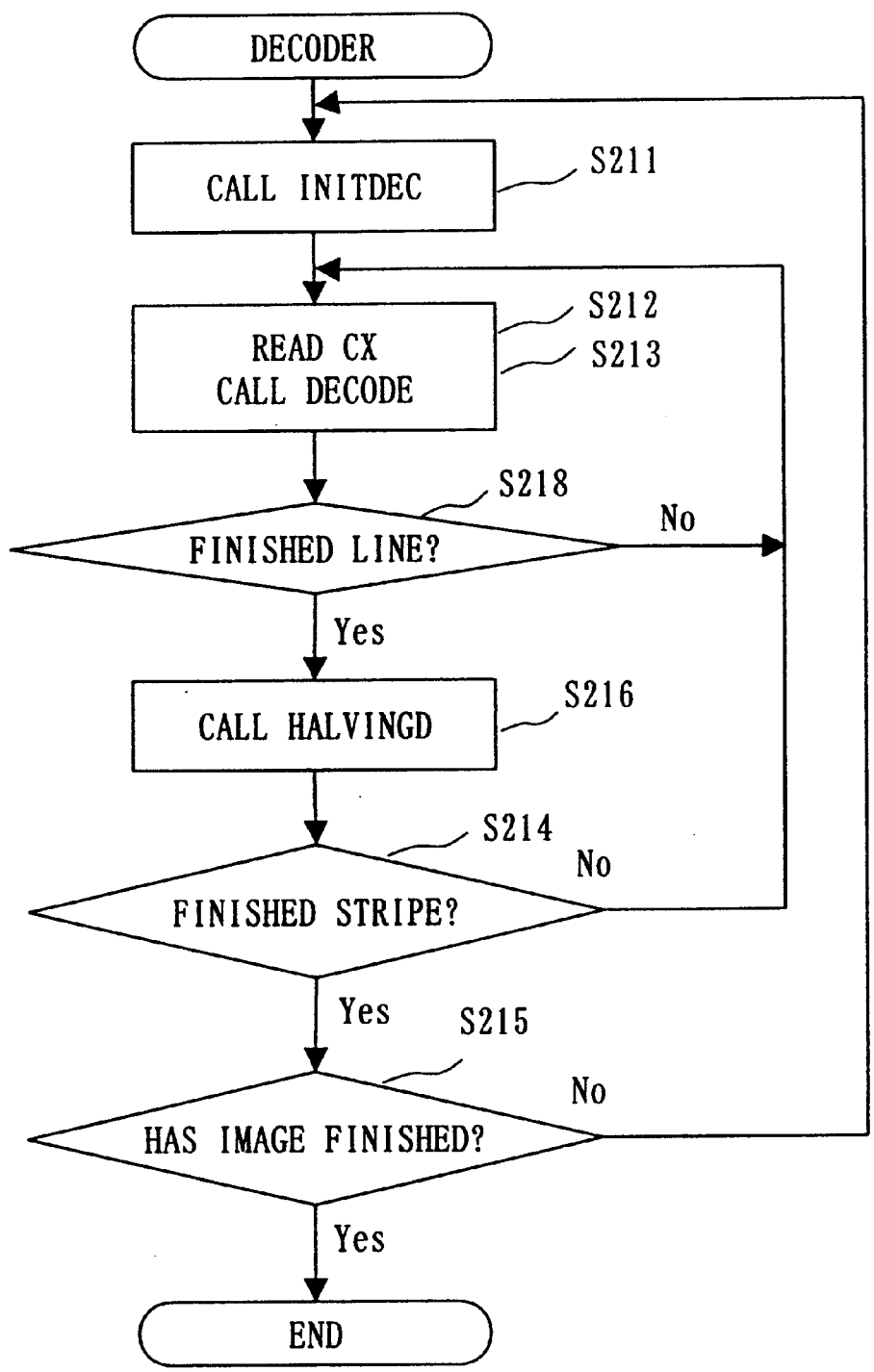
FIG. 23 shows a flowchart explaining a DECODER process according to the fourth embodiment of the invention.

FIG. 23 is a flowchart of a DECODER process showing a general processing flow of decoding.

Compared with FIG. 18, a step S218 is added for detecting the finished line, which reforms the processes of steps S214 for detecting the finished stripe and S215 for detecting the end of the image. Then, the region halving is implemented for each line (at step S216) and the initialization is performed for each stripe (at step S211).

In this way, by implementing the region halving for each line, the determined delay of the code becomes 8 lines at maximum as well as the above second embodiment. In addition, the code is completed for each stripe by implementing the initialization and the post-processing for each stripe.

Embodiment 5

According to the third embodiment, the initialization and the post-processing of the encoder/decoder is implemented only once on dividing the image into stripes for encoding/decoding the image. In the fifth embodiment, the region halving is implemented for each line, and the initialization and the post-processing of the encoder/decoder is implemented for each stripe.

Figure 24:
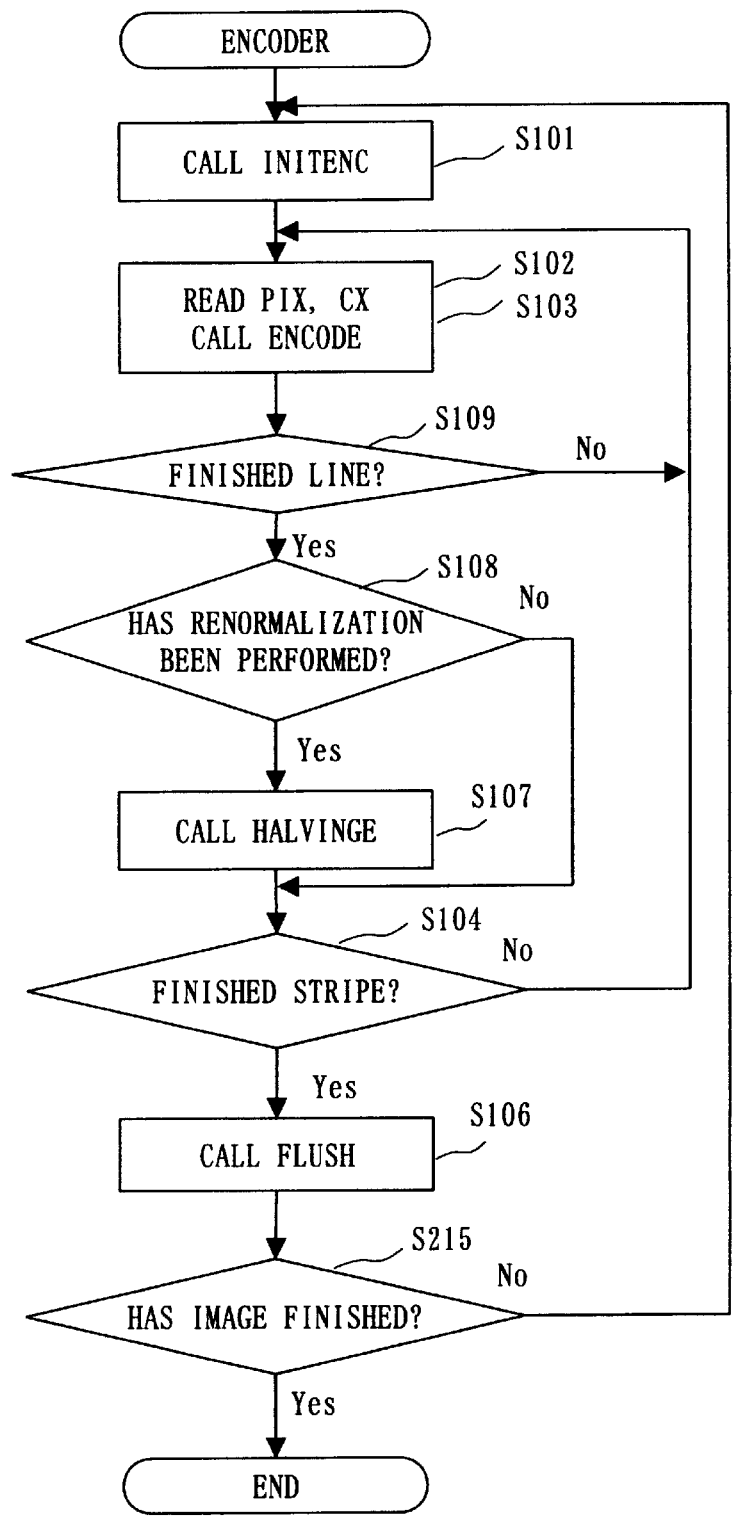
FIG. 24 shows a flowchart explaining an ENCODER process according to the fifth embodiment of the invention.
Figure 25:
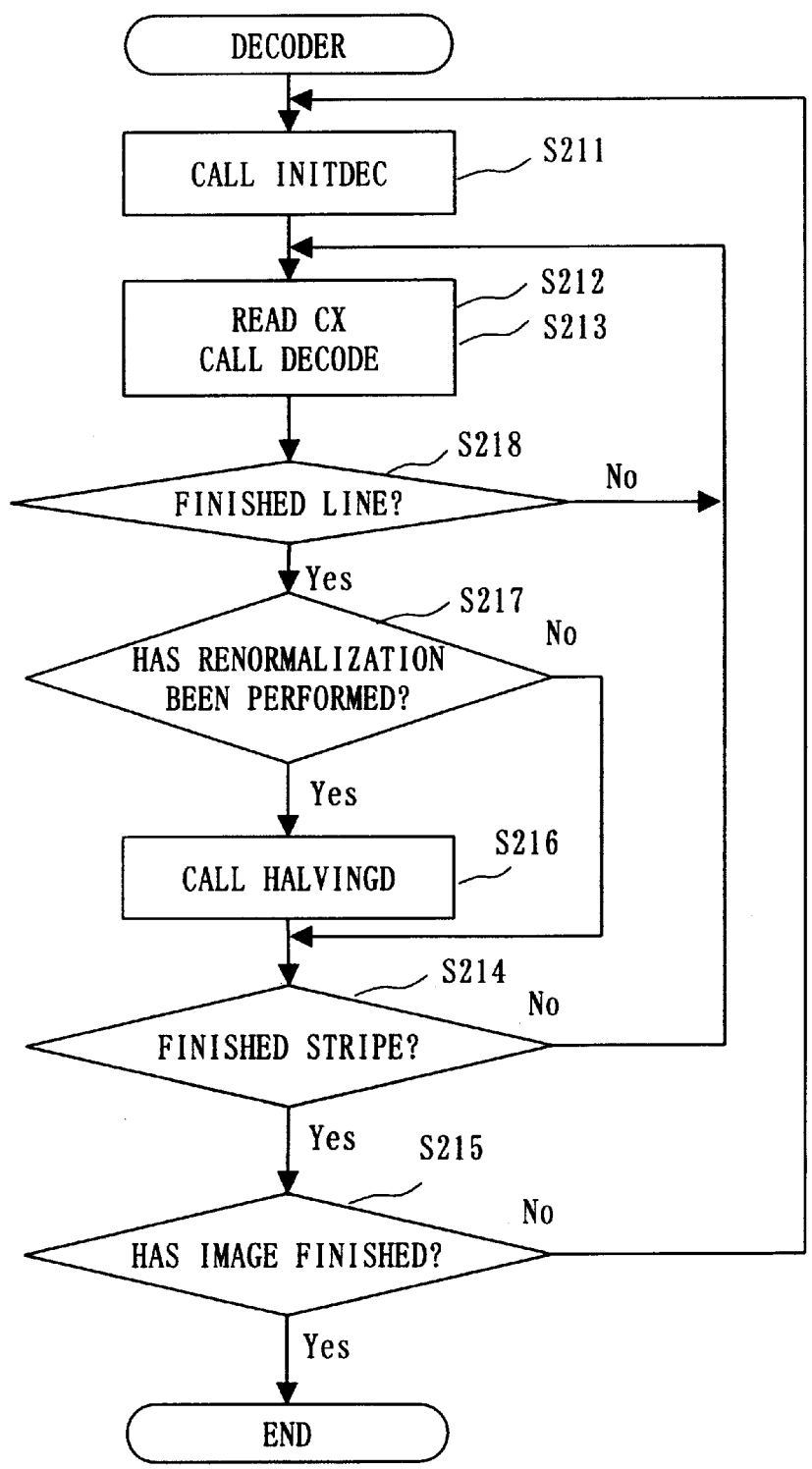
FIG. 25 shows a flowchart explaining a DECODER process according to the fifth embodiment of the invention.

In the fifth embodiment, for example, the ENCODER process shown in FIG. 20 and the DECODER process shown in FIG. 21 are respectively altered by the processing flows shown in FIGS. 24 and 25.

FIG. 24 is a flowchart of an ENCODER process showing a general processing flow of encoding. Compared with FIG. 20, a step S109 is added for detecting the finished line, which reforms the processes of steps S104 for detecting the finished stripe and S105 for detecting the end of the image. Then, the region halving is implemented for each line (at step S107), the initialization and the post-processing are performed for each stripe (respectively at steps S101 and S106).

FIG. 25 is a flowchart of a DECODER process showing a general processing flow of decoding.

Compared with FIG. 21, a step S218 is added for detecting the finished line, which reforms the processes of steps S214 for detecting the finished stripe and S215 for detecting the end of the image. Then, the region halving is implemented for each line (at step S216) and the initialization is performed for each stripe (at step S211).

In this way, by implementing the region halving for each line, as well as the above third embodiment, the determined delay of the code becomes longer than the fourth embodiment, however, a redundant bit is not generated in the code while the counter 52 suppresses the overflow. In addition, the code is completed for each stripe by implementing the initialization and the post-processing as well as the fourth embodiment.

The above second through fifth embodiments, the region halving is synchronized by a unit of stripe, line, and so on in the encoder and the decoder. The synchronization can be performed by another unit, for example, such as block or sub-block. Further, the data to be processed is not always an image.

Embodiment 6

As the sixth embodiment of the invention, for example, on outputting the code by byte unit, another method will be explained, in which a series of identical byte values is converted into another byte group indicating a specific byte value and a byte length for reducing the code length and the outputting time. Hereinafter, the converting byte group is referred to as "run-length marker" and can specify the code value by extending to an arbitrary length using a predetermined indicating method.

Figure 26:
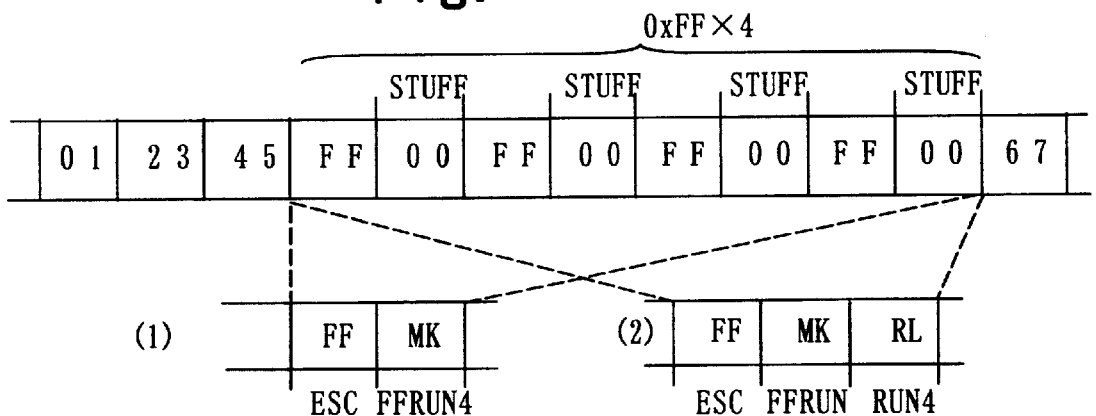
FIGS. 26A and 26B explain a run-length marker according to the sixth embodiment of the invention.
Figure 26:
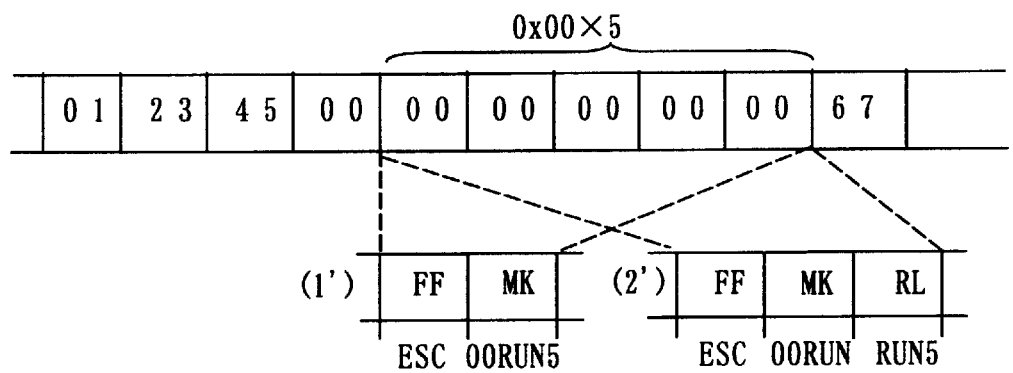

In FIG. 26A, for example, a series of consecutive occurrences of four bytes 0xFF is converted into an escape code ESC appended by a byte MK showing that four 0xFFs sequentially follow as shown in (1). Therefore, the code consisting of 8 bytes can be converted into 2 bytes including the MK byte and STUFF byte inserted for securing the ESC code. In (2), the byte MK only shows being converted from the byte 0xFF and the code length is shown by the byte RL. In this case, the code of 8 bytes can be converted into 3 bytes. As shown in FIG. 26B, a series of consecutive occurrences of 0x00 can be similarly converted into the byte MK showing that four 0x00s sequentially follow and if required, the byte RL. Here, it is assumed that the value identifying the byte value and the code length of the converting byte is assigned to the byte MK.

Figure 27:
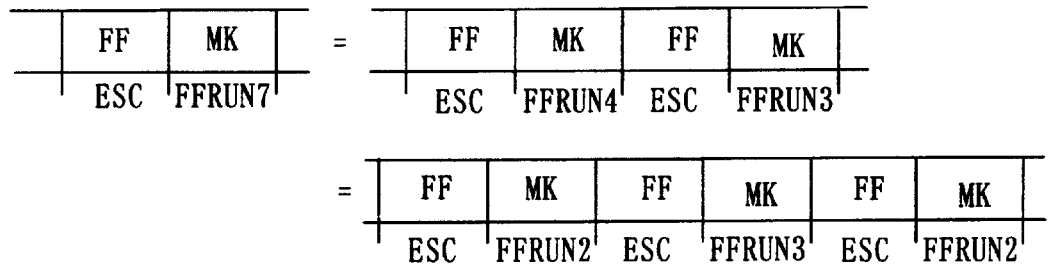
FIGS. 27A and 27B explain a divided output of the run-length marker according to the sixth embodiment of the invention.
Figure 27:
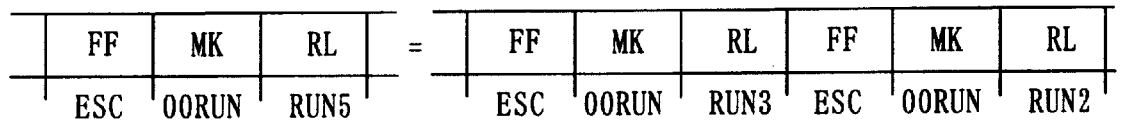

As shown in FIGS. 27A and 27B the run-length marker converted from seven occurrences of bytes 0xFF is, for example, equal to two run-length markers showing conversions of four bytes and three bytes, or equal to three run-length markers showing conversions of two occurrences, three occurrences and two occurrences. Further, other combination of the run-length markers can be defined to be equal when the combination includes identical run-lengths.

Figure 28:
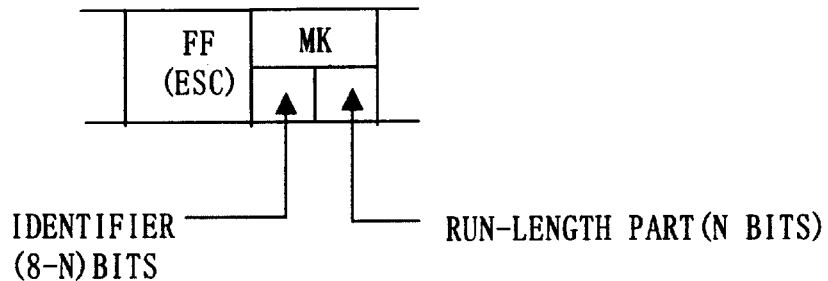
FIG. 28 shows a configuration of an example of the run-length marker according to the sixth embodiment of the invention.

When the run-length marker is configured, for example, by the ESC ode (0xFF) and the appending byte MK as shown in FIG. 28, the byte MK consists of an identifier having (8−N) bits for identifying the converting byte and the run-length part having N bits. In this case, (8−N) power of two kinds of the converting byte can be specified and the run-length of the converting byte can be indicated up to N power of two.

However, in the International Standard Recommendation T.82, another kind of marker segment is defined, therefore, the identifier cannot use all values of byte capable to be identified. Further, other International Standard Recommondation may define another kind of marker segment. Accordingly, on using the run-length marker, the run-length marker used in this embodiment should not be the same as the one of such marker segment included in the standard.

Figure 29:
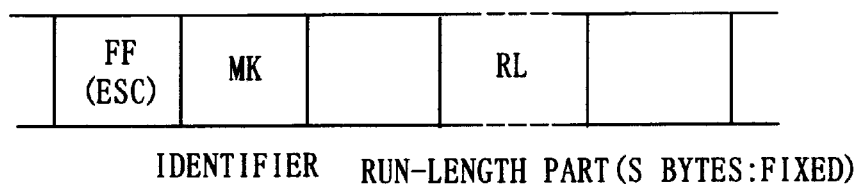
FIG. 29 shows a configuration of another example of the run-length marker according to the sixth embodiment of the invention.

For another example, when the run-length marker consists of the ESC code (0xFF) and the appending byte MK and the run-length RL of a fixed value of S bytes as shown in FIG. 29, 8 bits of the byte MK become the identifier of the converting byte. In this case, 255 kinds (except MK=STUFF) of converting bytes can be specified and the run-length of the converting byte can be identified up to (8×S) power of two.

Figure 30:
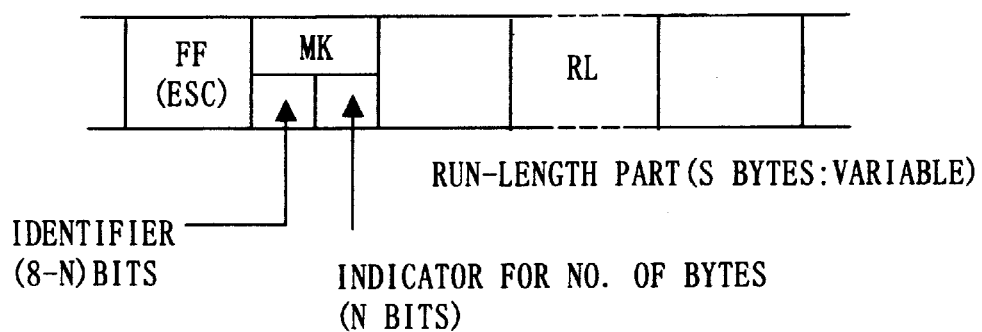
FIG. 30 shows a configuration of another example of the run-length marker according to the sixth embodiment of the invention.

Further, when the run-length marker includes the ESC code (0xFF) followed by the byte MK and the run-length part RL of S bytes as shown in FIG. 30, the byte MK consists of an identifier having (8−N) bits for the converting byte and a run-length indicator having N bits. In this case, (8−N) power of two kinds of converting byte can be specified and the byte length of the run-length part can be indicated up to N power of two bytes. And, the run length of the converting byte can be indicated up to (8×S) power of two.

FIGS. 28 through 30 show examples of the run-length marker. When the converting byte cannot be indicated by the byte MK, the initiation of the run-length marker is detected by the ESC and the byte MK, the run-length part is set to have a fixed length or length indicated by the byte MK, and the converting byte can be directly specified by placing the converting byte before or after the run-length part. By this way, the converting byte can be used regardless of its value by detecting the run-length marker with the byte MK among marker segments including another kind of segments.

In another way, when a plurality of bytes are repeated, for example, the repeated pattern of the byte length of the converting byte can be indicated as well as the run length (the number of repeating) of the pattern.

Figure 31:
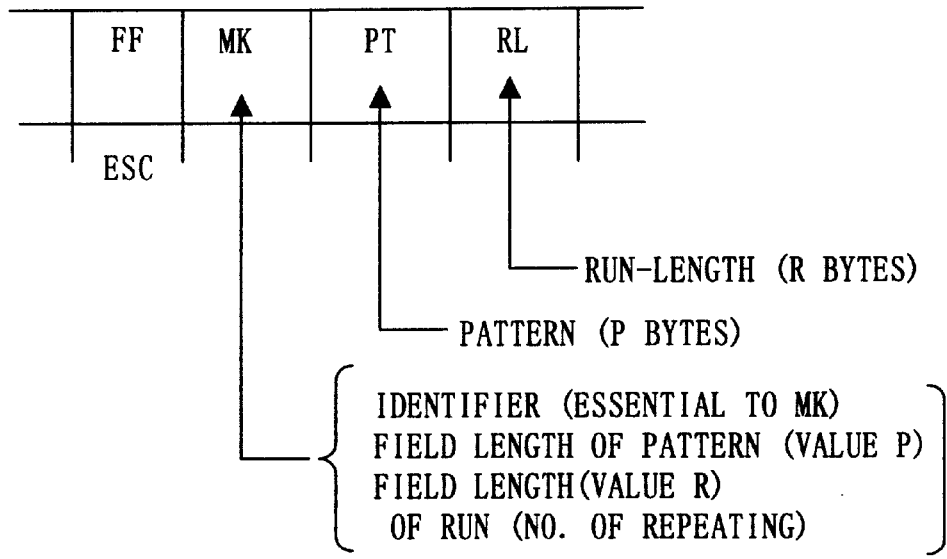
FIGS. 31A and 31B explain a method for directly indicating the pattern, in which byte length of the pattern and run-length of the pattern is indicated in byte MK.
Figure 31:
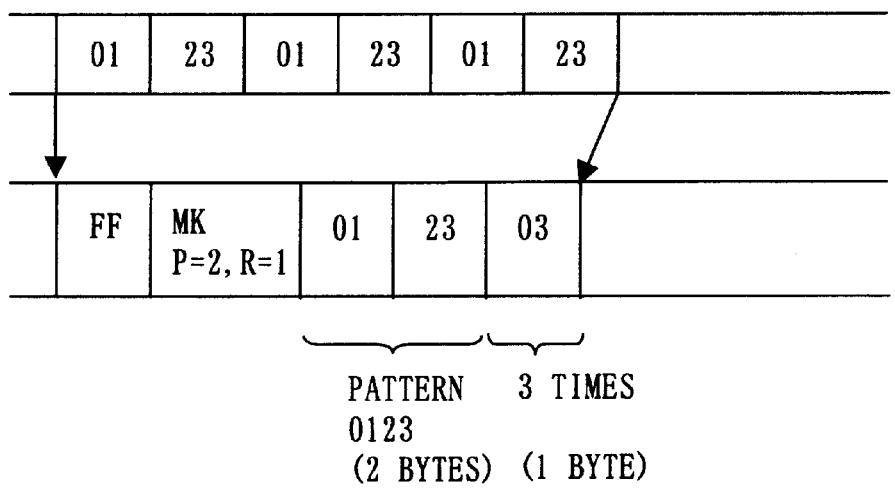

As shown in FIG. 31A, an example of the run-length marker comprises the ESC code (0xFF), the marker MK including the identifier, the converting pattern part PT consisting of a plurality of bytes, and the run-length part RL. Here, when the marker MK indicates the field length (value P) of the converting pattern part PT and the field length (value R) of the run-length part RL, the converting pattern part PT having P bytes is repeated RL times represented by R bytes.

A concrete example of the above is shown in FIG. 31B, in which the pattern having 2 bytes of 0x01, 0x23 repeating three times is converted into the run-length marker, with the field length P of the converting pattern part is 2 and the field length R of the run-length part is 1.

In the marker MK, the above two filed lengths except the run-length marker identifier can be independent from the byte including the identifier. Further, the locations of the field length part of the converting pattern part PT and the filed length part of the run-length part RL, the converting pattern part PT and the run-length part RL are not limited by the above example, but can be set arbitrarily if the recognition matches between the encoder and the decoder.

The run length of the converting byte indicated by the run-length marker is never equal to 0. Therefore, it should be previously determined whether 0 represents the maximum value or the actual value (run length−1) is always filled in the run-length part.

Figure 32:
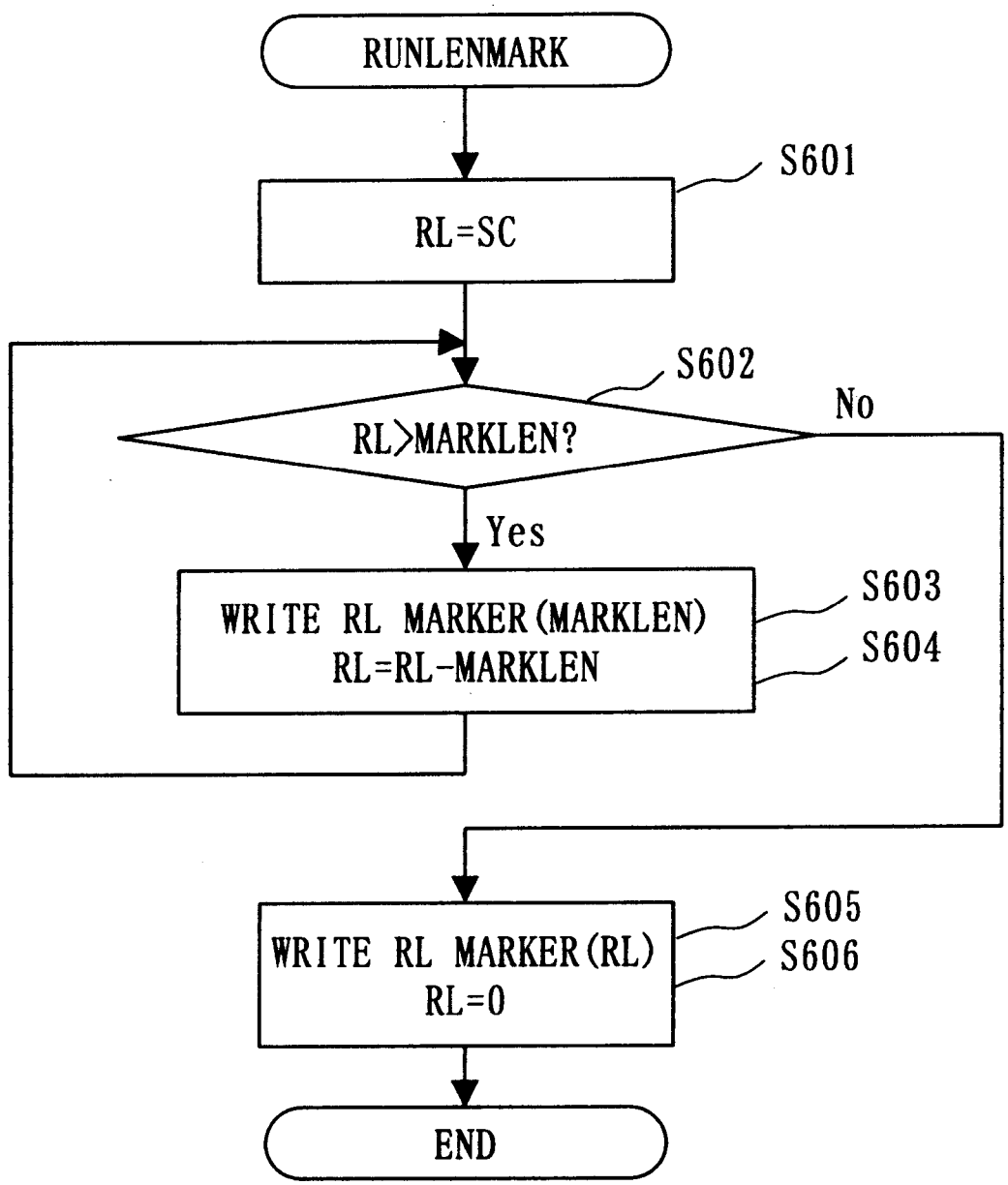
FIG. 32 is a flowchart explaining a RUNLENMARK process in relation to the sixth embodiment of the invention.

The process of consecutively outputting byte of 0xFF or 0x00 SC times (steps S154 and S162 of the flowchart of the BYTEOUT process, steps S204 and S208 of the flowchart of the FINALWRITES, a step S524 of the flowchart of the CODELOWER, and a step of S536 of the flowchart of the CODEUPPER) is easily implemented by converting into the run-length marker as shown in the flowchart of FIG. 32 explaining a RUNLENMARK process. Here, it is assumed that it is previously determined which kind of the run-length marker is used among ones shown in FIGS. 28 through 30. The maximum value which can be indicated by the run-length part of the run-length marker is defined as a constant MARKLEN 80. For example, when N=4 in case of FIG. 28, the constant MARKLEN 80 is 16.

In FIG. 32, RL 81 shows a counter variable for converting the byte value of SC 52. At step S601, the value of the variable SC 52 is set in the variable RL 81. It is checked whether the value of the variable RL 81 is larger than the constant MARKLEN 80 at step S602. If the value of the variable RL 81 is larger, the run-length (RL) marker indicating the converting byte for the length MARKLEN 80 at step S603, and the constant MARKLEN 80 is subtracted from the variable RL 81 at step S604. If the variable RL 81 is detected not to be larger than the constant MARKLEN 80 at step S602, the run-length (RL) marker indicating the converting byte for the variable RL 81 of the remaining length is written at S605, and the value of the variable RL 81 is set to 0 at step S606.

According to the flowchart explaining the above procedure, on dividing the run-length marker for consecutively outputting, the divided run-length marker is output from the divided marker having the maximum length and the divided marker with less than the maximum value is output at last. As well as the case shown in FIG. 27, this outputting order is not limited to this. The converting byte is not required to be always 0x00 or 0xFF. An arbitrary consecutive code bytes can be converted by observing output of the code.

When the number of bits of the run-length part of the run-length marker is more than the number of bits of the SC counter 52, the run length can be indicated by only one run-length marker.

The converting byte is not limited to a byte unit. It can be altered by a multi-byte unit such as a word or double-word. One byte can be used if the run-length marker is properly selected. Further, a pattern consisting of a plurality of bytes can be converted.

Embodiment 7

Figure 33:
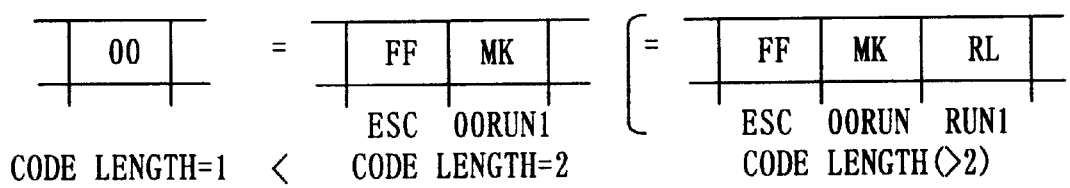
FIGS. 33A and 33B explain comparison of code length of the run-length marker in relation to the seventh embodiment of the invention.
Figure 33:
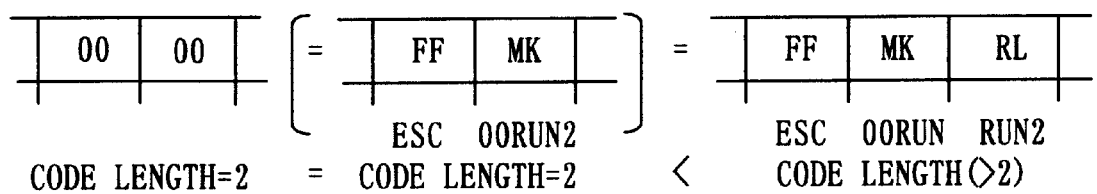

According to the sixth embodiment, any byte having the value of the variable SC 52 as a run length can be converted into the run-length marker. In this seventh embodiment, as shown in FIGS. 33A and 33B, a part of run-length length of the converting byte is not converted into the run-length marker, and the converting byte is output as it is with its original code length. Here, the number of bytes consisting the run-length marker is set to a constant MARKLENMIN 82. For example, in FIG. 28, the MARKLENMIN 82 is 2.

Figure 34:
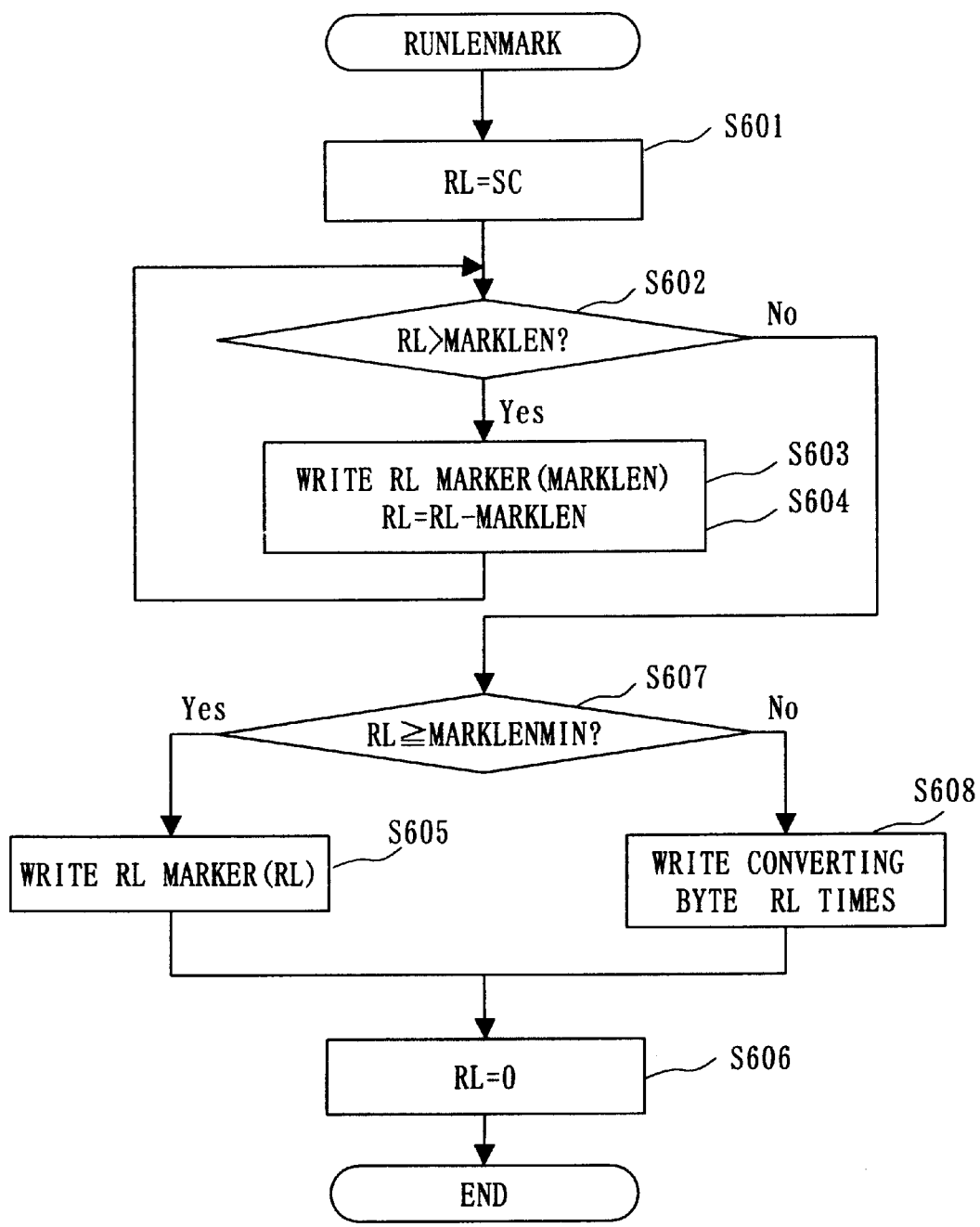
FIG. 34 is a flowchart explaining a RUNLENMARK process in relation to the seventh embodiment of the invention.

FIG. 34 is a flowchart explaining a RUNLENMARK process for converting the byte into the run-length marker.

In FIG. 34, at steps S601 through S604 and S606, the same operations are implemented as corresponding steps in FIG. 32. At step S607, it is checked if the value of the variable RL 81 is larger than the constant MARKLENMIN 82 or not. When the value of the variable RL 81 is equal to or more than the constant 82, the run-length marker indicating the converting byte having the length of the value of the variable RL 81 is written at step S605. When the value of the variable RL 81 is less than the constant 82, the converting byte is written the number of times indicated by the value of the variable RL 81 at step S608.

In this way, when the run length of the converting byte is less than the number of consisting bytes of the run-length marker, the converting byte is not converted into the run-length marker, but is output with its original code length, which reduces the total code length. If the total code lengths of both case are identical between outputting the code including the run-length marker converted from some part of the code and outputting the code without using the run-length marker, it can be arbitrarily chosen any of two cases.

However, when the converting byte is 0xFF, the STUFF byte is inserted in case of outputting the code without using the run-length marker, which causes the code length to increase to twice. It should be considered which case makes the code length shorter.

Embodiment 8

Figure 35:
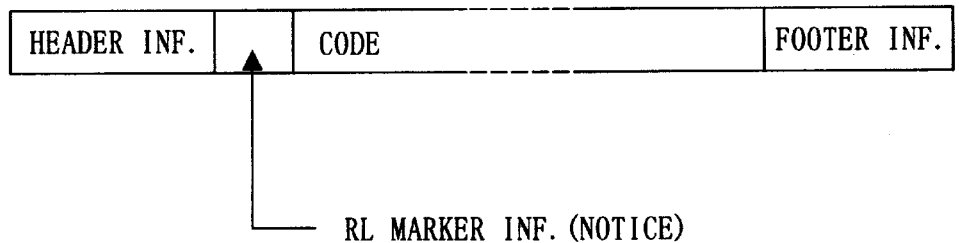
FIG. 35 explains informing of the run-length marker applied in relation to the eighth embodiment of the invention.

In the above sixth or seventh embodiment, when the run-length marker is used, the information notifying of the use of the run-length marker can be included in the outputting code as shown in FIG. 35.

If the run-length marker is always used, it is not necessary to inform of using the run-length marker. Otherwise, previously informing of the use of the run-length marker and additional information from the encoder to the decoder helps to control the whole operation mode. The additional information means, for example, a part of or all of types of the run-length marker such as shown in FIGS. 28 through 30, kinds of the converting byte and the limitation of the length of the run-length part.

In another way, the encoder confirms the processing ability installed in the decoder prior to encoding (negotiation) and the encoder notifies the decoder of the information of the mode selected based on the result of the negotiation. As for the processing ability of the decoder, such as the limitation of the number of digits of the counter included in the run-length part for inversely converting the run-length marker should be considered.

Further, in this case, the decoder can recognize the code data without informing of the use of the run-length marker as a code generated by the conventional encoder. In another way, when the decoder is the conventional decoder, the encoder does not need to insert the information of using the run-length marker into the code, nor need to use the run-length marker.

Embodiment 9

In order to utilize the run-length marker described in the above sixth or the seventh embodiment in the conventional encoder or decoder, an adapter is inserted between the conventional encoder and the line (channel) or the line (channel) and the conventional decoder, which enables the conventional encoder and decoder to communicate mutually using the run-length marker.

Figure 36:
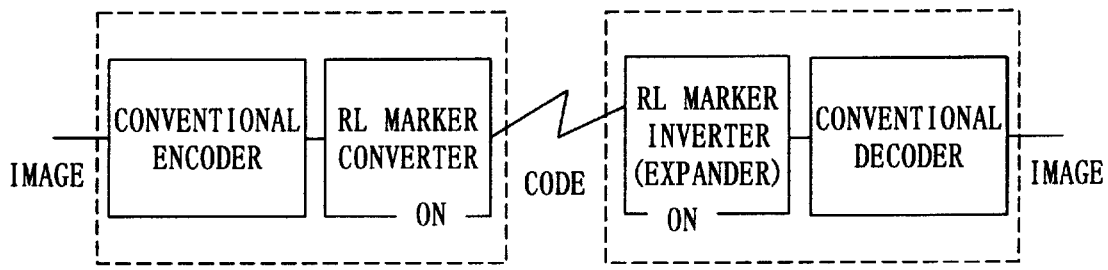
FIG. 36 is a block diagram showing an example of configuration performing mutual communication between the encoder and the decoder using the run-length marker in relation to the ninth embodiment of the invention.

First, as shown in FIG. 36, the adapter of the encoder side (run-length marker converter) checks the code from the data to detect a case the same byte values consecutively occur. When such a case is detected, the adapter converts the byte values into the run-length marker according to the processing flow shown in FIG. 32 or FIG. 34, supposing the run length of the same byte values consecutively output is SC. Further, the adapter of the decoder side (run-length marker inverse converter) checks the code from the data to detect the run-length marker. When the run-length marker is detected, the decoder outputs the converting byte which has the run length indicated by the run-length marker.

Figure 37:
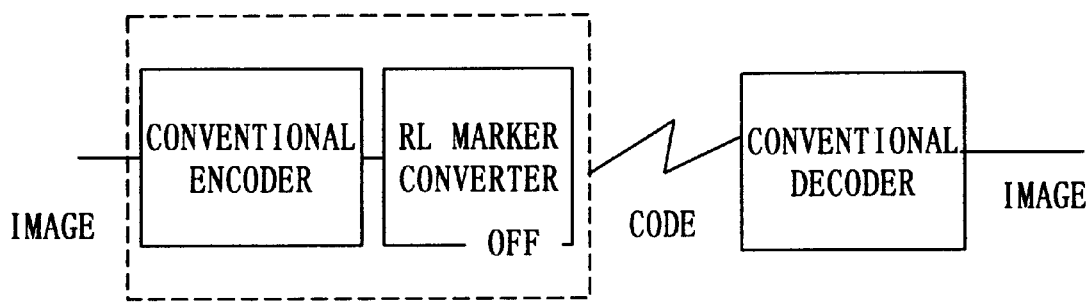
FIG. 37 is a block diagram showing an example of configuration performing mutual communication between the encoder and the decoder using the run-length marker in relation to the ninth embodiment of the invention.
Figure 38:
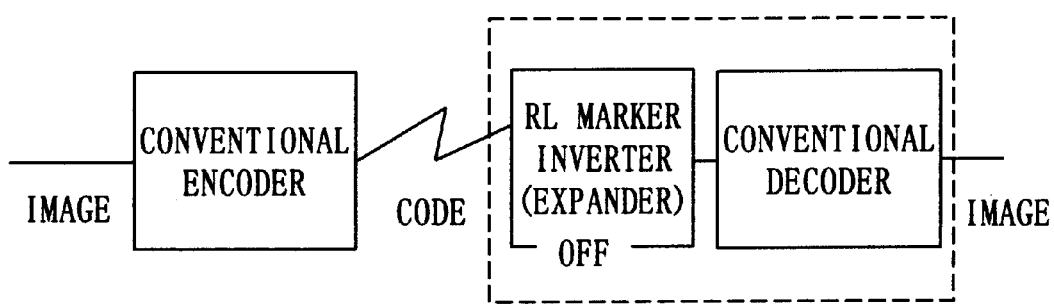
FIG. 38 is a block diagram showing an example of configuration performing mutual communication between the encoder and the decoder using the run-length marker in relation to the ninth embodiment of the invention.

Further, as shown in FIG. 37, when the decoder does not have the run-length marker inverse converter, the encoder transmits the code without substantially using the run-length marker converter. On the contrary, when the encoder does not have the run-length marker converter, the decoder receives the code without substantially using the run-length inverse converter. The embodiment of the present invention can keep compatibility with the conventional apparatus which does not process the run-length marker.

In the above case, the adapter connected to the conventional encoder/decoder can be dependent from the encoder/decoder or can be installed in the encoder/decoder as a unit.

As has been described, the encoding process and the decoding process according to the present invention can be applied to the hardware of a facsimile machine, a scanner, a printer, a computer, a database, an image display, an image accumulator, a data accumulator, an image transmitter, a data transmitter and so on which accumulate data inside of the computer or the device or implement mutual communication with the outside through wireless/wired communication using the public line or the exclusive line or through storage medium. Further, the present invention enables the general-use computer to implement the function of the above apparatuses using the software and a part of the hardware. In this case, the apparatuses can be installed in the general-use computer appearing as a unit, or can be independent as a plurality of apparatuses. Further, inside of the exclusive hardware, the utilization of the present invention is not limited by the type of installation such as an LSI (semiconductor chip) or a middleware mounting these processing ability. As for communication, the application of the present invention is not limited by the type of communication such as an electrical or optical wireless/wired communication, the communication through public line or exclusive line, communication through LAN, WAN, Internet, Intranet. As for the type of recording to the storage medium, the application is not limited by the type of recording such as magnetic recording, optical recording, digital recording, analog recording. Further, the recording medium can be fixed to or separated from the apparatus. Yet further, recording by ink, etc. can be used regardless of its notice ability.

The present invention has been explained using block diagrams and flowcharts when applied to encoding an image, however, the present invention can be utilized for encoding general type of data.

Having thus described several particular embodiments of the present invention, various alterations, modifications, and improvements will readily occur to those skilled in the art. Such alterations, modifications, and improvements are intended to be part of this disclosure, and are intended to be within the spirit and scope of the present invention. Accordingly, the foregoing description is by way of example only, and is not intended to be limiting. The present invention is limited only as defined in the following claims and the equivalents thereto.

What is claimed is:

1. An encoding apparatus having
    a data memory accumulating information source data and outputting encoding data and its auxiliary parameter (context),
    a learning memory accumulating and outputting learning data relating the encoding data specified by the auxiliary parameter,
    a probability estimation table outputting an encoding parameter specified by the learning data, and
    an encoder operating an arithmetic encoding based on the encoding data and the encoding parameter and outputting a code,
    the encoding apparatus comprising:
        a synchronization detector measuring and informing of a predetermined unit of encoding process as a predetermined interval; and
        a carry boundary detector detecting a carry boundary value within an effective region at the predetermined interval and indicating to truncate a part of the effective region based on a result of detection;
        wherein the encoder truncates one of equally divided upper and lower partial regions of the effective region indicated by the carry boundary detector and updates the effective region.

2. The encoding apparatus of claim 1, wherein the encoder truncates one of equally divided upper and lower partial regions of the effective region indicated by the carry boundary detector and updates the effective region when the carry boundary detector detects the carry boundary.

3. The encoding apparatus of claim 1, wherein the carry boundary detector indicates to truncate the partial region which includes the carry boundary detected.

4. The encoding apparatus of claim 1, wherein the predetermined interval is when a predetermined unit of encoding data is encoded.

5. The encoding apparatus of claim 4, wherein the predetermined interval is set based on a maximum value of length of the code which is waiting for outputting until a code value is determined.

6. The encoding apparatus of claim 4, wherein the encoder sets a maximum value of length of the code which is waiting for outputting until a code value is determined based on the predetermined interval.

7. The encoding apparatus of claim 1, wherein the predetermined interval is when the predetermined unit of the code is output.

8. The encoding apparatus of claim 1, wherein the predetermined interval is when the predetermined unit of the code is output and an output value of the code becomes a predetermined value.

9. The encoding apparatus of claim 1, wherein the carry boundary detector indicates one of the partial regions of the equally divided upper and lower regions of the effective region when the carry boundary is not detected within the effective region.

10. The encoding apparatus of claim 1, wherein the encoder includes a run-length marker converter converting the code whose code value is determined into run-length marker capable to specify a code value and code length when the code includes identical code values to be sequentially output.

11. The encoding apparatus of claim 10, wherein the run-length marker converter does not convert the code when a length of the code output without conversion is shorter than a length of the code including the run-length marker converted from the identical code value.

12. The encoding apparatus of claim 10, wherein the encoder sets a maximum value of the sequential length extracted from the run-length marker in the run-length marker converter based on a result of a run-length marker inverse converter on decoding.

13. The encoding apparatus of claim 1, wherein the predetermined unit of encoding process is when a predetermined unit of encoding data is encoded.

14. The encoding apparatus of claim 4, wherein the predetermined unit of encoding process is set based on a maximum value of length of the code which is waiting for outputting until a code value is determined.

15. The encoding apparatus of claim 4, wherein the encoder sets a maximum value of length of the code which is waiting for outputting until a code value is determined based on the predetermined unit of encoding process.

16. The encoding apparatus of claim 1, wherein the predetermined unit of encoding process is when the predetermined unit of the code is output.

17. The encoding apparatus of claim 1, wherein the predetermined unit of encoding process is when the predetermined unit of the code is output and an output value of the code becomes a predetermined value.

18. A decoding apparatus having
    a data memory outputting an auxiliary parameter (context) for decoding data and accumulating the decoding data decoded to output as an information source data,
    a learning memory accumulating and outputting learning data relating the decoding data specified by the auxiliary parameter,
    a probability estimation table outputting a decoding parameter specified by the learning data, and
    a decoder operating an arithmetic decoding based on the decoding parameter and a code and outputting the decoding data,
    the decoding apparatus comprising:
        a synchronization detector measuring and informing of predetermined unit of decoding process as a predetermined interval; and
        a carry boundary detector detecting a carry boundary within an effective region at the predetermined interval and indicating to truncate a part of the effective region based on a result of detection;
        wherein the decoder updates the effective region by truncating one of equally divided upper and lower partial regions of the effective region which does not include a code value of the carry boundary detected.

19. The decoding apparatus of claim 18, wherein the decoder truncates one of equally divided upper and lower partial regions of the effective region which does not include the code value and updates the effective region when the carry boundary detector detects the carry boundary.

20. The decoding apparatus of claim 18, wherein the carry boundary detector indicates to truncate a partial region which includes the carry boundary detected.

21. The decoding apparatus of claim 18, wherein the predetermined interval is when a predetermined unit of decoding data is decoded.

22. The decoding apparatus of claim 18, wherein the predetermined interval is when a predetermined unit of code is input.

23. The decoding apparatus of claim 18, wherein the predetermined interval is measured when a predetermined unit of code is input, and an input value of the code reproduced simultaneously with decoding becomes a predetermined value.

24. The decoding apparatus of claim 18, wherein the decoder includes a run-length marker inverse converter inversely converting a run-length marker into a code which has a same value and same length with the code converted when the run-length marker is detected.

25. The decoding apparatus of claim 18, wherein the predetermined unit of decoding process is when a predetermined unit of decoding data is decoded.

26. The decoding apparatus of claim 18, wherein the predetermined unit of decoding process is when a predetermined unit of code is input.

27. The decoding apparatus of claim 18, wherein the predetermined unit of decoding process is measured when a predetermined unit of code is input, and an output value of the code reproduced simultaneously with decoding becomes a predetermined value.

28. An encoding/decoding apparatus comprising:
   an encoding apparatus having
      a data memory accumulating information source data and outputting encoding data and its auxiliary parameter (context),
      a learning memory accumulating and outputting learning data relating the encoding data specified by the auxiliary parameter,
      a probability estimation table outputting an encoding parameter specified by the learning data,
      an encoder operating an arithmetic encoding based on the encoding data and the encoding parameter and outputting a code,
      a synchronization detector measuring and informing of a predetermined unit of encoding process as a predetermined interval, and
      a carry boundary detector detecting a carry boundary within an effective region at the predetermined interval and indicating to truncate a part of the effective region based on a result of detection,
      wherein the encoder truncates one of equally divided upper and lower partial regions of the effective region indicated by the carry boundary detector and updates the effective region; and
   a decoding apparatus having
      a data memory outputting an auxiliary parameter (context) for decoding data and accumulating the decoding data decoded to output as an information source data,
      a learning memory accumulating and outputting learning data relating the decoding data specified by the auxiliary parameter,
      a probability estimation table outputting a decoding parameter specified by the learning data,
      a decoder operating an arithmetic decoding based on the decoding parameter and a code and outputting the decoding data,
      a synchronization detector measuring and informing of a predetermined unit of decoding process as a predetermined interval,
      a carry boundary detector detecting a carry boundary within an effective region at the predetermined interval and indicating to truncate a part of the effective region based on a result of detection, and
      wherein the decoder updates the effective region by truncating one of equally divided upper and lower regions of the effective region without including a code value of the carry boundary detected.

29. The encoding/decoding apparatus of claim 20, wherein the encoder truncates one of equally divided upper and lower partial regions of the effective region indicated by the carry boundary detector and updates the effective region when the carry boundary detector detects the carry boundary, and
   wherein the decoder truncates one of equally divided upper and lower partial regions of the effective region which does not include the code value and updates the effective region when the carry boundary detector detects the carry boundary.

30. An encoding method comprising:
   (a) accumulating information source data and outputting encoding data and its auxiliary parameter (context);
   (b) accumulating and outputting learning data relating the encoding data specified by the auxiliary parameter;
   (c) outputting an encoding parameter specified by the learning data;
   (d) operating an arithmetic encoding based on the encoding data and the encoding parameter and outputting a code;
   (e) measuring and informing of a predetermined unit of encoding process as a predetermined interval;
   (f) detecting a carry boundary within an effective region at the predetermined interval and indicating to truncate a part of the effective region based on a result of detection; and
   (g) truncating one of equally divided upper and lower partial regions of the effective region indicated by the step of detecting and updating the effective region.

31. The encoding method of claim 30, wherein the step of truncating truncates one of equally divided upper and lower partial regions of the effective region indicated by the step of detecting and updates the effective region when the step of detecting detects the carry boundary.

32. The encoding method of claim 30; wherein the step of operating and the step of truncating include converting the code whose code value is determined into a run-length marker capable to specify the code value and code length when the code includes identical code values to be sequentially output.

33. The encoding method of claim 32, wherein the step of converting does not convert the code when a length of the code output without conversion is shorter than a length of the code including the run-length marker converted from the identical code value.

34. The encoding method of claim 32, wherein the step of operating sets a maximum value of the sequential length extracted from the run-length marker in the step of converting based on a result of a run-length marker inverse converter on decoding.

35. The encoding method of claim 32, wherein the step of operating sets a maximum value of the sequential length extracted from the run-length marker in the step of converting based on ability of a run-length marker inverse converter on decoding.

36. A decoding method comprising:
(a) outputting an auxiliary parameter (context) for decoding data and accumulating the decoding data decoded to output as an information source data;
(b) accumulating and outputting learning data relating the decoding data specified by the auxiliary parameter;
(c) outputting a decoding parameter specified by the learning data;
(d) operating an arithmetic decoding based on the decoding parameter and a code and outputting the decoding data;
(e) measuring and informing of a predetermined unit of decoding process as a predetermined interval;
(f) detecting a carry boundary within an effective region at the predetermined interval and indicating to truncate a part of the effective region based on a result of detection; and
(g) truncating one of equally divided upper and lower partial regions of the effective region and updating the effective region.

37. The decoding method of claim 36, wherein the step of truncating truncates one of equally divided upper and lower partial regions of the effective region indicated by the step of detecting and updates the effective region when the step of detecting detects the carry boundary.

38. The decoding method of claim 36, wherein the step of operating includes inversely converting a run-length marker into a code which has a same value and same length with the code converted when the run-length marker is detected.

39. An encoding apparatus comprising:
a data memory accumulating information source data and outputting encoding data and its auxiliary parameter (context);
a learning memory accumulating and outputting learning data relating the encoding data specified by the auxiliary parameter;
a probability estimation table outputting an encoding parameter specified by the learning data; and
an encoder operating an arithmetic encoding based on the encoding data and the encoding parameter and outputting a code, and
wherein the encoder includes a run-length marker converter converting the code whose code value is determined into run-length marker capable to specify a code value and code length when the code includes identical code values to be sequentially output.

40. The encoding apparatus of claim 39, wherein the run-length marker converter does not convert the code when a length of the code output without conversion is shorter than a length of the code including the run-length maker converted from the identical code value.

41. The encoding apparatus of claim 39, wherein the encoder sets a maximum value of the sequential length extracted from the run-length marker in the run-length marker converter based on a result of a run-length marker inverse converter on decoding.

42. A decoding apparatus comprising:
a data memory outputting an auxiliary parameter (context) for decoding data and accumulating the decoding data decoded to output as an information source data;
a learning memory accumulating and outputting learning data relating the decoding data specified by the auxiliary parameter;
a probability estimation table outputting a decoding parameter specified by the learning data; and
a decoder operating an arithmetic decoding based on the decoding parameter and a code and outputting the decoding data, and
wherein the decoder includes a run-length marker inverse converter inversely converting a run-length marker into a code which has a same value and same length with the code converted when the run-length marker is detected.

43. An encoding method comprising:
(a) accumulating information source data and outputting encoding data and its auxiliary parameter (context);
(b) accumulating and outputting learning data relating the encoding data specified by the auxiliary parameter;
(c) outputting an encoding parameter specified by the learning data;
(d) operating an arithmetic encoding based on the encoding data and the encoding parameter and outputting a code; and
(e) converting the code whose code value is determined into a run-length marker capable to specify the code value and code length when the code includes identical code values to be sequentially output.

44. The encoding method of claim 43, wherein the step of converting does not convert the code when a length of the code output without conversion is shorter than a length of the code including the run-length marker converted from the identical code value.

45. The encoding method of claim 43, wherein the step of operating sets a maximum value of the sequential length extracted from the run-length marker in the step of converting based on a result of a run-length marker inverse converter on decoding.

46. A decoding method comprising:
(a) outputting an auxiliary parameter (context) for decoding data and accumulating the decoding data decoded to output as an information source data;
(b) accumulating and outputting learning data relating the decoding data specified by the auxiliary parameter;
(c) outputting a decoding parameter specified by the learning data;
(d) operating an arithmetic decoding based on the decoding parameter and a code and outputting the decoding data; and
(e) inversely converting a run-length marker into a code which has a same value and same length with the code converted when the run-length marker is detected.

47. A decoding apparatus having
a data memory outputting an auxiliary parameter (context) for decoding data and accumulating the decoding data decoded to output as an information source data,
a learning memory accumulating and outputting learning data relating the decoding data specified by the auxiliary parameter,
a probability estimation table outputting a decoding parameter specified by the learning data, and
a decoder operating an arithmetic decoding based on the decoding parameter and a code and outputting the decoding data,
the decoding apparatus comprising:
a synchronization detector measuring and informing of a predetermined unit of decoding process as a predetermined interval; and
a carry boundary detector detecting a carry boundary within an effective region at the predetermined unit of decoding process and indicating to truncate a part of the effective region based on a result of detection;

wherein the decoder updates the effective region by truncating one of equally divided upper and lower partial regions of the effective region which does not include a code value of the carry boundary detected.

48. An encoding/decoding apparatus comprising:

an encoding apparatus having a data memory accumulating information source data and outputting encoding data and its auxiliary parameter (context), a learning memory accumulating and outputting learning data relating the encoding data specified by the auxiliary parameter, a probability estimation table outputting an encoding parameter specified by the learning data, an encoder operating an arithmetic encoding based on the encoding data and the encoding parameter and outputting a code, a synchronization detector measuring and informing of a predetermined unit of encoding process as a predetermined interval, and a carry boundary detector detecting a carry boundary within an effective region at the predetermined interval and indicating to truncate a part of the effective region based on a result of detection, wherein the encoder truncates one of equally divided upper and lower partial regions of the effective region indicated by the carry boundary detector and updates the effective region; and a decoding apparatus having a data memory outputting an auxiliary parameter (context) for decoding data and accumulating the decoding data decoded to output as an information source data, a learning memory accumulating and outputting learning data relating the decoding data specified by the auxiliary parameter, a probability estimation table outputting a decoding parameter specified by the learning data, a decoder operating an arithmetic decoding based on the decoding parameter and a code and outputting the decoding data, a synchronization detector measuring and informing of a predetermined unit of decoding process as a predetermined interval, a carry boundary detector detecting a carry boundary within an effective region at the predetermined unit of decoding process and indicating to truncate a part of the effective region based on a result of detection, and wherein the decoder updates the effective region by truncating one of equally divided upper and lower regions of the effective region without including a code value of the carry boundary detected.

49. A decoding method comprising:

(a) outputting an auxiliary parameter (context) for decoding data and accumulating the decoding data decoded to output as an information source data;

(b) accumulating and outputting learning data relating the decoding data specified by the auxiliary parameter;

(c) outputting a decoding parameter specified by the learning data;

(d) operating an arithmetic decoding based on the decoding parameter and a code and outputting the decoding data;

(e) measuring and informing of a predetermined unit of decoding process as a predetermined interval;

(f) detecting a carry boundary within an effective region at the predetermined unit of decoding process and indicating to truncate a part of the effective region based on a result of detection; and (g) truncating one of equally divided upper and lower partial regions of the effective region and updating the effective region.

50. The encoding apparatus of claim 10, wherein the encoder sets a maximum value of the sequential length extracted from the run-length marker in the run-length marker converter based on ability of a run-length marker inverse converter on decoding.

* * * * *